US012317623B2

(12) United States Patent
Yoshimoto et al.

(10) Patent No.: US 12,317,623 B2
(45) Date of Patent: May 27, 2025

(54) IMAGING APPARATUS, MANUFACTURING METHOD THEREOF, AND ELECTRONIC EQUIPMENT

(71) Applicant: SONY SEMICONDUCTOR SOLUTIONS CORPORATION, Kanagawa (JP)

(72) Inventors: Nao Yoshimoto, Kanagawa (JP); Yuki Miyanami, Kanagawa (JP); Shigehiro Ikehara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 393 days.

(21) Appl. No.: 17/756,358

(22) PCT Filed: Dec. 1, 2020

(86) PCT No.: PCT/JP2020/044739
§ 371 (c)(1),
(2) Date: May 23, 2022

(87) PCT Pub. No.: WO2021/112098
PCT Pub. Date: Jun. 10, 2021

(65) Prior Publication Data
US 2023/0005978 A1 Jan. 5, 2023

(30) Foreign Application Priority Data
Dec. 2, 2019 (JP) ................... 2019-218336

(51) Int. Cl.
*H10F 39/00* (2025.01)
*H10F 39/18* (2025.01)

(52) U.S. Cl.
CPC ....... *H10F 39/8057* (2025.01); *H10F 39/024* (2025.01); *H10F 39/8033* (2025.01); *H10F 39/18* (2025.01)

(58) Field of Classification Search
CPC ........... H01L 27/14623; H01L 27/1461; H01L 27/14685; H01L 27/14643; H10F 39/8057; H10F 39/8033; H10F 39/024; H10F 39/18
(Continued)

(56) References Cited

U.S. PATENT DOCUMENTS 8,120,130 B2 * 2/2012 Kuriyama ......... H01L 27/14623
257/431
9,615,041 B2 4/2017 Kim
(Continued)

FOREIGN PATENT DOCUMENTS

CN 103811507 A 5/2014
CN 104247021 A 12/2014
(Continued)

OTHER PUBLICATIONS

International Search Report and Written Opinion of PCT Application No. PCT/JP2020/044739, issued on Feb. 22, 2021, 13 pages of ISRWO.

*Primary Examiner* — Tu-Tu V Ho
(74) *Attorney, Agent, or Firm* — CHIP LAW GROUP

(57) ABSTRACT

It is possible to curb noise, color mixing, and the like. An imaging apparatus includes: a semiconductor; a photoelectric conversion unit that is provided on the semiconductor substrate and generates electrical charge in accordance with the amount of received light through photoelectric conversion; an electrical charge holding unit that is disposed on a side closer to a first surface of the semiconductor substrate than the photoelectric conversion unit and holds the electrical charge transferred from the photoelectric conversion
(Continued)

unit; an electrical charge transfer unit that transfers the electrical charge from the photoelectric conversion unit to the electrical charge holding unit; a vertical electrode that transmits the electrical charge generated by the photoelectric conversion unit to the electrical charge transfer unit and is disposed in a depth direction of the semiconductor substrate, and a first light control unit that is disposed on a side closer to a second surface that is a side opposite to the first surface of the semiconductor substrate than the vertical electrode, is disposed at a position overlapping the vertical electrode in a plan view of the semiconductor substrate from a normal line direction of the first surface, and has a T-shaped section in the depth direction of the substrate. The first light control member includes a first light control portion and a second light control portion extending in mutually intersecting directions in an integrated structure.

22 Claims, 82 Drawing Sheets

(58) Field of Classification Search
USPC .......................................................... 257/435
See application file for complete search history.

(56) References Cited

U.S. PATENT DOCUMENTS

| | | |
|---|---|---|
| 2014/0131779 A1 | 5/2014 | Takeda |
| 2015/0035028 A1 | 2/2015 | Fan |
| 2015/0069471 A1 | 3/2015 | Kawamura |
| 2016/0343756 A1 | 11/2016 | Fan |
| 2017/0203954 A1 | 7/2017 | Zhang et al. |
| 2017/0244920 A1 | 8/2017 | Ohkubo |
| 2018/0033809 A1 | 2/2018 | Tayanaka et al. |
| 2018/0213174 A1 | 7/2018 | Sano |
| 2018/0324374 A1 | 11/2018 | Kamashita et al. |
| 2018/0342550 A1 | 11/2018 | Sekine |
| 2019/0088701 A1 | 3/2019 | Mizuta et al. |

FOREIGN PATENT DOCUMENTS

| | | |
|---|---|---|
| CN | 104425535 A | 3/2015 |
| CN | 104917980 A | 9/2015 |
| CN | 105473535 A | 4/2016 |
| CN | 107431075 A | 12/2017 |
| CN | 107851655 A | 3/2018 |
| CN | 108141552 A | 6/2018 |
| CN | 108701704 A | 10/2018 |
| CN | 109983581 A | 7/2019 |
| CN | 109997229 A | 7/2019 |
| CN | 110313067 A | 10/2019 |
| EP | 3196617 A1 | 7/2017 |
| EP | 3358827 A1 | 8/2018 |
| EP | 3432358 A1 | 1/2019 |
| EP | 3447801 A1 | 2/2019 |
| EP | 3552236 A1 | 10/2019 |
| EP | 3813116 A1 | 4/2021 |
| JP | 2009004651 A | 1/2009 |
| JP | 2010114274 A | 5/2010 |
| JP | 2013-098446 A | 5/2013 |
| JP | 2014-096490 A | 5/2014 |
| JP | 2015-053411 A | 3/2015 |
| JP | 2015228510 A | 12/2015 |
| JP | 2017-168566 A | 9/2017 |
| JP | WO2016136486 A1 | 12/2017 |
| JP | 2018-093126 A | 6/2018 |
| JP | 2018-148039 A | 9/2018 |
| JP | 2019068373 A | 4/2019 |
| JP | 2019-176089 A | 10/2019 |
| JP | 2020-047616 A | 3/2020 |
| JP | 2020-077650 A | 5/2020 |
| KR | 10-2018-0048779 A | 5/2018 |
| KR | 10-2019-0089843 A | 7/2019 |
| KR | 10-2019-0119050 A | 10/2019 |
| TW | 201721847 A | 6/2017 |
| WO | 2013/065569 A1 | 5/2013 |
| WO | 2016/136486 A1 | 9/2016 |
| WO | 2017/057397 A1 | 4/2017 |
| WO | 2017/159361 A1 | 9/2017 |
| WO | 2017/183477 A1 | 10/2017 |
| WO | 2018/105359 A1 | 6/2018 |
| WO | 2018/163732 A1 | 9/2018 |
| WO | 2019/188386 A1 | 10/2019 |
| WO | 2019/240207 A1 | 12/2019 |
| WO | 2020/054545 A1 | 3/2020 |
| WO | 2020/095674 A1 | 5/2020 |
| WO | 2020/195825 A1 | 10/2020 |

\* cited by examiner (a)

(b)

(c)

(d)

SHAPE OF I

SHAPE OF T PUT DOWN ON ITS SIDE (a)

(b)

(a)

(b)

EXTINCTION COEFFICIENT OF W

EXTINCTION COEFFICIENT OF $SiO_2$

REFRACTIVE INDEX OF Si

REFRACTIVE INDEX OF SiO$_2$

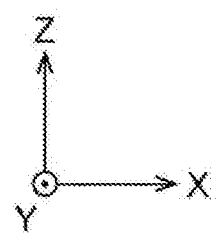
FIG. 28A
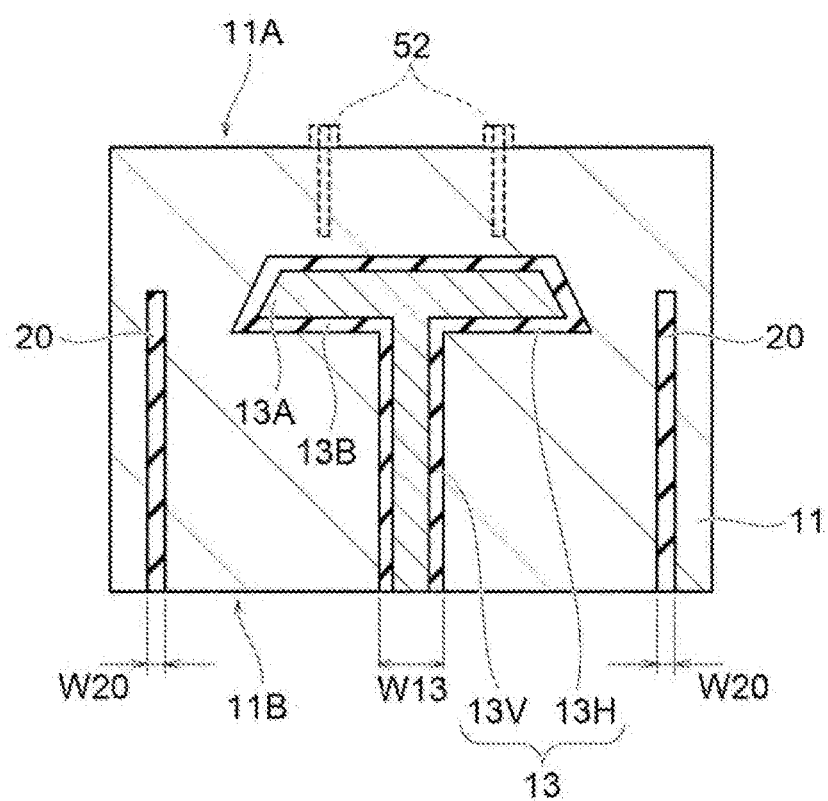

FIG. 29

| ETCHING AZIMUTH | ELEMENT FORMING PLANE | | | | | | | |
|---|---|---|---|---|---|---|---|---|
| | (111) | (-111) | (1-11) | (11-1) | (-1-11) | (-11-1) | (1-1-1) | (-1-1-1) |
| [110] |  | ○ | ○ |  |  | ○ | ○ |  |
| [101] |  | ○ |  | ○ | ○ |  | ○ |  |
| [011] |  |  | ○ | ○ | ○ | ○ |  |  |
| [-110] | ○ |  |  | ○ | ○ |  |  | ○ |
| [1-10] | ○ |  |  | ○ | ○ |  |  | ○ |
| [-101] | ○ |  | ○ |  |  | ○ |  | ○ |
| [10-1] | ○ |  | ○ |  |  | ○ |  | ○ |
| [0-11] | ○ | ○ |  |  |  |  | ○ | ○ |
| [01-1] | ○ | ○ |  |  |  |  | ○ | ○ |
| [-1-10] |  | ○ | ○ |  |  | ○ | ○ |  |
| [-10-1] |  | ○ |  | ○ | ○ |  | ○ |  |
| [0-1-1] |  |  | ○ | ○ | ○ | ○ |  |  |

IMAGING APPARATUS, MANUFACTURING METHOD THEREOF, AND ELECTRONIC EQUIPMENT

CROSS REFERENCE TO RELATED APPLICATIONS

This application is a U.S. National Phase of International Patent Application No. PCT/JP2020/044739 filed on Dec. 1, 2020, which claims priority benefit of Japanese Patent Application No. JP 2019-218336 filed in the Japan Patent Office on Dec. 2, 2019. Each of the above-referenced applications is hereby incorporated herein by reference in its entirety.

TECHNICAL FIELD

The present disclosure relates to an imaging apparatus for performing imaging based on photoelectric conversion, a manufacturing method thereof, and electronic equipment.

BACKGROUND ART

An imaging apparatus that is compatible with a global shutter scheme in which all pixels are imaged at the same timing is known (see PTL 1). The imaging apparatus of this type includes an electrical charge holding unit that accumulates electrical charge accumulated in a photoelectric conversion unit for each pixel.

CITATION LIST

Patent Literature

[PTL 1]
 WO 2016/136486

SUMMARY

Technical Problem

However, if light that is incident on the imaging apparatus is incident directly on the electrical charge holding unit without photoelectric conversion being performed thereon by the photoelectric conversion unit, this may cause an increase in noise. Also, if light that is incident on one pixel penetrates through a boundary of pixels and is then incident on another adjacent pixel, this may cause color mixing or the like.

The present disclosure provides an imaging apparatus capable of curbing noise, color mixing, and the like, a manufacturing method thereof, and electronic equipment.

Solution to Problem

In order to solve the aforementioned problem, according to an aspect of the present disclosure, there is provided an imaging apparatus including: a semiconductor substrate; a photoelectric conversion unit that is provided on the semiconductor substrate and generates electrical charge in accordance with an amount of received light through photoelectric conversion; an electrical charge holding unit that is disposed on a side closer to a first surface of the semiconductor substrate than the photoelectric conversion unit and holds the electrical charge transferred from the photoelectric conversion unit; an electrical charge transfer unit that transfers the electrical charge from the photoelectric conversion unit to the electrical charge holding unit; a vertical electrode that transmits the electrical charge generated by the photoelectric conversion unit to the electrical charge transfer unit and is disposed in a depth direction of the semiconductor substrate; and a first light control member that is disposed on a side closer to a second surface that is a side opposite to the first surface of the semiconductor substrate than the vertical electrode; in which the first light control member includes a first light control portion and a second light control portion extending in mutually intersecting directions in an integrated structure, the first light control portion is disposed at a position overlapping the vertical electrode in a plan view of the semiconductor substrate from a normal line direction of the first surface, and the second light control portion includes one end portion connected to the first light control portion and the other end portion disposed in the depth direction of the semiconductor substrate from the one end portion.

The first light control portion may be disposed along a direction of the first surface, and the other end portion of the second light control portion may be disposed along the second surface.

The semiconductor substrate may include a silicon crystal plane represented by a plane index $\{111\}$, and the first light control portion may include a first light control surface disposed in a first direction that is different from the depth direction of the semiconductor substrate and is disposed along a first crystal plane represented by a plane index $\{111\}$ and a second light control surface that is disposed in a second direction that is different from the depth direction of the semiconductor substrate and is disposed along a second crystal plane represented by a plane index $\{111\}$.

The photoelectric conversion unit, the electrical charge holding unit, the electrical charge transfer unit, and the vertical electrode may be provided for each pixel, and the first light control portion may be disposed across a plurality of pixel regions to overlap the plurality of vertical electrodes corresponding to the plurality of pixels in a plan view of the semiconductor substrate from a normal line direction of the first surface or the second surface.

At least a part of the first light control member may have a property of absorbing or reflecting incident light.

The first light control member may contain at least one of an insulating material, a metal, polysilicon, a metal oxide, a carbon-containing material, and an electrochromic material.

A second light control member disposed on a side closer to the first surface of the semiconductor substrate than the first light control member and is disposed to surround the electrical charge holding unit may be included.

The second light control member may include a third light control portion disposed along a direction of the first surface and a fourth light control portion connected to the third light control portion and disposed in a direction that intersects the third light control portion.

One end portion of the fourth light control portion may be connected to the third light control portion, and the other end portion of the fourth light control portion may be disposed along the first surface.

The fourth light control portion may penetrate through the third light control portion and extend in the depth direction of the semiconductor substrate.

An element separation unit that extends in the depth direction of the semiconductor substrate may be included along a pixel boundary of the semiconductor substrate.

The element separation unit may include a fifth light control portion that is disposed in the depth direction of the semiconductor substrate along a pixel boundary of the semiconductor substrate.

The element separation unit may include a sixth light control portion that is connected to the fifth light control portion and is disposed in a direction that intersects the fifth light control portion.

One end portion of the sixth light control portion may be connected to the fifth light control portion, and the other end portion of the sixth light control portion may be disposed along the second surface.

The sixth light control portion may penetrate through the fifth light control portion and extend in the depth direction of the semiconductor substrate.

The photoelectric conversion unit may have a concentration gradient in which a concentration of impurities changes depending on locations in a first region on a side of the second surface from the first light control portion.

The photoelectric conversion unit may have a concentration gradient in which a concentration of impurities changes depending on locations in a second region on a side of the first surface from the first light control portion.

At least one of the first region and the second region may have a concentration gradient in a horizontal direction of the semiconductor substrate.

At least one of the first region and the second region may have a concentration gradient in the depth direction of the semiconductor substrate.

According to another aspect of the present disclosure, there is provided a method for manufacturing an imaging apparatus, the method including: forming, on a semiconductor substrate, a photoelectric conversion unit that generates electrical charge in accordance with an amount of received light through photoelectric conversion; forming an electrical charge holding unit that is disposed on a side closer to a first surface of the semiconductor substrate than the photoelectric conversion unit and holds the electrical charge transferred from the photoelectric conversion unit; forming an electrical charge transfer unit that transfers the electrical charge from the photoelectric conversion unit to the electrical charge holding unit; forming a vertical electrode that transmits the electrical charge generated by the photoelectric conversion unit to the electrical charge transfer unit in a depth direction of the semiconductor substrate; and forming a first light control member that is disposed on a side closer to a second surface that is a side opposite to the first surface of the semiconductor substrate than the vertical electrode and includes a first light control portion and a second light control portion extending in mutually intersecting directions in an integrated structure, in which the first light control portion is disposed at a position overlapping the vertical electrode in a plan view of the semiconductor substrate from a normal line direction of the first surface, one end portion of the second light control portion is connected to the first light control portion, and the other end portion of the second light control portion is disposed in the depth direction of the semiconductor substrate from the one end portion.

According to another aspect of the present disclosure, there is provided a method for manufacturing an imaging apparatus, the method including: forming, on a semiconductor substrate, a photoelectric conversion unit that generates electrical charge in accordance with an amount of received light through photoelectric conversion; forming a hollow portion or a filled portion obtained by filling the hollow portion with a predetermined material in a part of the photoelectric conversion unit; forming an electrical charge holding unit that is disposed on a side closer to a first surface of the semiconductor substrate than the hollow portion or the filled portion and holds the electrical charge transferred from the photoelectric conversion unit; forming an electrical charge transfer unit that transfers the electrical charge from the photoelectric conversion unit to the electrical charge holding unit; forming a trench that reaches the hollow portion or the filled portion from a side of a second surface that is a side opposite to the first surface of the semiconductor substrate; and forming a first light control portion at a location where the hollow portion or the filled portion is formed and forming a second light control portion at a location where the trench is formed using the hollow portion or the filled portion and the trench.

According to another aspect of the present disclosure, there is provided electronic equipment including: an imaging apparatus, in which the imaging apparatus includes a semiconductor substrate, a photoelectric conversion unit that is provided on the semiconductor substrate and generates electrical charge in accordance with an amount of received light through photoelectric conversion, an electrical charge holding unit that is disposed on a side closer to a first surface of the semiconductor substrate than the photoelectric conversion unit and holds the electrical charge transferred from the photoelectric conversion unit, an electrical charge transfer unit that transfers the electrical charge from the photoelectric conversion unit to the electrical charge holding unit, a vertical electrode that transmits the electrical charge generated by the photoelectric conversion unit to the electrical charge transfer unit and is disposed in a depth direction of the semiconductor substrate, and a first light control member that is disposed on a side closer to a second surface that is a side opposite to the first surface of the semiconductor substrate than the vertical electrode, the first light control member includes a first light control portion and a second light control portion extending in mutually intersecting directions in an integrated structure, the first light control portion is disposed at a position overlapping the vertical electrode in a plan view of the semiconductor substrate from a normal line direction of the first surface, and the second light control portion includes one end portion connected to the first light control portion and the other end portion disposed in the depth direction of the semiconductor substrate from the one end portion.

BRIEF DESCRIPTION OF DRAWINGS

FIG. 28B is a sectional view illustrating another modification example of the fourth embodiment.

FIG. 28C is a sectional view illustrating another modification example of the fourth embodiment.

FIG. 28D is a sectional view illustrating another modification example of the fourth embodiment.

FIG. 29 is a diagram illustrating a specific combination of a plane and an orientation that establish etching in a <110> direction in a {111} plane.

FIG. 30 is a schematic view for explaining a back bond in a crystal plane of an Si substrate according to the present disclosure.

FIG. 31 is a schematic view for explaining an off angle in the surface of the Si substrate according to the present disclosure.

FIG. 32 is a block diagram illustrating an example of an overall configuration of a vehicle control system.

FIG. 33 is an explanatory diagram illustrating an example of positions at which a vehicle exterior information detection unit and an imaging unit are installed.

FIG. 34 is a plan view schematically illustrating main components of a pixel array unit in the imaging apparatus in an enlarged manner.

DESCRIPTION OF EMBODIMENTS

First Embodiment

Hereinafter, embodiments of the present disclosure will be described in detail. An imaging apparatus according to the present disclosure is a backside irradiation-type image sensor of a global shutter scheme using a complementary metal oxide semiconductor (CMOS) image sensor, for example. The imaging apparatus according to the present disclosure receives, at each pixel, light from an object, performs photoelectric conversion thereon, and generates a pixel signal that is an electric signal.

The global shutter scheme is a scheme in which a start and an end of exposure of all pixels are performed at the same time. Here, all pixels mean all pixels forming an effective image, and dummy pixels and the like that do not contribute to image formation are excluded. Also, the start and the end may not necessarily be performed at the same time as long as image distortion and an exposure time difference are sufficiently small to such an extent that no problem occurs. A case in which an operation of performing simultaneous exposure in units of a plurality of rows (such as several tens of rows) is repeated with a shift in units of a plurality of rows in a row direction, for example, is also included in the global shutter scheme. Also, a case in which simultaneous exposure is performed only on a part of the pixel region is also included in the global shutter scheme.

The backside irradiation-type image sensor is an image sensor in which a photoelectric conversion unit such as a photodiode that receives light from an object and converts the light into an electric signal is disposed for each pixel between a light receiving surface on which light from the object is incident and a wiring layer in which a wiring of a transistor or the like for driving each pixel is provided. Note that the present disclosure may be able to be applied to an image sensor of an imaging scheme other than the CMOS image sensor.

(Block Configuration of Imaging Apparatus 101)

Figure 1:
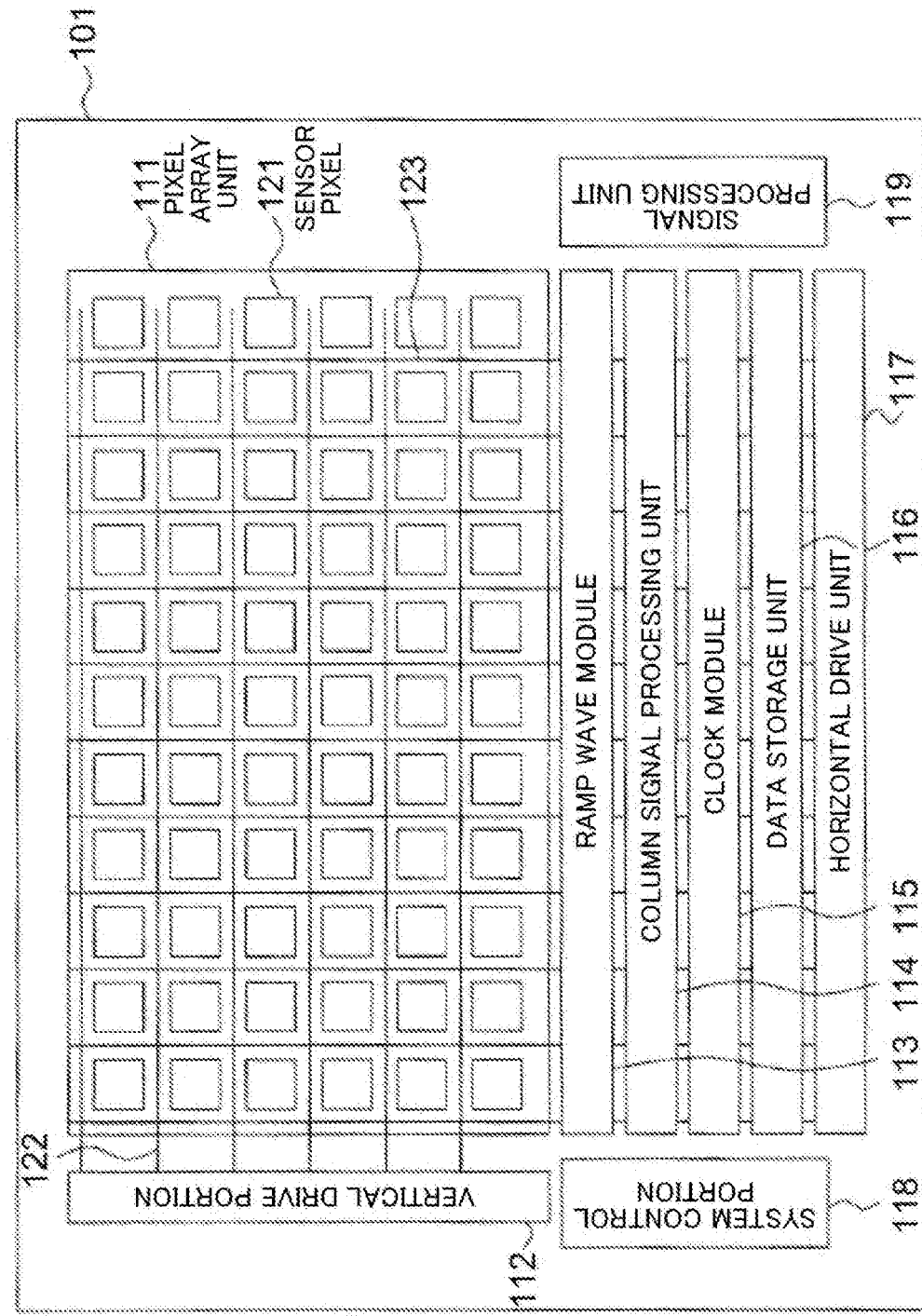
FIG. 1 is a block diagram illustrating an overview configuration of an imaging apparatus according to an embodiment.

FIG. 1 is a block diagram illustrating an overview configuration of an imaging apparatus 101 according to an embodiment of the present disclosure. Although the imaging apparatus 101 in FIG. 1 is accurately a solid imaging apparatus 101 since the imaging apparatus 101 is formed on a semiconductor substrate 11, it will simply be referred to as an imaging apparatus 101 below. The imaging apparatus 101 in FIG. 1 includes a pixel array unit 111 in which a plurality of sensor pixels 121 that perform photoelectric conversion are disposed in a matrix shape, namely a two-dimensional planar shape. The sensor pixels 121 correspond to one specific example of the "pixels" according to the present disclosure. A pixel signal after photoelectric conversion in the pixel array unit 111 is read via a reading circuit.

The imaging apparatus 101 includes, for example, a pixel array unit 111, a vertical drive unit 112, a ramp wave module 113, a column signal processing unit 114, a clock module 115, a data storage unit 116, a horizontal drive unit 117, a system control unit 118, and a signal processing unit 119.

The imaging apparatus 101 is configured by a single or a plurality of semiconductor substrates 11. For example, the imaging apparatus 101 can be configured by electrically connecting, to the semiconductor substrate 11 on which the pixel array unit 111 is formed, another semiconductor substrate 11 on which the vertical drive unit 112, the ramp wave module 113, the column signal processing unit 114, the clock module 115, the data storage unit 116, the horizontal drive unit 117, the system control unit 118, the signal processing unit 119, and the like are formed through Cu—Cu bonding or the like.

The pixel array unit 111 includes a plurality of sensor pixels 121 including photoelectric conversion elements that generate and accumulate electrical charge in accordance with the amount of light that is incident from an object. The sensor pixels 121 are aligned in the lateral direction (row direction) and the longitudinal direction (column direction) as illustrated in FIG. 1. In the pixel array unit 111, a pixel drive line 122 is arranged along the row direction for each pixel row including sensor pixels 121 aligned in one line in the row direction, and a vertical signal line 123 is arranged along the column direction for each pixel column including sensor pixels 121 aligned in one line in the column direction.

The vertical drive unit 112 includes a shift resister, an address decoder, or the like. The vertical drive unit 112 causes all the plurality of sensor pixels 121 in the pixel array unit 111 to be driven at the same time or in units of pixel rows by supplying a signal or the like to each of the plurality of sensor pixels 121 via the plurality of pixel drive lines 122.

The ramp wave module 113 generates a ramp wave signal used for analog/digital (A/D) conversion of the pixel signal and supplies the ramp wave signal to the column signal processing unit 114. The column signal processing unit 114 includes, for example, a shift resister, an address decoder, or the like and performs noise removal processing, correlated double sampling processing, A/D conversion processing, and the like to generate a pixel signal. The column signal processing unit 114 supplies the generated pixel signal to the signal processing unit 119.

The clock module 115 supplies a clock signal for an operation to each component of the imaging apparatus 101.

The horizontal drive unit 117 selects unit circuits of the column signal processing unit 114 corresponding to the pixel columns in order. The pixel signal after signal processing performed thereon for each unit circuit in the column signal processing unit 114 is output to the signal processing unit 119 in order through selective scanning performed by the horizontal drive unit 117.

The system control unit 118 includes a timing generator or the like that generates various timing signals. The system control unit 118 controls driving of the vertical drive unit 112, the ramp wave module 113, the column signal processing unit 114, the clock module 115, and the horizontal drive unit 117 on the basis of the timing signals generated by the timing generator.

The signal processing unit 119 performs signal processing such as an arithmetic operation on a pixel signal supplied from the column signal processing unit 114 while temporarily storing data in the data storage unit 116 as needed and outputs an image signal including each pixel signal.

(Circuit Configuration of Reading Circuit 120)

Figure 2:
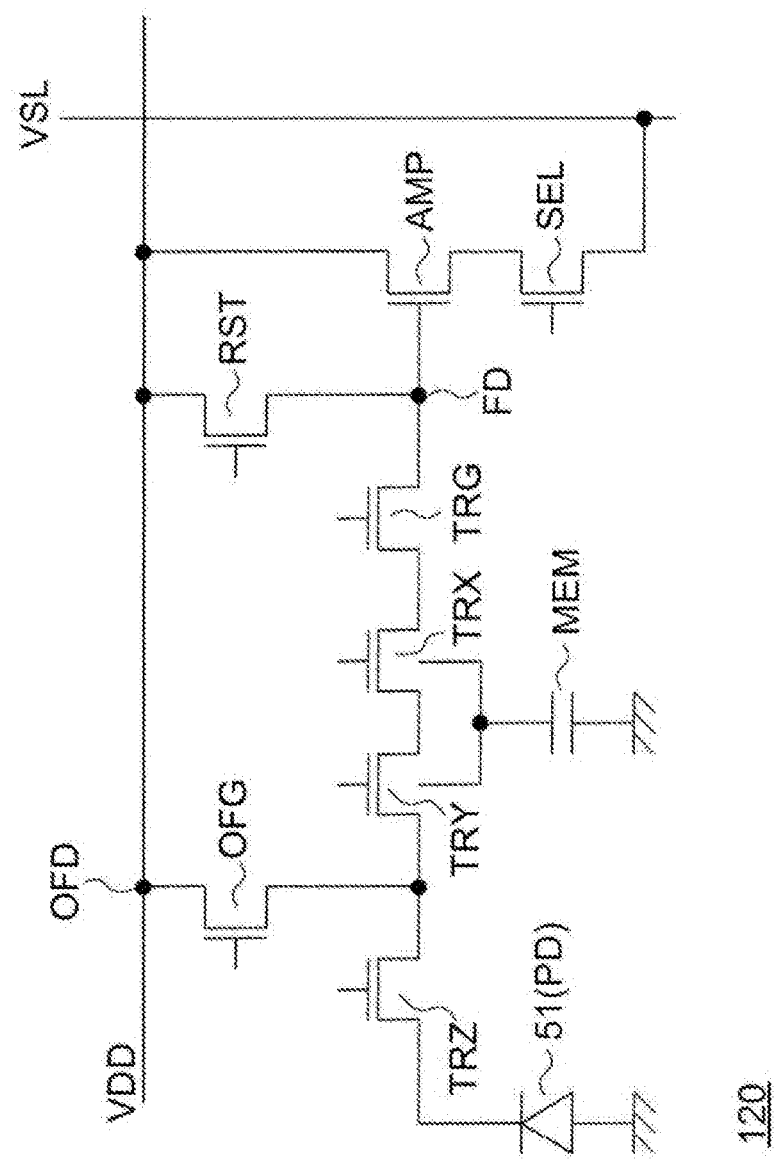
FIG. 2 is an equivalent circuit diagram of a sensor pixel and a reading circuit.
Figure 3:
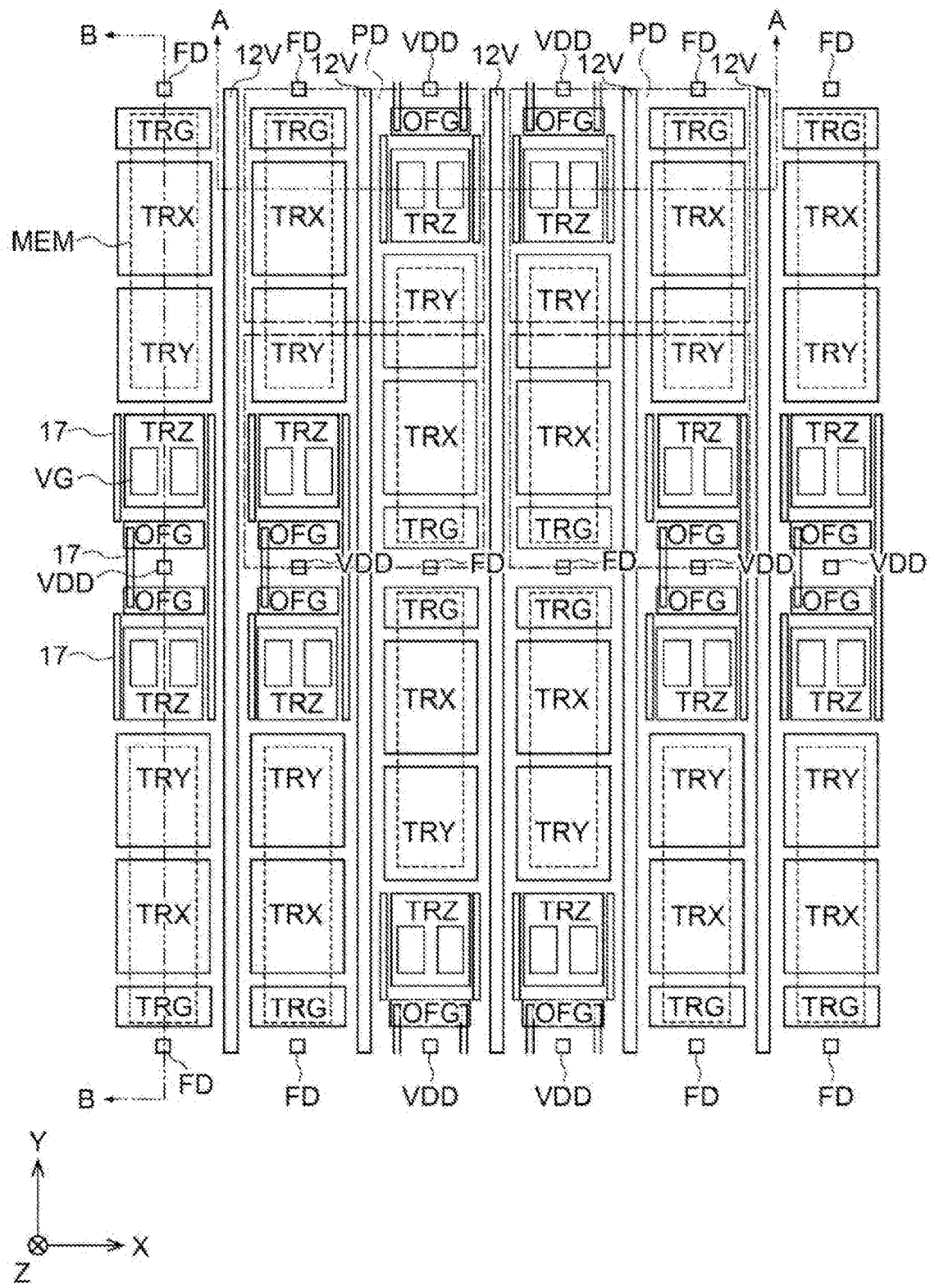
FIG. 3 is a planar layout diagram of a part of pixel region inside a pixel array unit 111.

FIG. 2 is an equivalent circuit diagram of a sensor pixel 121 and a reading circuit 120. FIG. 3 is a planar layout diagram of a part of a pixel region inside the pixel array unit 111. FIG. 3 illustrates a planar layout of a pixel region including two pixels in the X direction and four pixels in the Y direction.

As illustrated in FIGS. 2 and 3, the reading circuit 120 includes four transfer transistors TRZ, TRY, TRX, and TRG, a discharge transistor OFG, a reset transistor RST, an amplification transistor AMP, and a selection transistor SEL. These transistors are N-type MOS transistors. The reset transistor RST, the amplification transistor AMP, and the selection transistor SEL are formed on and attached to the semiconductor substrate that is different from the semiconductor substrate 11 on which the pixel array unit 111 is disposed, and these transistors are not explicitly illustrated in the planar layout in FIG. 3.

Hereinafter, an example in which a photodiode PD is used as the photoelectric conversion unit 51 will be mainly described. The transfer transistor TRZ is connected to the photodiode PD inside the sensor pixel 121 and transfers electrical charge (pixel signal) after photoelectric conversion performed thereon by the photodiode PD to the transfer transistor TRY. A vertical transistor is assumed as the transfer transistor TRZ, and the transfer transistor TRZ includes a vertical gate electrode.

The transfer transistor TRY transfers, to the transfer transistor TRX, the electrical charge transferred from the transfer transistor TRZ. The transfer transistors TRY and TRX may be replaced with one transfer transistor. An electrical charge holding unit (MEM) 54 is connected to the transfer transistors TRY and TRX. A potential of the electrical charge holding unit (MEM) 54 is controlled by a control signal applied to gate electrodes of the transfer transistors TRY and TRX. For example, the potential of the electrical charge holding unit (MEM) 54 becomes deep if the transfer transistors TRY and TRX are turned on, and the potential of the electrical charge holding unit (MEM) 54 becomes shallow if the transfer transistors TRY and TRX are turned off. If the transfer transistors TRZ, TRY, and TRX are turned on, for example, then the electrical charge accumulated in the photodiode PD is transferred to the electrical charge holding unit (MEM) 54 via the transfer transistors TRZ, TRY, and TRX. A drain of the transfer transistor TRX is electrically connected to a source of the transfer transistor TRG, and gates of the transfer transistors TRY and TRX are connected to a pixel drive line.

The electrical charge holding unit (MEM) 54 is a region that temporarily holds the electrical charge accumulated in the photodiode PD in order to realize a global shutter function. The electrical charge holding unit (MEM) 54 holds the electrical charge transferred from the photodiode PD.

The transfer transistor TRG is connected between the transfer transistor TRX and a floating diffusion FD and transfers the electrical charge held by the electrical charge holding unit (MEM) 54 to the floating diffusion FD in accordance with a control signal applied to the gate electrode. If the transfer transistor TRX is turned off, and the transfer transistor TRG is turned on, for example, the electrical charge held by the electrical charge holding unit (MEM) 54 is transferred to the floating diffusion FD. A drain of the transfer transistor TRG is electrically connected to the floating diffusion FD, and a gate of the transfer transistor TRG is connected to the pixel drive line.

The floating diffusion FD is a floating and diffusion region that temporarily holds the electrical charge output from the photodiode PD via the transfer transistor TRG. A reset transistor RST, for example, is connected to the floating diffusion FD, and a vertical signal line VSL is connected to the floating diffusion FD via the amplification transistor AMP and the selection transistor SEL.

The discharge transistor OFG initializes (resets) the photodiode PD in accordance with a control signal applied to the gate electrode. A drain of the discharge transistor OFG is connected to a power source line VDD, and a source is connected between the transfer transistor TRZ and the transfer transistor TRY.

If the transfer transistor TRZ and the discharge transistor OFG are turned on, for example, the potential of the photodiode PD is reset to the potential level of the power source line VDD. In other words, the photodiode PD is initialized. Also, the discharge transistor OFG forms an overflow path between the transfer transistor TRZ and the power source line VDD, for example, and discharges the electrical charge overflowing from the photodiode PD to the power source line VDD.

The reset transistor RST initializes (resets) each region from the electrical charge holding unit (MEM) 54 to the floating diffusion FD in accordance with a control signal applied to a gate electrode. A drain of the reset transistor RST is connected to the power source line VDD, and a source is connected to the floating diffusion FD. If the transfer transistor TRG and the reset transistor RST are turned on, for example, the potentials of the electrical charge holding unit (MEM) 54 and the floating diffusion FD are reset to the potential level of the power source line VDD. In other words, the electrical charge holding unit (MEM) 54 and the floating diffusion FD are initialized by turning on the reset transistor RST.

The amplification transistor AMP has a gate electrode connected to the floating diffusion FD and a drain connected to the power source line VDD and serves as an input unit of a source follower circuit that reads electrical charge obtained through photoelectric conversion at the photodiode PD. In other words, the amplification transistor AMP constitutes the source follower circuit with a constant current source connected to one end of the vertical signal line VSL by the source thereof being connected to the vertical signal line VSL via the selection transistor SEL.

The selection transistor SEL is connected between the source of the amplification transistor AMP and the vertical signal line VSL, and a control signal as a selection signal is supplied to the gate electrode of the selection transistor SEL. If the control signal is turned on, then the selection transistor SEL is brought into a conduction state, and the sensor pixel 121 coupled to the selection transistor SEL is brought into a selected state. If the sensor pixel 121 is brought into a selected state, a pixel signal output from the amplification transistor AMP is read by the column signal processing unit 114 via the vertical signal line VSL.

As illustrated in FIG. 3, the transfer transistors TRG, TRX, TRY, and TRZ inside the reading circuit 120 of one sensor pixel 121 and the discharge transistor OFG are disposed in the Y direction in order. As for disposition of each transistor inside two sensor pixels 121 that are adjacent in the Y direction, the transistors are disposed symmetrically with respect to a boundary of the pixels in the Y direction. A case in which the alignment of each transistor inside the reading circuit 120 for the two sensor pixels 121 that are adjacent in the X direction is opposite and a case in which the alignment is the same are alternately repeated.

The electrical charge holding unit (MEM) 54 is disposed below the transfer transistors TRG, TRX, and TRY. Also, the photodiode PD in one sensor pixel 121 is disposed across a part below the transfer transistors TRG, TRX, and TRY of the sensor pixel 121 and a part below the discharge transistor ORG and the transfer transistors TRZ and TRY of the sensor pixel 121 that is adjacent in the X direction.

The planar layout of each transistor in the reading circuit 120 is not necessarily limited to the one illustrated in FIG. 3. If the disposition of each transistor in the reading circuit 120 changes, the disposition locations of the photodiode PD and the electrical charge holding unit (MEM) 54 disposed below the transistors also change.

(Sectional Structure of Imaging Apparatus 101)

Figure 4A:
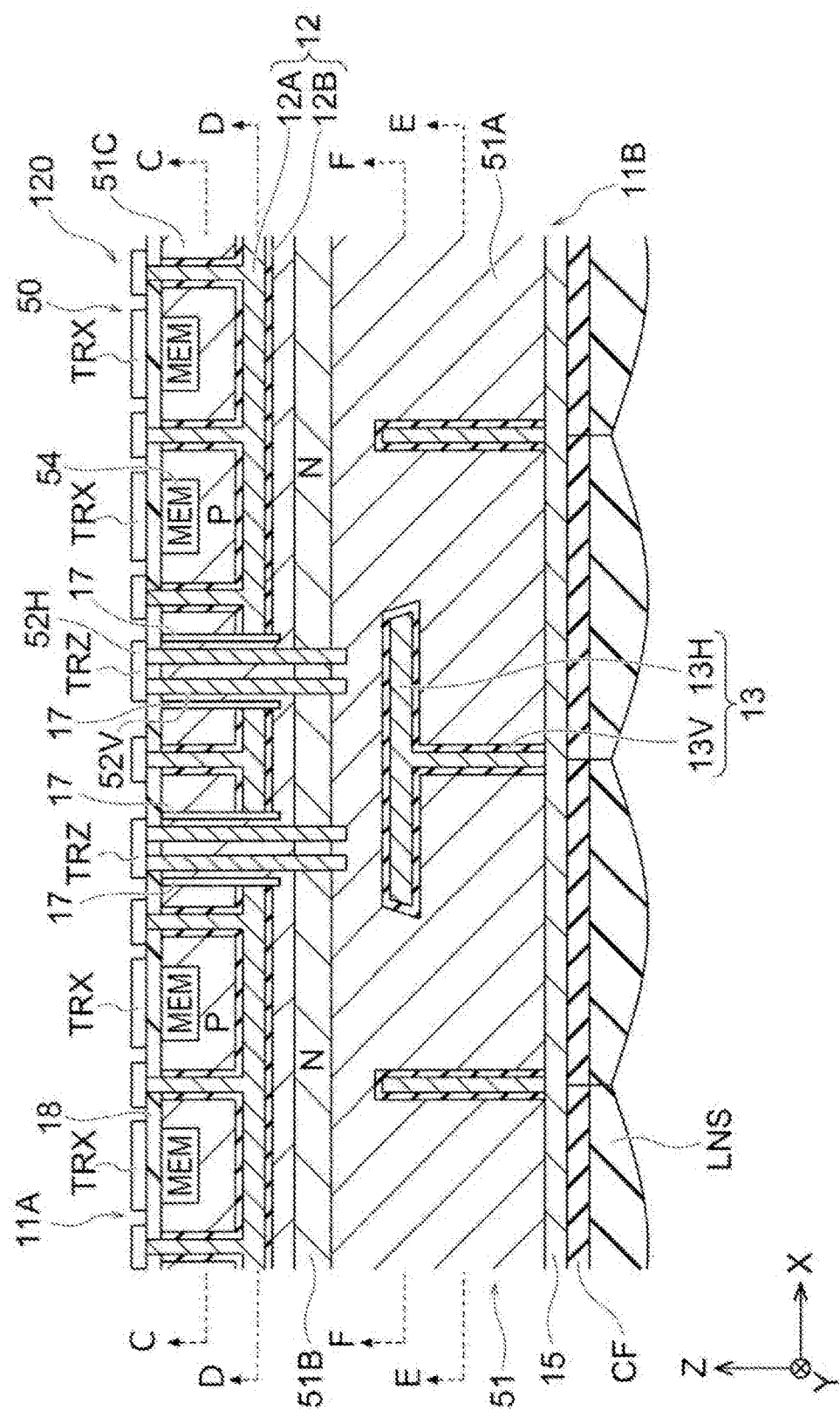
FIG. 4A is a sectional view in the A-A direction in FIG. 3.
Figure 4B:
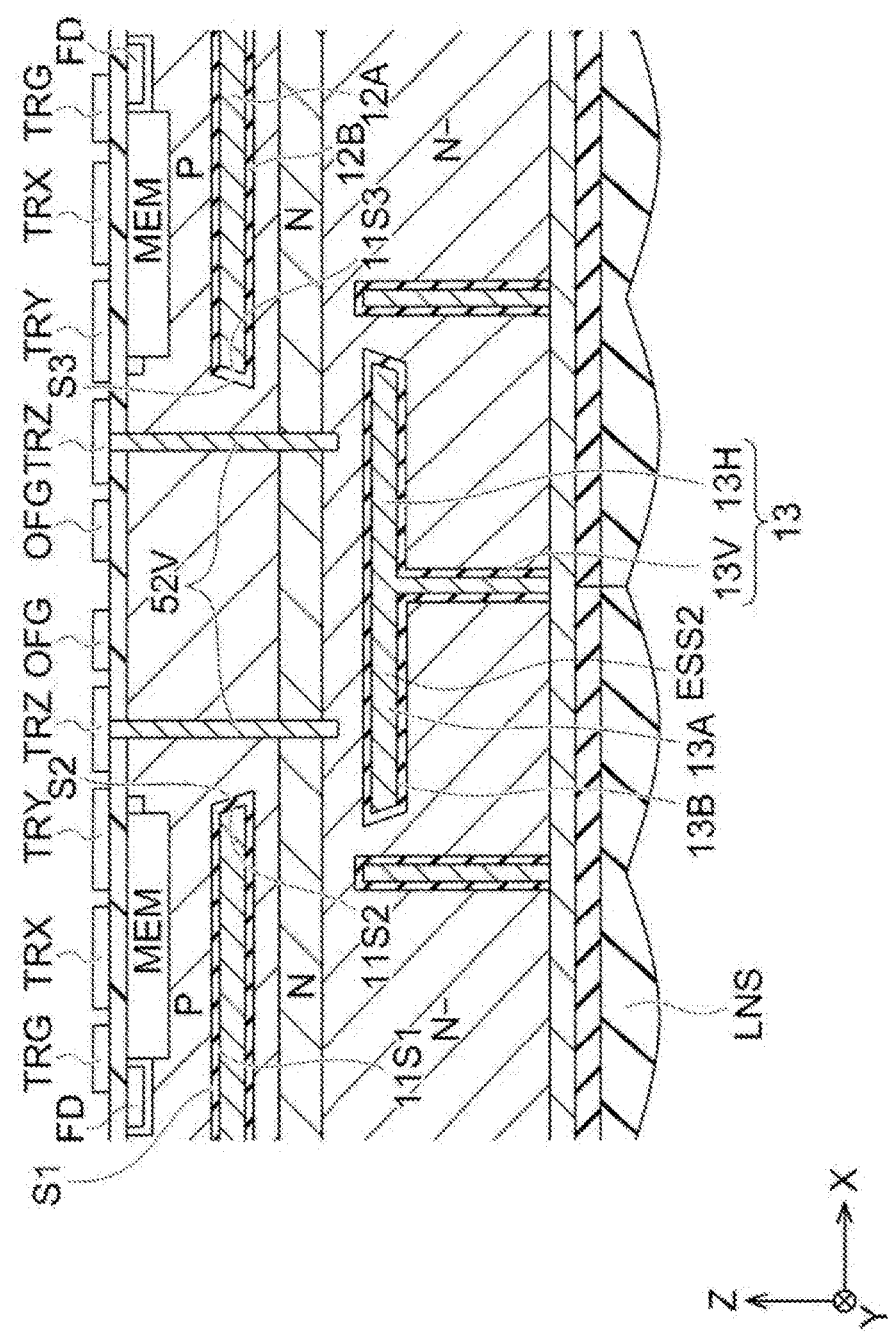
FIG. 4B is a sectional view in the B-B direction in FIG. 3.

FIG. 4A is a sectional view in the A-A direction in FIG. 3, and FIG. 4B is a sectional view in the B-B direction in FIG. 3. The symbols "P" and "N" in the drawings represent a P-type semiconductor region and an N-type semiconductor region, respectively. Moreover, "+" or "−" at the end of each of the symbols "P++", "P+", "P−", and "P−−" represents concentration of impurities in the P-type semiconductor region. Similarly, "+" or "−" at the end of each of the symbols "N++", "N+", "N−", and "N−−" represents concentration of impurities in the N-type semiconductor region. Here, a larger number of "+" means that the concentration of impurities is higher while a larger number of "−" means that the concentration of impurities is lower. The same applies to the following drawings.

The imaging apparatus 101 illustrated in FIGS. 4A and 4B includes the semiconductor substrate 11, the photoelectric conversion unit 51, the electrical charge holding unit (MEM) 54, the electrical charge transfer unit 50, the vertical gate electrode 52V that is a vertical electrode of the transfer transistor TRZ, and a first light shielding unit 13 that functions as a first light control member.

The semiconductor substrate 11 is, for example, a monocrystal silicon substrate 11 with a crystal orientation of a plane index {111}. Hereinafter, the semiconductor substrate 11 may be referred to as a silicon {111} substrate. One of the reasons that the silicon {111} substrate 11 is used is because a process of performing etching in a direction along the crystal plane is included as will be described later. The plane index {111} intended here also includes crystal orientations in which arbitrary directions out of three-dimensional directions are opposite, such as (−111), (1−11), and (11−1).

Additionally, the imaging apparatus 101 includes a second light shielding unit 12 that functions as a second light control member, element separation units 13V and 20, an etching stopper 17, a color filter CF, and a light receiving lens LNS. In the specification, one main surface of the semiconductor substrate 11 on the side on which the light receiving lens LNS is disposed will be referred to as a rear surface 11B or a light receiving surface, and one main surface on the side on which the reading circuit 120 is disposed will be referred to as a front surface 11A.

The photoelectric conversion unit 51 in the semiconductor substrate 11 includes an N−-type semiconductor region 51A, an N-type semiconductor region 51B, and a P-type semiconductor region 51C in order from the position closest to the rear surface 11B, for example. Photoelectric conversion is performed on light that is incident on the rear surface 11B in the N−-type semiconductor region 51A to generate electrical charge, and the electrical charge is accumulated in the N-type semiconductor region 51B. Note that the boundary between the N−-type semiconductor region 51A and the N-type semiconductor region 51B is not necessarily clear, and it is only necessary that the concentration of N-type impurities gradually increase from the N−-type semiconductor region 51A toward the N-type semiconductor region 51B, for example. Also, a P-type semiconductor region with higher concentration of P-type impurities than the P-type semiconductor region 51C may be provided between the N-type semiconductor region and the P-type semiconductor region 51C. In this manner, the layer configuration of the photoelectric conversion unit 51 formed inside the semiconductor substrate 11 is not necessarily limited to the one illustrated in FIG. 1.

The first light shielding unit 13 is disposed on a side closer to the rear surface 11B of the semiconductor substrate 11 than the second light shielding unit 12. The first light shielding unit 13 includes a vertical light shielding portion 13V extending in the depth direction of the semiconductor substrate 11 and a horizontal light shielding portion 13H extending in the horizontal direction of the semiconductor substrate 11. The vertical light shielding portion 13V also functions as a part of the element separation units 13V and 20, which will be described later. As illustrated in FIG. 4A, the sectional shape of the first light shielding unit 13 is a T shape formed by the vertical light shielding portion 13V and the horizontal light shielding portion 13H. The horizontal light shielding portion 13H of the first light shielding unit 13 is disposed at a position overlapping the vertical gate electrode 52V in the depth direction in a plan view. In this manner, light that is incident from the side of the rear surface 11B of the semiconductor substrate 11 is shielded by the horizontal light shielding portion 13H and is not incident on the vertical gate electrode 52V. As will be described later, the first light shielding unit 13 has an excellent light absorbing property or an excellent light reflecting property and may be referred to as a first light control member in the present specification. Also, the horizontal light shielding portion 13H of the first light shielding unit 13 may be referred to as a first light control portion, and the vertical light shielding portion 13V of the first light shielding unit 13 may be referred to as a second light control portion. Details of the first light shielding unit 13 will be described later.

The second light shielding unit 12 is a member that functions to prevent light from being incident on the electrical charge holding unit (MEM) 54 and is provided to surround the electrical charge holding unit (MEM) 54. Specifically, the second light shielding unit 12 includes, for example, horizontal light shielding portions 12H spreading along a horizontal plane (XY plane) between the photoelectric conversion unit 51 and the front surface 11A of the semiconductor substrate 11 and vertical light shielding portions 12V spreading along the YZ plane such that the vertical light shielding portions 12V intersect the horizontal light shielding portions 12H. The second light shielding unit 12 has an excellent light absorbing property or an excellent light reflecting property and may be referred to as a second light control member in the specification. Also, the horizontal light shielding portions 12H of the second light shielding unit 12 may be referred to as a third light control portion, and the vertical light shielding portions 12V of the second light shielding unit 12 may be referred to as a fourth light control portion. Details of the second light shielding unit 12 will be described later.

The element separation units 13V and 20 are provided along the boundary of the pixels and include a first element separation unit 13V and second element separation units 20. The first element separation unit 13V corresponds to the aforementioned vertical light shielding portion 13V of the first light shielding unit 13. The second element separation units 20 are members with wall shapes that extend in the depth (Z-axis) direction along the boundary position between the mutually adjacent sensor pixels 121 and surround each photoelectric conversion unit 51. The second element separation units 20 can electrically separate the mutually adjacent sensor pixels 121. The second element separation units 20 are constituted by an insulating material such as silicon oxide, for example. The second element separation units 20 can be used to prevent light from being incident on the adjacent sensor pixel 121. The second element separation units 20 are formed by a material with an excellent light absorbing property or an excellent light reflecting property. Details of the second element separation units 20 will be described later.

As illustrated in FIGS. 4A and 4B, the vertical light shielding portion 13V (the first the second element separation units 20) of the first light shielding unit 13 or the second element separation unit 20 are disposed at the boundary of the sensor pixels 121. Although the second element separation units 20 include only the vertical light shielding portions in FIGS. 4A and 4B, the second element separation units 20 may include the vertical light shielding portions and the horizontal light shielding portions as will be described later, and various sectional shapes such as a T shape and a cross shape are conceivable as the sectional shape of the second element separation units 20.

Both the vertical light shielding portion 13V of the first light shielding unit 13 and the second element separation units 20 can prevent the light that is incident on the inside of each sensor pixel 121 from the side of the rear surface 11B of the semiconductor substrate 11 from leaking out to the adjacent sensor pixel 121 and can reduce crosstalk between the pixels.

Although the first light shielding unit 13, the second light shielding unit 12, and the second element separation units 20 are not necessarily limited to the same structure and the same constituent material, the first light shielding unit 13, the second light shielding unit 12, and the second element separation units 20 commonly include materials with an excellent light absorbing property or an excellent light reflecting property. The first light shielding unit 13 and the second element separation units 20 include the vertical light shielding portions extending in the depth direction from the side of the rear surface 11B of the semiconductor substrate 11 while the second light shielding unit 12 includes the vertical light shielding portion extending in the depth direction from the side of the front surface 11A of the semiconductor substrate 11.

Each of the gate electrodes of the transfer transistors TRZ, TRY, TRX, and TRG in the reading circuit 120 and the discharge transistor ORG is provided on the side of the front surface 11A of the semiconductor substrate 11 via an insulating layer 18. Also, the electrical charge holding unit (MEM) 54 that is an N-type semiconductor region is provided inside the P-type semiconductor region 51C in the semiconductor substrate 11. More specifically, the electrical charge holding unit (MEM) 54 is disposed between the front surface 11A of the semiconductor substrate 11 and the horizontal light shielding portions 12H of the second light shielding unit 12. As illustrated in FIG. 4A, the second light shielding unit 12 surrounds the periphery of the electrical charge holding unit (MEM) 54 such that light from the side of the rear surface 11B is prevented from being incident on the electrical charge holding unit (MEM) 54. In the speci-fication, the transfer transistors TRZ, TRY, TRX, and TRG will also collectively be referred to as an electrical charge transfer unit 50.

The transfer transistor TRZ includes a horizontal gate electrode 52H disposed in the horizontal plane direction of the semiconductor substrate 11 and a vertical gate electrode 52V extending in the depth direction of the semiconductor substrate 11. The deepest position of the vertical gate electrode 52V is inside the N$^-$-type semiconductor region 52A, for example. Although FIG. 4A illustrates an example in which each sensor pixel 121 includes two vertical gate electrodes 52V, the number of vertical gate electrodes 52V is not limited and may be one or more. The transfer transistor TRZ transfers the electrical charges after the photoelectric conversion performed thereon by the photoelectric conversion unit 51 to the transfer electrode TRY via the vertical gate electrode 52V.

Figure 5:
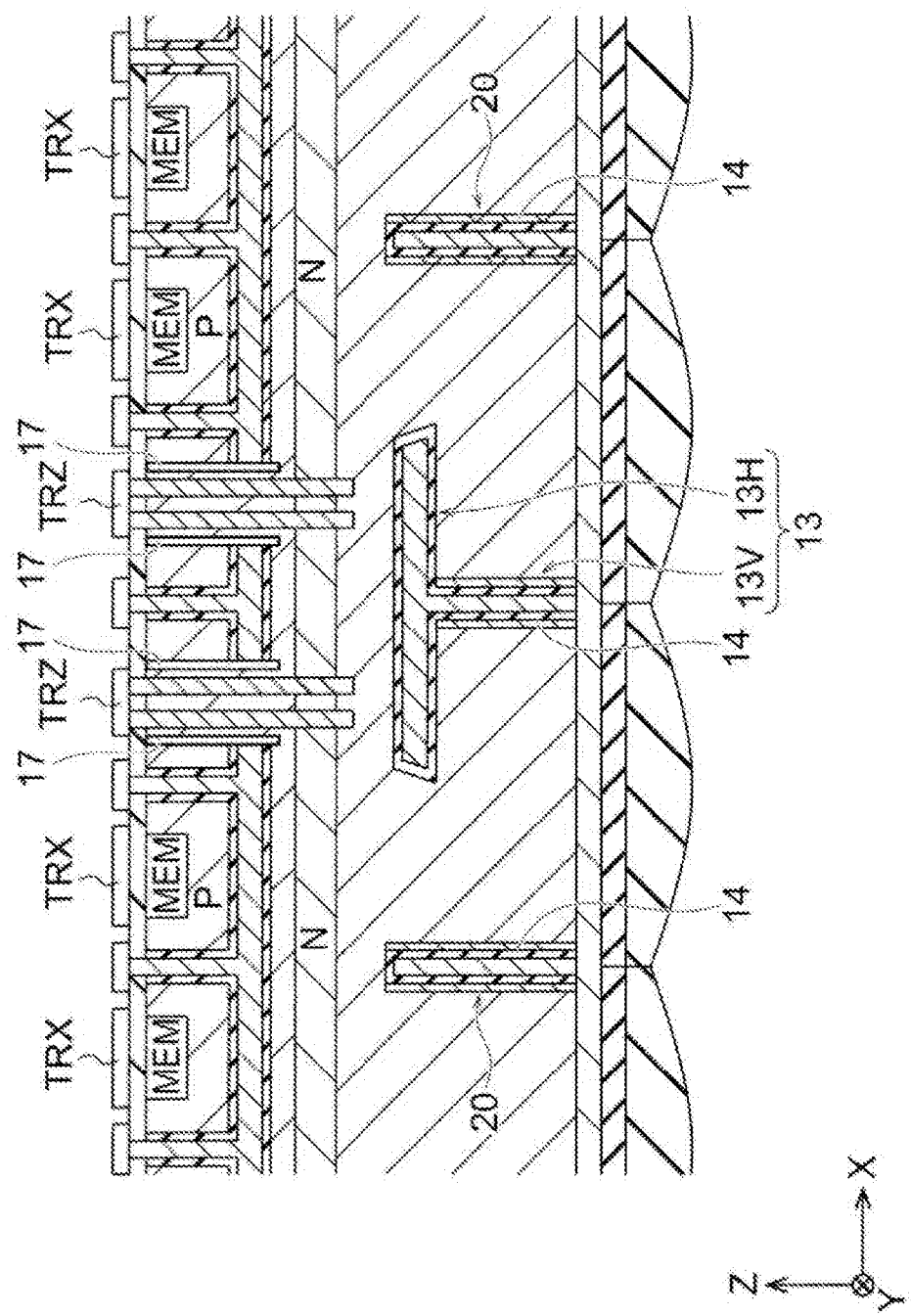
FIG. 5 is a sectional view of a PN junction surface increased by adding a P-type semiconductor region to FIG. 4A.

The photoelectric conversion unit 51 can efficiently generate electrical charge using a depletion layer generated in the surroundings of PN junction. Therefore, the vertical light shielding portion 13V of the first light shielding unit 13 and the second element separation units 20 may be provided with a P-type semiconductor region 14 along the depth direction to widen the area of the PN junction surface as illustrated in FIG. 5. The P-type semiconductor regions 14 may also be provided above and below the horizontal light shielding portion 13H.

As illustrated in FIGS. 4A, 4B, and the like, a fixed electrical charge film 15 is provided between the photoelectric conversion unit 51 and the rear surface 11B. The fixed electrical charge film 15 is provided along the rear surface 11B of the semiconductor substrate 11. The fixed electrical charge film 15 has negative fixed electrical charge to curb occurrence of a dark current caused by an interface state of the rear surface 11B that is the light receiving surface of the semiconductor substrate 11. A hole accumulation layer is formed in the vicinity of the rear surface 11B of the semiconductor substrate 11 by an electric field induced by the fixed electrical charge film 15. Generation of electrons from the rear surface 11B is curbed by the hole accumulation layer.

As illustrated in FIGS. 4A and 4B, a color filter CF is disposed on the front surface 11A of the fixed electrical charge film 15, and a light receiving lens LNS is disposed on the front surface 11A of the color filter CF. The color filter CF and the light receiving lens LNS are provided for each pixel.

(Structure of Second Light Shielding Unit 12)

Figure 6A:
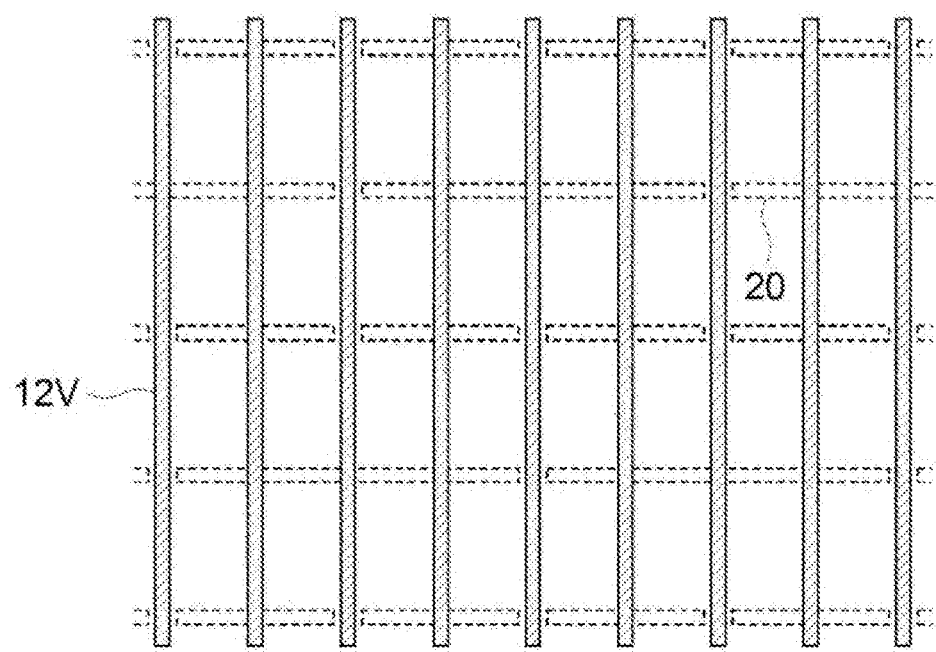
FIG. 6A is a plan view of vertical light shielding portions 12V of a second light shielding unit 12.
Figure 6B:
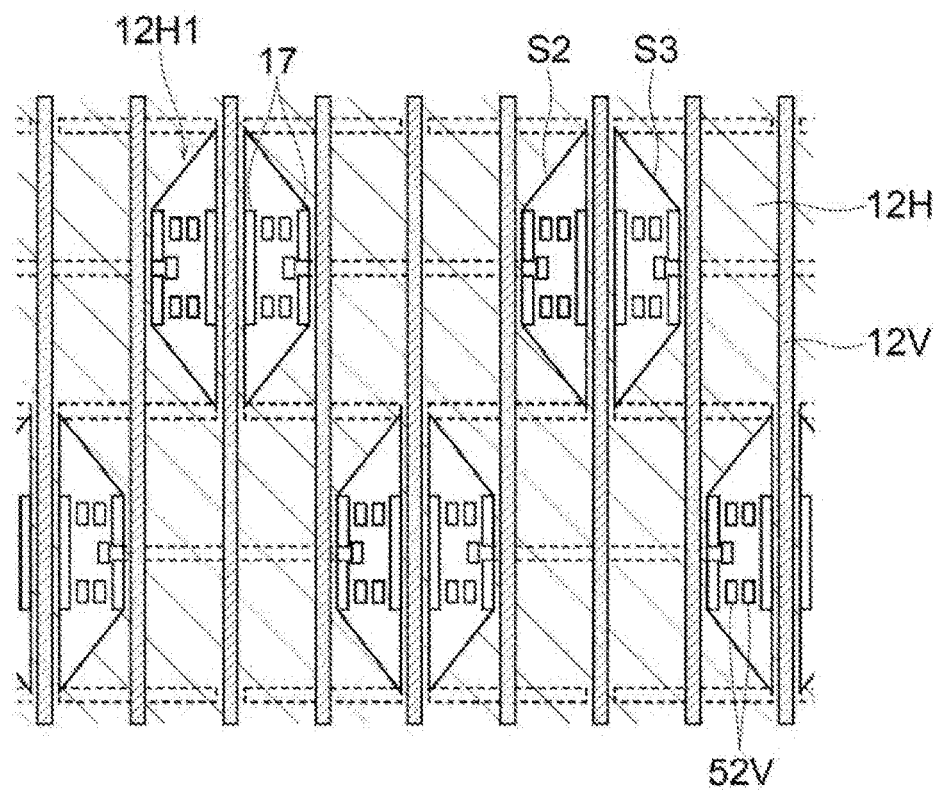
FIG. 6B is a plan view of a horizontal light shielding portions 12H of the second light shielding unit 12.
Figure 6B:
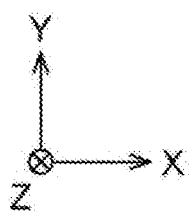

FIG. 6A is a plan view of the vertical light shielding portions 12V of the second light shielding unit 12. FIG. 6A is a plan view in the direction of the line C-C in FIG. 4A. FIG. 6B is a plan view of the horizontal light shielding portions 12H of the second light shielding unit 12. FIG. 6B is a sectional view in the direction of the line D-D' in FIG. 4A. The vertical light shielding portions 12V extend in the Y-axis direction along the boundary portions of sensor pixels 121 that are adjacent in the X-axis direction and substantially centers of the sensor pixels 121 in a plan view as illustrated in FIGS. 4A and 6A. The vertical light shielding portions 12V extend in the depth direction from the front surface 11A of the semiconductor substrate 11 and are connected to the horizontal light shielding portions 12H. The vertical light shielding portions 12V are disposed at intervals of substantially a half of each pixel in the X-axis direction and have a length corresponding to a plurality of pixels in the Y-axis direction.

Note that the light shielding portions extending in the lateral direction and illustrated by dashed lines in FIG. 6A are vertical light shielding portions of the second element separation units 20, which will be described later. The vertical light shielding portions of the second element separation units 20 are disposed on the side closer to the rear surface 11B than the vertical light shielding portions 12V of the second light shielding unit 12, and both the vertical light shielding portions of the second element separation units 20 and the vertical light shielding portions 12V of the second light shielding unit 12 are disposed at different positions in the depth direction in practice and are not in contact with each other although both overlap each other in a plan view.

As illustrated in FIG. 6B, the horizontal light shielding portions 12H spread in the lateral (horizontal) direction from the deepest position of the vertical light shielding portions 12V of the second light shielding unit 12. In FIG. 6B, the hatched regions are the horizontal light shielding portions 12H. As will be described later, the horizontal light shielding portions 12H have a function of reflecting light. The horizontal light shielding portions 12H are provided with opening portions 12H1 at some places. The opening portions 12H1 are provided with etching stoppers 17. As will be described later, the horizontal light shielding portions 12H are formed by forming trenches in the depth direction and the horizontal direction through wet-etching processing and filling the trenches with a light shielding member, it is possible to stop the progress of etching by providing the etching stoppers 17, and as a result, the opening portions 12H1 as illustrated in FIG. 6B are formed. In the present embodiment, utilization of the silicon substrate 11 of the plane index {111} is assumed, and the wet-etching processing is performed using, for example, an etching solution with which it is possible to perform etching of the semiconductor substrate 11 in the <110> direction, for example, an alkali aqueous solution. The etching stoppers 17 in FIG. 6B can be formed using a material that exhibits etching resistance against the alkali aqueous solution, for example, a crystal defect structure obtained by injecting an impurity element such as B (boron) or hydrogen ions, an insulator such as an oxide, or the like.

The horizontal light shielding portions 12H are located between the photoelectric conversion unit 51 and the electrical charge holding unit (MEM) 54 in the depth (Z-axis) direction as illustrated in FIG. 4A. The horizontal light shielding portions 12H are provided over the entire XY plane of the pixel array unit 111 except for the opening portions 12H1 as illustrated in FIG. 6B. Light that has been incident from the rear surface 11B and has been transmitted through the photoelectric conversion unit 51 without being absorbed by the photoelectric conversion unit 51 is reflected by the horizontal light shielding portions 12H of the second light shielding unit 12, is then incident on the photoelectric conversion unit 51 again, and contributes to photoelectric conversion. In other words, the horizontal light shielding portions 12H of the second light shielding unit 12 function as reflectors and function to curb generation of noise due to the light transmitted through the photoelectric conversion unit 51 being incident on the electrical charge holding unit (MEM) 54, improve photoelectric conversion efficiency Qe, and improve sensitivity. Also, the vertical light shielding portions 12V of the second light shielding unit 12 function to prevent generation of noise such as color mixing due to light leaking from adjacent sensor pixels 121 being incident on the photoelectric conversion unit 51.

Each horizontal light shielding portion 12H includes a pair of first surfaces S1 extending in the horizontal direction and a pair of a second surfaces S2 and third surfaces S3 extending in a direction intersecting the pair of first surfaces as illustrated in FIG. 4B. Each of the pair of first surfaces S1 is a surface along the first crystal plane 11S1 of the semiconductor substrate 11, and the first surfaces S1 face each other in the Z-axis direction. The first crystal plane 11S1 of the semiconductor substrate 11 is represented by a plane index {111}. Also, each of the pair of second surfaces S2 is a surface along the second crystal plane 11S2 of the semiconductor substrate 11. End surfaces S2 of the horizontal light shielding portion 12H along the second crystal plane 11S2 are located on both end sides of the pixel array unit 111 in the Y-axis direction although not illustrated in FIG. 6B. The second crystal plane 11S2 of the semiconductor substrate 11 is in a peripheral pixel region surrounding an effective pixel region instead of the effective pixel region. FIGS. 3, 4A, and 4B illustrate a part of the effective pixel region, and the peripheral pixel region is provided outside the effective pixel region.

The second crystal plane 11S2 of the semiconductor substrate 11 is represented by a plane index {111} and is inclined by about 19.5° with respect to the Z-axis direction. In other words, the inclination angle of the second crystal plane 11S2 with respect to the horizontal plane (XY plane) is about 70.5°. The second crystal plane 11S2 is inclined with respect to the X axis and the Y axis in the horizontal plane (XY plane) and is inclined at an angle of about 30° with respect to the Y axis, for example. Moreover, the third surface S3 is a surface that defines an outline of each opening portion 12H1 with a diamond-shaped planar shape, for example, and is a surface along the third crystal plane 11S3 of the semiconductor 11. The third crystal plane 11S3 of the semiconductor substrate 11 is inclined by about 19.5° with respect to the Z-axis direction similarly to the second crystal plane 11S2. In other words, the inclination angle of the third crystal plane 11S3 with respect to the horizontal plane (XY plane) is about 70.5°. In this manner, an Si remaining region other than the region occupied by the horizontal light shielding portions 12H in the horizontal plane that perpendicularly intersects the thickness direction has a shape along the third crystal plane 11S3, for example, and has a diamond shape in the example in FIGS. 6A and 6B.

As illustrated in FIGS. 4A and 6A, the vertical light shielding portions 12V of the second light shielding unit 12 are provided at an interval of a half pixel along the X-axis direction and extend in the Y-axis direction, and the electrical charge holding unit (MEM) 54 is disposed between two vertical light shielding portions 12V that are adjacent to each other in the X direction. Also, the horizontal light shielding portions 12H of the second light shielding unit 12 are disposed between the electrical charge holding unit (MEM) 54 and the photoelectric conversion unit 51, and the electrical charge holding unit (MEM) 54 is surrounded by the vertical light shielding portions 12V and the horizontal light shielding portions 12H. In this manner, there is no concern that light on which photoelectric conversion has not been performed by the photoelectric conversion unit 51 is incident on the electrical charge holding unit (MEM) 54, and noise can be reduced. The second light shielding unit 12 is electrically connected to a wiring unit provided on the side of the front surface 11A of the semiconductor substrate 11.

As illustrated in FIGS. 4A and 4B, the second light shielding unit 12 has a two-layer structure of an inner layer portion 12A and an outer layer portion 12B surrounding the periphery thereof. The inner layer portion 12A is made of a material containing at least one type of a single metal, a metal alloy, a metal nitride, and a metal silicide with a light shielding property, for example. More specifically, examples of the constituent material of the inner layer portion 12A include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), and a tungsten silicon compound. In particular, Al (aluminum) is the most preferable constituent material in terms of optics. Note that the inner layer portion 12A may be constituted by graphite or an organic material. The outer layer portion 12B is constituted by an insulating material such as SiOx (silicon oxide), for example. The outer layer portion 12B secures electrical insulation between the inner layer portion 12A and the semiconductor substrate 11.

(Structure of First Light Shielding Unit 13)

Figure 7A:
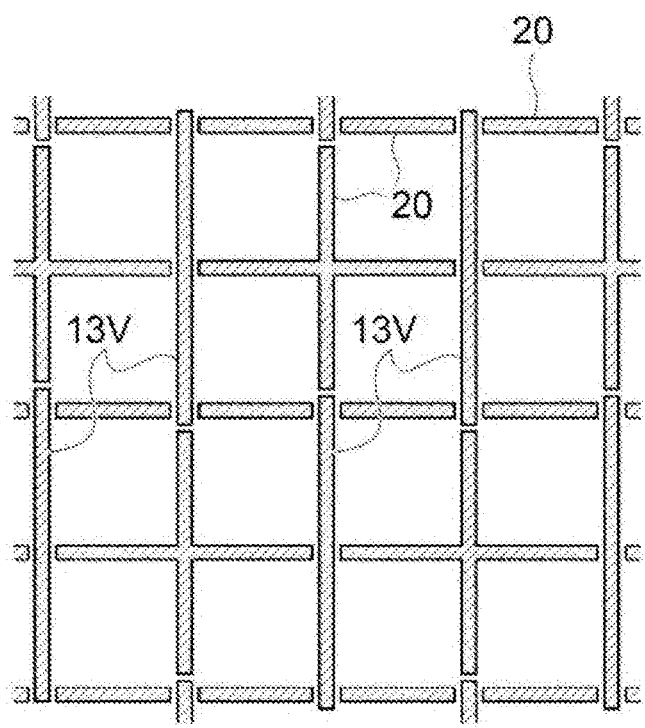
FIG. 7A is a sectional view of vertical light shielding portions of a first light shielding unit 13 and a second element separation units 20.
Figure 7A:
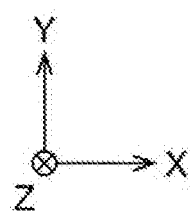
Figure 7B:
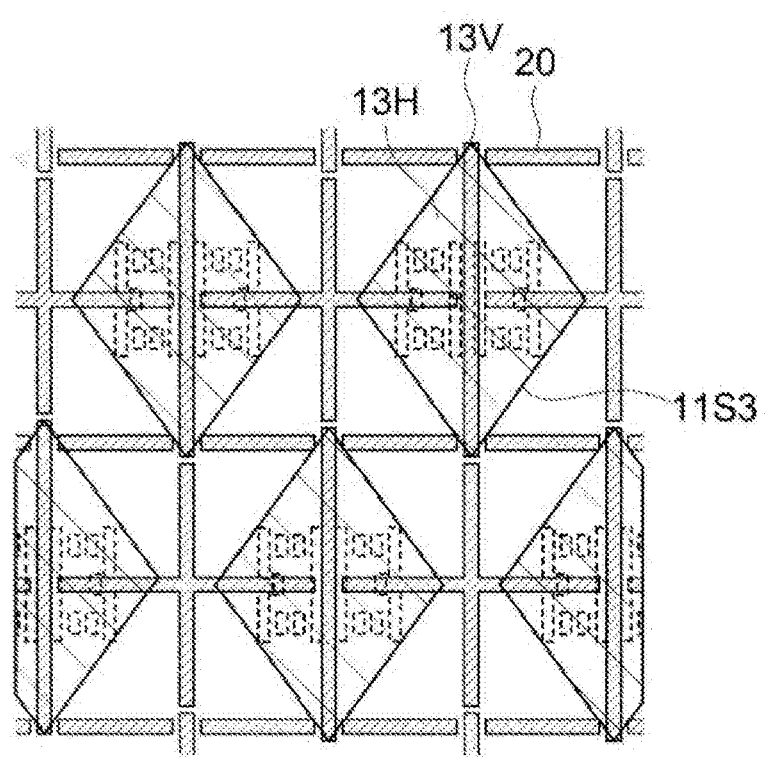
FIG. 7B is a sectional view of a horizontal light shielding portion 13H of the first light shielding unit 13.

FIG. 7A is a sectional view of the vertical light shielding portions of the first light shielding unit 13 and the second element separation units 20. FIG. 7A is a sectional view in the direction of the line E-E in FIG. 4A. FIG. 7B is a sectional view of the horizontal light shielding portion 13H of the first light shielding unit 13. FIG. 7B is a sectional view in the direction of the line F-F in FIG. 4A. As illustrated in the drawings, the second element separation units 20 are disposed along the boundary of the sensor pixels 121 and are disposed to surround the side surface of the photoelectric conversion unit 51 of each sensor pixel 121. As illustrated in FIG. 7B, the first light shielding unit 13 is disposed in a zigzag manner along the boundary of the sensor pixels 121 in the XY plane. The horizontal light shielding portion 13H horizontally extending from the vertical light shielding portion 13V of the first light shielding unit 13 has a diamond shape along the third crystal plane 11S3, for example.

The first light shielding unit 13 is formed by forming a trench along the boundary of the sensor pixels 121 from the side of the rear surface 11B of the semiconductor substrate 11, widening the trench in the horizontal direction through wet-etching processing from a bottom portion of the trench, disposing an insulating layer at the outer layer portion of the trench in the horizontal direction, and disposing a metal layer in the inner layer portion. Etching is performed in a direction along a specific crystal plane when the trench for the first light shielding unit 13 is widened in the horizontal direction through the wet-etching processing, and the etching is stopped when the third crystal plane 11S3 of the plane index {111} finally appears. Therefore, if the etching is forcibly stopped before the third crystal plane 11S3 appears, then the shape of the horizontal light shielding portion 13H of the first light shielding unit 13 may become an arbitrary shape.

Specific Examples of Planar Shape of Horizontal Light Shielding Portion 13H

FIGS. 8A, 8B, 8C, 8D, 8E, and 8F are diagrams illustrating specific examples of the planar shape of each horizontal light shielding portion 13H of the first light shielding unit 13. The planar shape of the horizontal light shielding portion 13H depends on the shape and the direction of the vertical light shielding portion 13V of the first light shielding unit 13. {111} The horizontal light shielding portion 13H illustrated in FIGS. 8A, 8B, 8C, 8D, 8E, and 8F can be formed regardless of a plane orientation of the silicon substrate 11. An arbitrary manufacturing process is also used to form the horizontal light shielding portion 13H and the vertical light shielding portion 13V illustrated in FIGS. 8A, 8B, 8C, 8D, 8E, and 8F, and various manufacturing processes can be employed as will be described later.

Figure 8A:
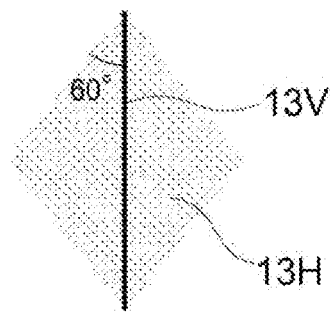
FIG. 8A is a diagram illustrating a specific example of a planar shape of the horizontal light shielding portion of the first light shielding unit.
Figure 8A:
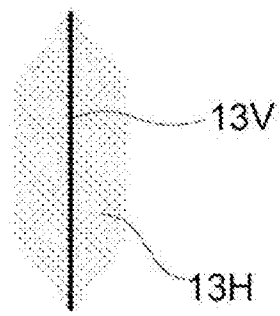
Figure 8A:
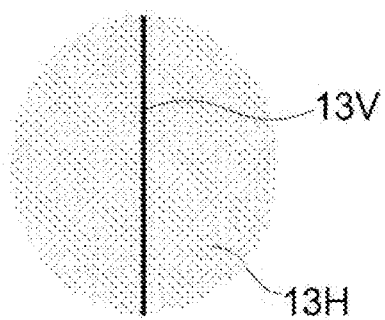
Figure 8A:
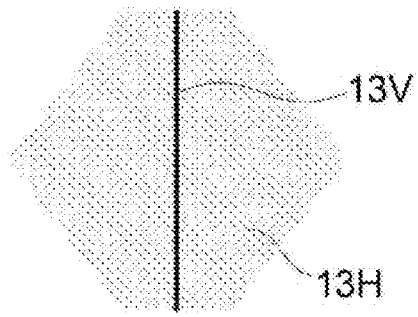

FIG. 8A illustrates an example in which the vertical light shielding portion 13V extends in one direction in the XY plane. FIG. 8A illustrates an example in which the planar shape of the horizontal light shielding portion 13H is a diamond shape. Although the plane orientation of the silicon substrate 11 as a base does not matter as described above, there is a high probability that etching finally advances until the third crystal plane 11S3 of the plane index {111} appears and the planar shape becomes a diamond shape as illustrated in (a) of FIG. 8A in a case in which the vertical light shielding portion 13V is formed in the silicon substrate 11 of the plane index {111}, for example. Note that if etching is further continued from (a) in FIG. 8A, then overetching may be achieved, and a shape that is different from the diamond shape may be obtained. Also, in a case in which the etching is forcibly stopped before the third crystal plane 11S3 appears, the etching shape at that timing becomes the final shape, and the planar shapes as in (b) of FIG. 8A, (c) of FIG. 8A, and (d) of FIG. 8A, for example, may be obtained due to the etching shapes at the timing at which the etching is forcibly stopped.

Figure 8B:
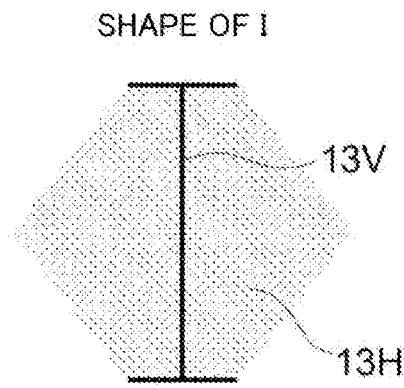
FIG. 8B is a diagram illustrating a specific example of the planar shape of the horizontal light shielding portion of the first light shielding unit, which is continuous with FIG. 8A.

FIG. 8B illustrates a planar shape of the horizontal light shielding portion in a case in which the vertical light shielding portion 13V has an I shape in a plan view. In this case, a diamond shape from which corners at two facing apexes are removed can be obtained as illustrated in FIG. 8B. Although FIG. 8B illustrates an example in which etching is continued until the third crystal plane 11S3 appears, a planar shape that is different from that in FIG. 8B may be obtained depending on how long the etching time is.

Figure 8C:
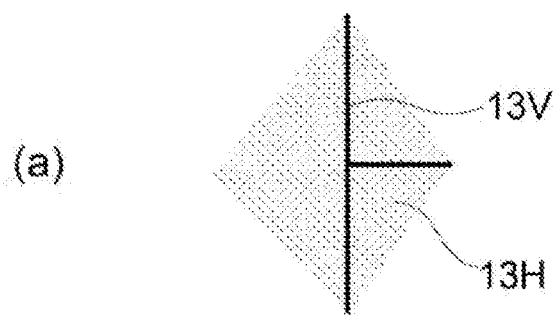
FIG. 8C is a diagram illustrating a specific example of the planar shape of the horizontal light shielding portion of the first light shielding unit, which is continuous with FIG. 8B.
Figure 8C:
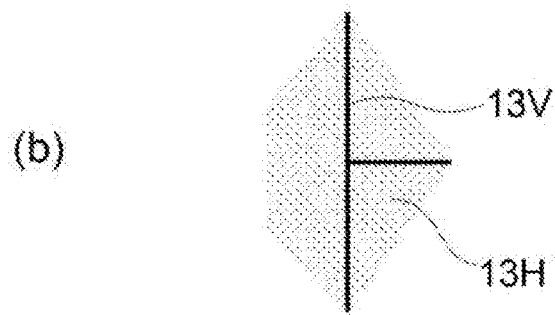

FIG. 8C illustrates a planar shape of the horizontal light shielding portion 13H in a case in which the vertical light shielding portion 13V has a shape of "T" put down on its side in a plan view. Although the horizontal light shielding portion 13H in his case may finally have a planar shape in which end portions of the vertical light shielding portion 13V become corner portions as illustrated in (a) in FIG. 8C, the shape as in (b) in FIG. 8C may be obtained, or another planar shape may be obtained, if the etching is forcibly stopped in the middle.

Figure 8D:
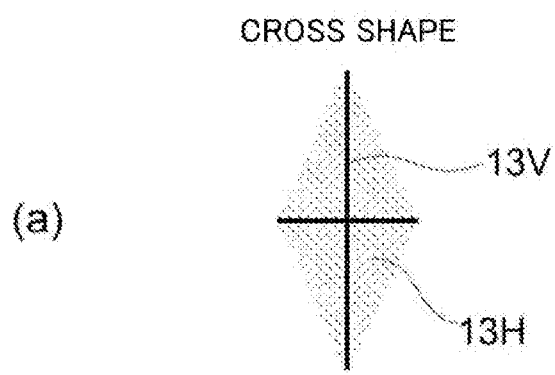
FIG. 8D is a diagram illustrating a specific example of the planar shape of the horizontal light shielding portion of the first light shielding unit, which is continuous with FIG. 8C.
Figure 8D:
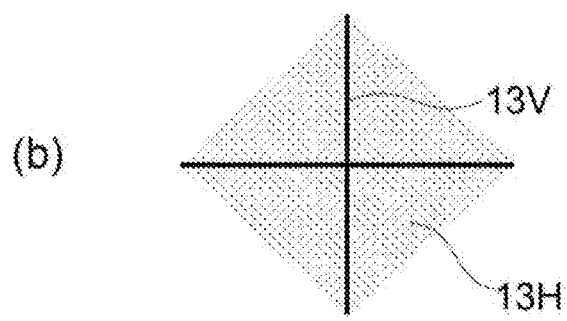

FIG. 8D illustrates a planar shape of the horizontal light shielding portion 13H in a case in which the vertical light shielding portion 13V has a cross shape in a plan view. The etching advances such that the end portions of the vertical light shielding portion 13V become corner portions in this case as well, and the diamond shape as in (a) of FIG. 8D or (b) of FIG. 8D is finally obtained. However, a different shape may be obtained in a case in which the etching is forcibly stopped in the middle or in a case in which overetching is performed.

Figure 8E:
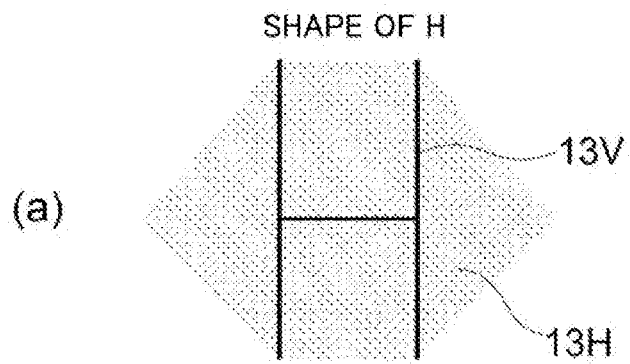
FIG. 8E is a diagram illustrating a specific example of the planar shape of the horizontal light shielding portion of the first light shielding unit, which is continuous with FIG. 8D.

FIG. 8E illustrates a planar shape of the horizontal light shielding portion 13H in a case in which the vertical light shielding portion 13V has an H shape in a plan view. The etching advances such that the end portions of the vertical light shielding portion 13V become corner portions in this case as well, and a polygonal shape as in (a) of FIG. 8E or (b) of FIG. 8E may be finally obtained. However, a different shape may be obtained in a case in which the etching is forcibly stopped in the middle or in a case in which overetching is performed.

Figure 8F:
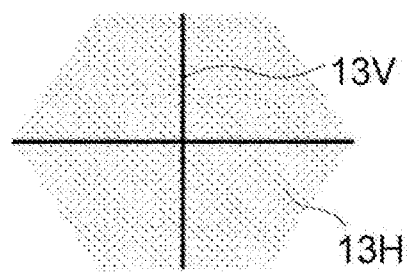
FIG. 8F is a diagram illustrating a specific example of the planar shape of the horizontal light shielding portion of the first light shielding unit, which is continuous with FIG. 8E.

FIG. 8F illustrates a planar shape of the horizontal light shielding portion 13H in a case in which the vertical light shielding portion 13V has an H shape in a plan view. FIG. 8F illustrates an example in which the horizontal light shielding portion 13H with a hexagonal shape is formed by etching advancing in the horizontal plane direction from one end portion of the vertical light shielding portion 13V with a cross planar shape. Note that the planar shape of the horizontal light shielding portion 13H obtained from the cross-shaped vertical light shielding portion 13V may be a polygonal shape other than a quadrangular shape or a hexagonal shape.

Although FIGS. 8A, 8B, 8O, 8D, 8E, and 8F illustrate an example in which the horizontal light shielding portion 13H spreads in the horizontal direction from one end portion of the vertical light shielding portion 13V, there may also be a case in which the end portions of the vertical light shielding portion 13V and the horizontal light shielding portion 13H do not completely match each other in a plan view from a normal line direction of the substrate surface.

Figure 9A:
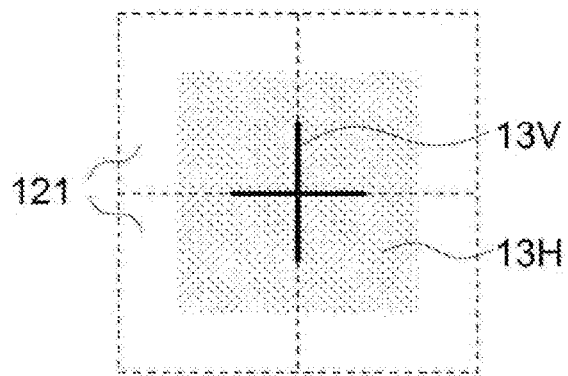
FIG. 9A is a diagram illustrating an example in which the planar shape of the horizontal light shielding portion is larger than the planar shape of the vertical light shielding portion.
Figure 9B:
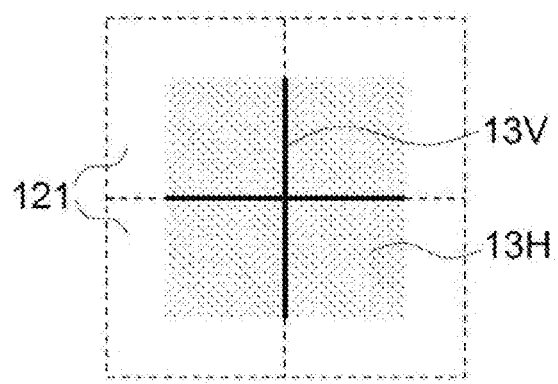
FIG. 9B is a diagram illustrating an example in which the planar shape of the vertical light shielding portion conforms to the planar shape of the horizontal light shielding portion.
Figure 9C:
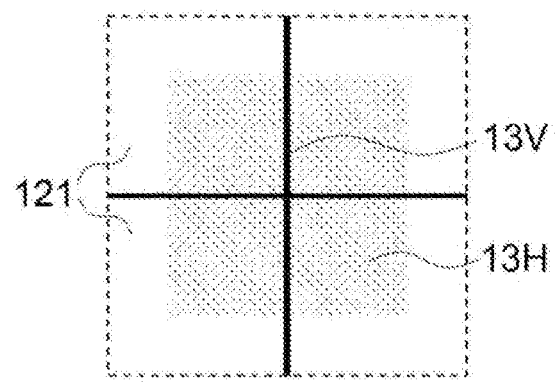
FIG. 9C is a diagram illustrating an example in which the planar shape of the horizontal light shielding portion is smaller than the planar shape of the vertical light shielding portion.

FIG. 9A is a diagram illustrating an example in which the planar shape of the horizontal light shielding portion 13H is larger than the planar shape of the vertical light shielding portion 13V, FIG. 9B is a diagram illustrating an example in which the planar shape of the vertical light shielding portion 13V conform to the planar shape of the horizontal light shielding portion 13H, and FIG. 9C is a diagram illustrating an example in which the planar shape of the horizontal light shielding portion 13H is smaller than the planar shape of the vertical light shielding portion 13V.

In order to form the horizontal light shielding portion 13H and the vertical light shielding portion 13V in FIGS. 9A, 9B, and 9C, the trench for the vertical light shielding portion 13V may be formed first, the trench for the horizontal light shielding portion 13H may be formed through wet-etching using the trench, and the trench may be filled with a light shielding material, or alternatively, a hollow for the horizontal light shielding portion 13H may be formed first, a trench for the vertical light shielding portion 13V may then be formed, and the trench and the hollow may be filled with a light shielding material as will be described later.

The regions surrounded by the dashed lines in FIGS. 9A, 9B, and 9C are regions of unit pixels 121. FIGS. 9A, 9B, and 9C illustrate an example in which the horizontal light shielding portion 13H is disposed across four adjacent pixels. Although the white region where the horizontal light shielding portion 13H is not disposed within each pixel is a region where charge generated through the photoelectric conversion is transferred, the horizontal light shielding portion 12H is disposed at a distance from the horizontal light shielding portion 13H in a paper depth direction (the substrate depth direction) in the white region. The gap between the horizontal light shielding portion 13H and the horizontal light shielding portion 12H serves as an electrical charge transfer path.

Figure 10:
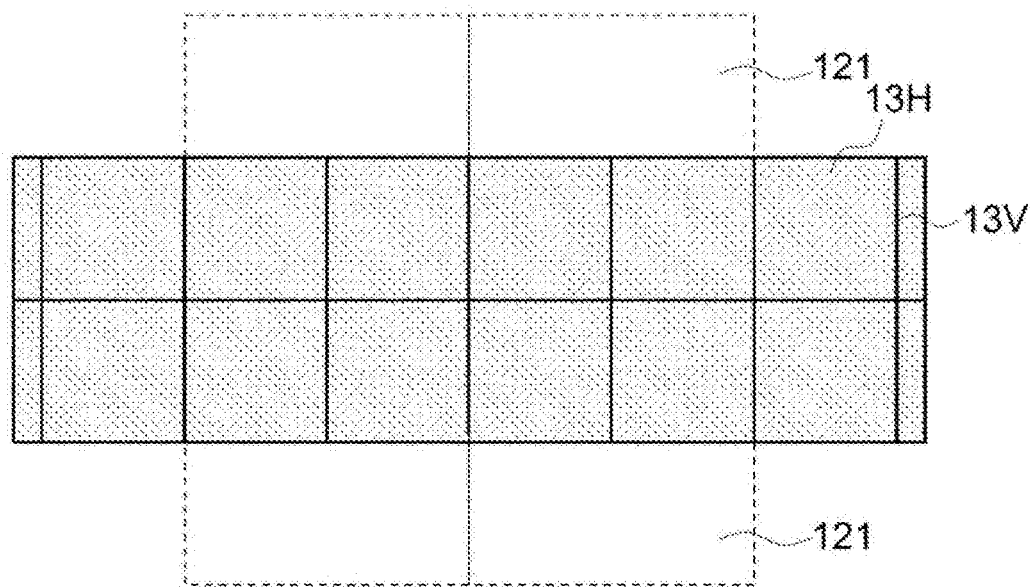
FIG. 10 is a diagram for explaining an electrical charge transfer path.

FIG. 10 is a diagram for explaining an electrical charge transfer path. Each region surrounded by the dashed line in FIG. 10 is a region of the unit pixel 121, and the horizontal light shielding portion 13H is disposed to overlap a part of the region of the unit pixel 121. FIG. 10 illustrates an example in which the horizontal light shielding portion 13H with a rectangular shape is disposed along one end portion of the vertical light shielding portion 13V with a cross planar shape. In practice, the planar shape of the vertical light shielding portion 13V can be various shapes as illustrated in FIGS. 8A, 8B, 8C, 8D, 8E, and 8F. Although the white region in FIG. 10 is an electrical charge transfer path, the horizontal light shielding portion 12H is disposed in at least a part of the white region as described in FIGS. 9A, 9B, and 9C as well, and the electrical charge generated through the photoelectric conversion is thus guided to the vertical gate electrode 52V through the gap between the horizontal light shielding portion 13H illustrated in FIG. 10 and the horizontal light shielding portion 12H disposed in the paper depth direction.

Figure 11:
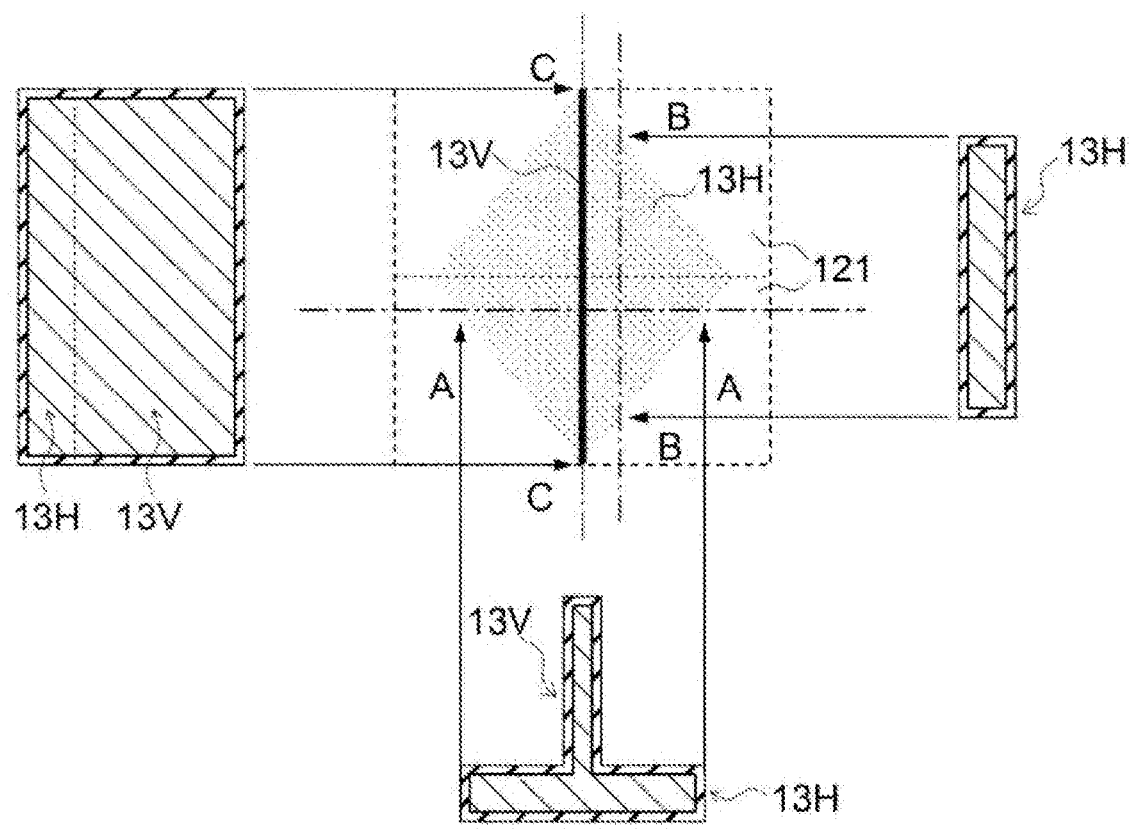
FIG. 11 is a diagram illustrating sectional shapes at three locations of the horizontal light shielding portion constituting the first light shielding unit.

Although FIGS. 4A, 4B, and 5 illustrate an example in which the sectional shape of the first light shielding unit 13 is a T shape, the sectional shape of the first light shielding unit 13 may change depending on a location from which the section of the first light shielding unit 13 is obtained. FIG. 11 is a diagram illustrating sectional shapes at three locations of the horizontal light shielding portion 13H constituting the first light shielding unit 13. The sectional shape along the line A-A in FIG. 11 is a T shape, the sectional shape along the line B-B is a thin and long rectangular shape corresponding to the thickness of the horizontal light shielding portion 13H, and the sectional shape along the line C-C is a rectangular shape corresponding to a sum of the thickness of the horizontal light shielding portion 13H and the thickness of the vertical light shielding portion 13V.

In this manner, the sectional shape of the first light shielding unit 13 changes in a plurality of ways depending on what position of the first light shielding unit 13 the section is obtained, and the sectional shape of the first light shielding unit 13 is a T shape in a case in which the section is obtained at a specific location of the first light shielding unit 13.

First Example of Process for Manufacturing Imaging Apparatus 101

Next, a first example of a process for manufacturing the imaging apparatus 101 will be described. FIGS. 12A, 12B, 12C, 12D, 12E, 12F, 12G, 12H, 12I, 12J, 12K, 12L, 12M, 12N, 12O, 12P, 12Q, 12R, and 12S are process sectional views illustrating the first example of the process for manufacturing the imaging apparatus 101 according to the first embodiment. Note that processes for forming the second light shielding unit 12 and the first light shielding unit 13 will be mainly described below and processes for forming the reading circuit 120 and the like will be omitted.

Figure 12A:
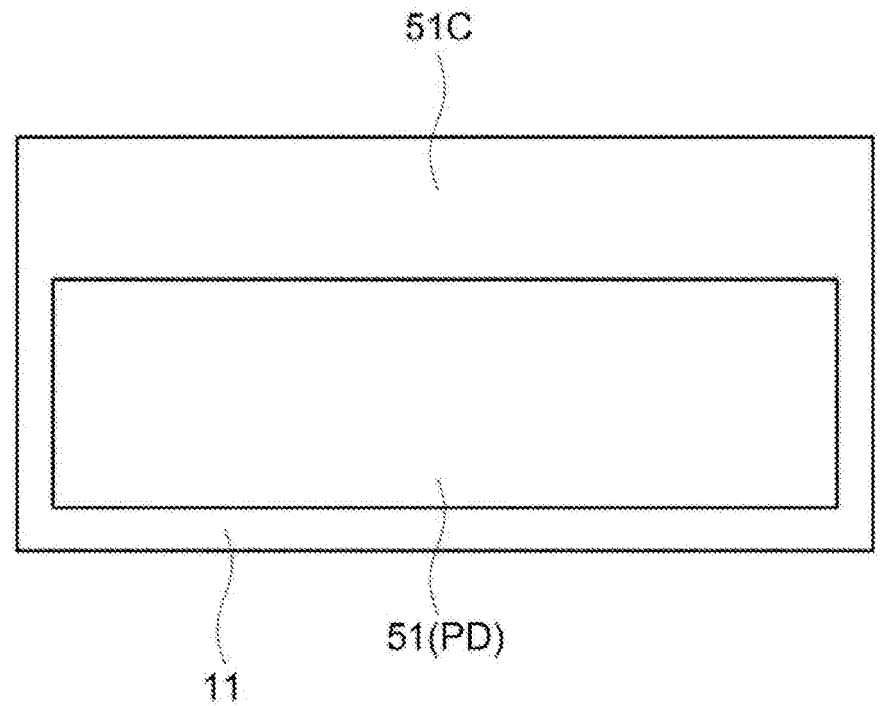
FIG. 12A is a process diagram illustrating a method of manufacturing an imaging apparatus 101 according to a first embodiment.
Figure 12B:
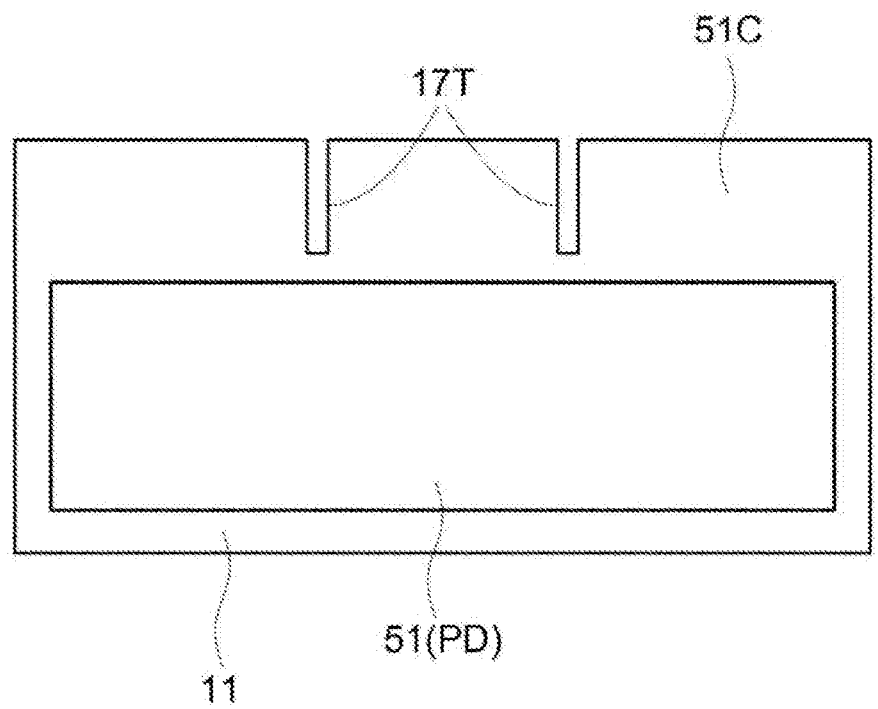
FIG. 12B is a process diagram, which is continuous with FIG. 12A.

First, the silicon substrate 11 of the plane index {111} as illustrated in FIG. 12B is prepared. The photoelectric conversion unit 51 constituted by the photodiode PD is formed on the silicon substrate 11. The photoelectric conversion unit 51 has a structure in which an N⁻-type semiconductor region 51A, an N-type semiconductor region 51B, and a P-type semiconductor region 51C are laminated as illustrated in FIG. 4A, for example.

Next, a trench 17T is formed in accordance with the position of the etching stopper 17 used when the horizontal light shielding portion 12H of the second light shielding unit 12 is formed as illustrated in FIG. 12B. The trench 17T is formed by dry-etching using a hard mask, for example. The hard mask is made of an insulating material such as SiN (silicon nitride) or SiO₂ (silicon oxide).

Figure 12C:
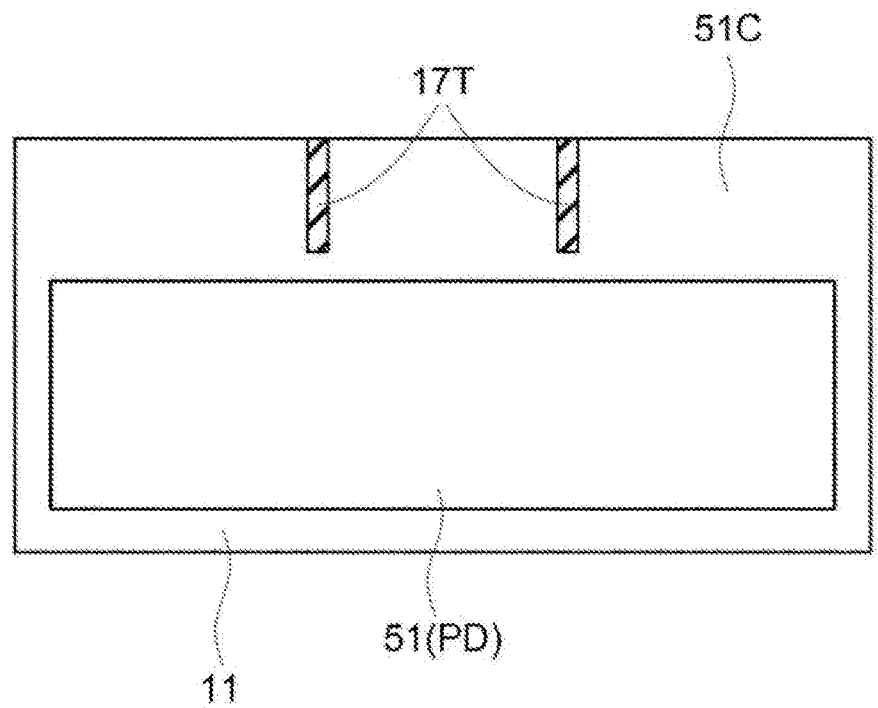
FIG. 12C is a process diagram, which is continuous with FIG. 12B.
Figure 12D:
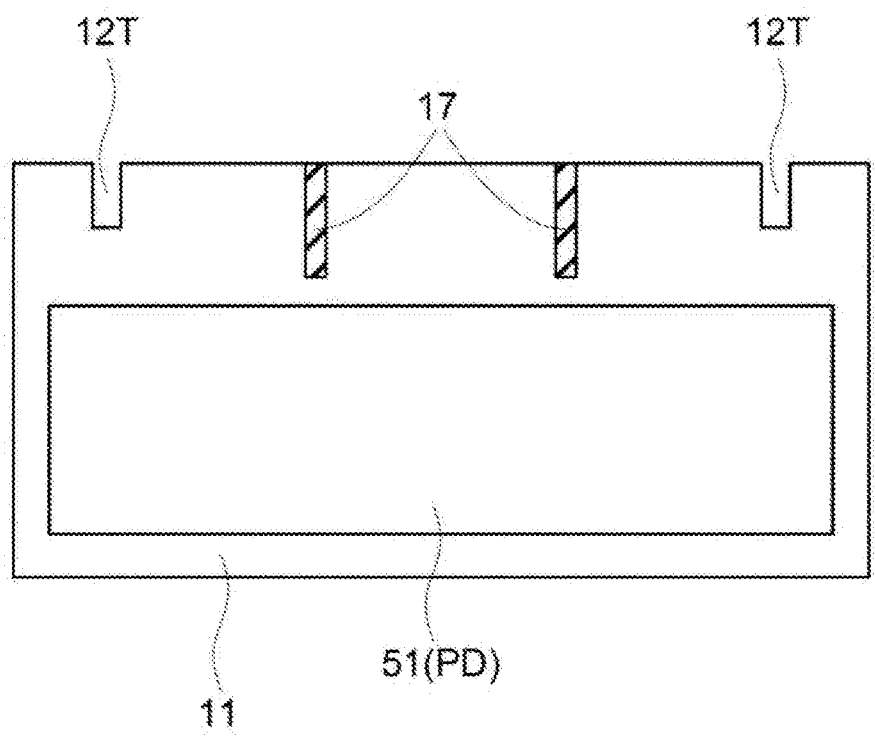
FIG. 12D is a process diagram, which is continuous with FIG. 12C.

Next, the inside of the trench 17T is filled with a crystal defect structure obtained by injecting an impurity element such as B (boron), for example, or hydrogen ions or an insulator such as an oxide to form the etching stopper 17, as illustrated in FIG. 12C. Next, the trench 12T is formed in accordance with the position of the vertical light shielding portion 12V of the second light shielding unit 12 through dry-etching or the like using a hard mask as illustrated in FIG. 12D.

Figure 12E:
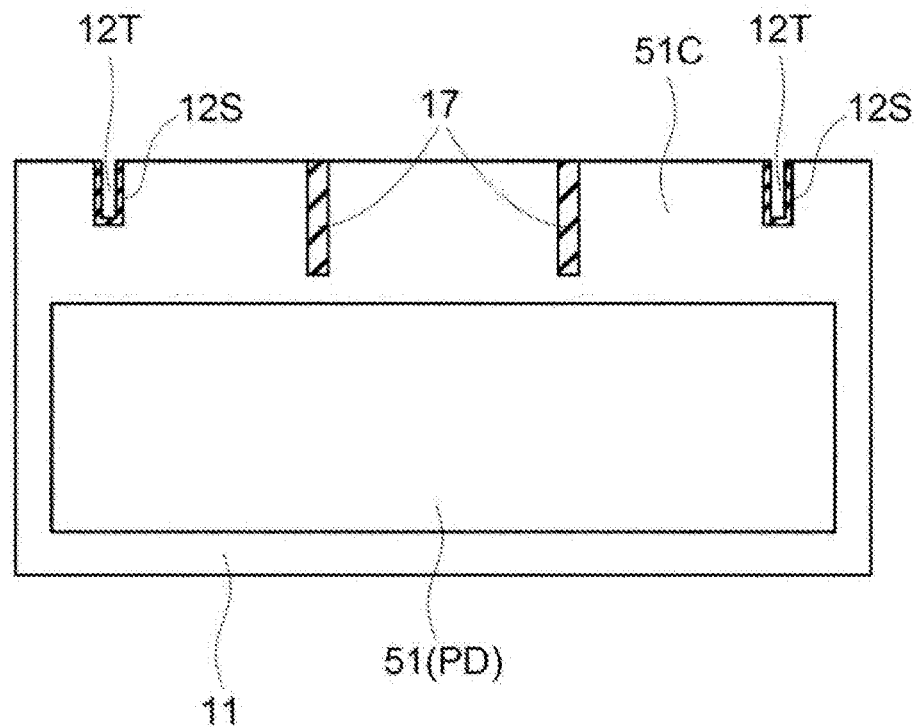
FIG. 12E is a process diagram, which is continuous with FIG. 12D.
Figure 12F:
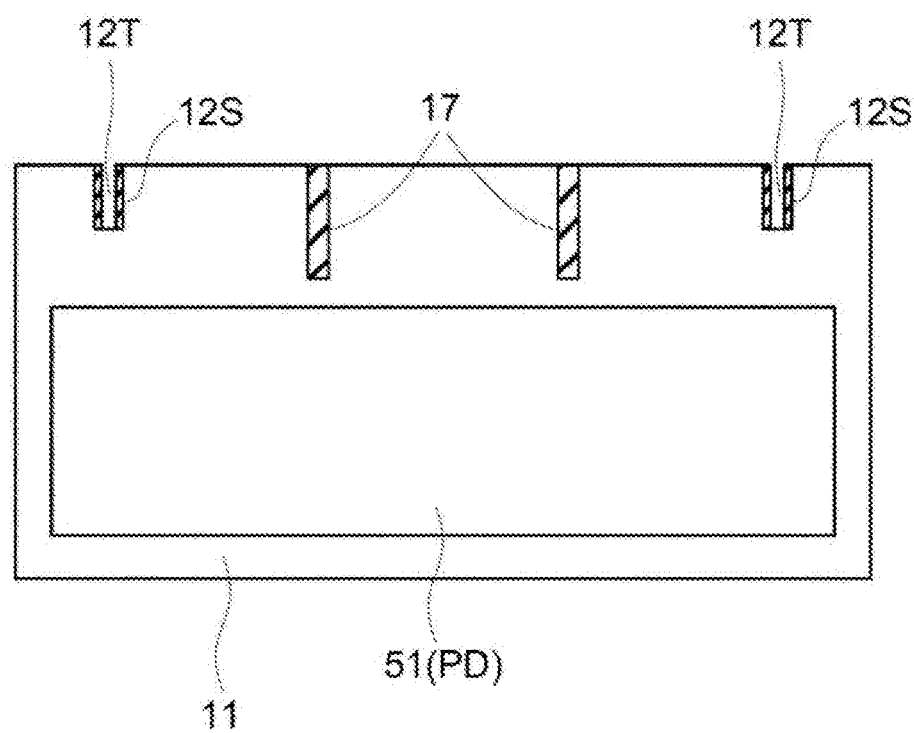
FIG. 12F is a process diagram, which is continuous with FIG. 12E.

Next, a side wall 12S is formed to cover the side surface and the bottom surface of the trench 12T as illustrated in FIG. 12E. The side wall 12S is formed of an insulating film made of SiN or SiO₂, for example. Next, the insulating film at the bottom surface is removed with the insulating film at the side surface portion of the trench 12T left through dry etching, for example, as illustrated in FIG. 12F. At this time, it is desirable to use a constituent material of the side wall 12S that is different from the constituent material of the hard mask in order to cause the hard mask that selectively covers the front surface 11A of the silicon substrate 11 to be left without being removed through the dry etching.

Figure 12G:
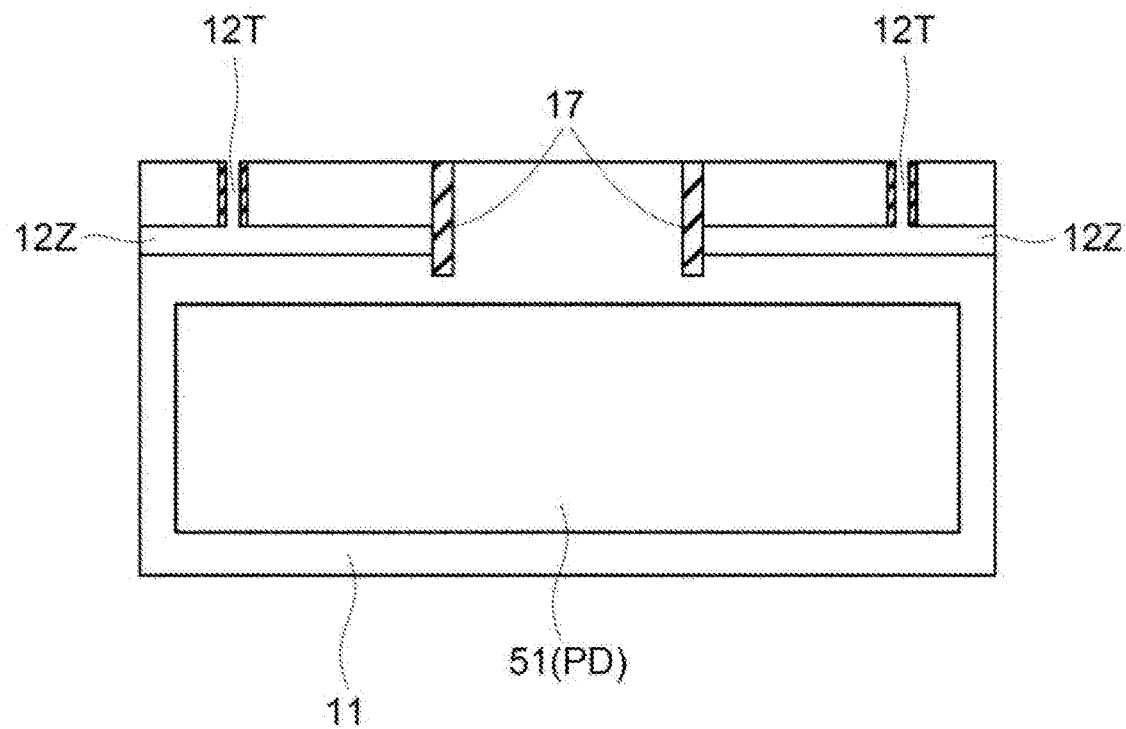
FIG. 12G is a process diagram, which is continuous with FIG. 12F.

Next, a predetermined alkali aqueous solution is injected to the trench 12T, and wet etching is performed thereon, thereby partially removing the silicon substrate 11 as illustrated in FIG. 12G. As the alkali aqueous solution, it is possible to apply KOH, NaOH, CsOH, or the like as an inorganic solution, and it is possible to apply an aqueous solution of ethylene diamine pyrocatechol (EDP), N2H4 (hydradine), NH4OH (ammonium hydroxide), or tetramethyl ammonium hydroxide (TMAH) or the like as an organic solution.

Here, crystal anisotropy etching using a characteristic that etching rates differ depending on plane orientations of Si{111} is performed. Specifically, the etching rate in the <110> direction is sufficiently high relative to the etching rate in the <111> direction in the silicon {111} substrate. Therefore, etching advances in the X-axis direction while etching hardly advances in the Y-axis direction and the Z-axis direction in the present embodiment. As a result, a space 12Z that communicates with the trench 12T surrounded by the first crystal plane 11S1, the second crystal plane 11S2, and the third crystal plane 11S3 is formed inside the semiconductor substrate 11 that is a silicon {111} substrate.

Note that the advancing distance of the etching in the <110> direction can be adjusted by a processing time of the etching performed on the semiconductor substrate 11 by using the alkali aqueous solution. However, it is possible to easily control the advancing of the etching in the <110> direction and to precisely secure the region where Si{111} is left, by providing the etching stoppers 17 at predetermined positions in advance as in the present embodiment. The advancing of the etching in the <110> direction is stopped by the etching stoppers 17, and as a result, the second and third crystal planes 11S2 and 11S3 spreading from one etching stopper 17 as a base point and represented by the plane index {111} are formed (see FIG. 4B).

Figure 6C:
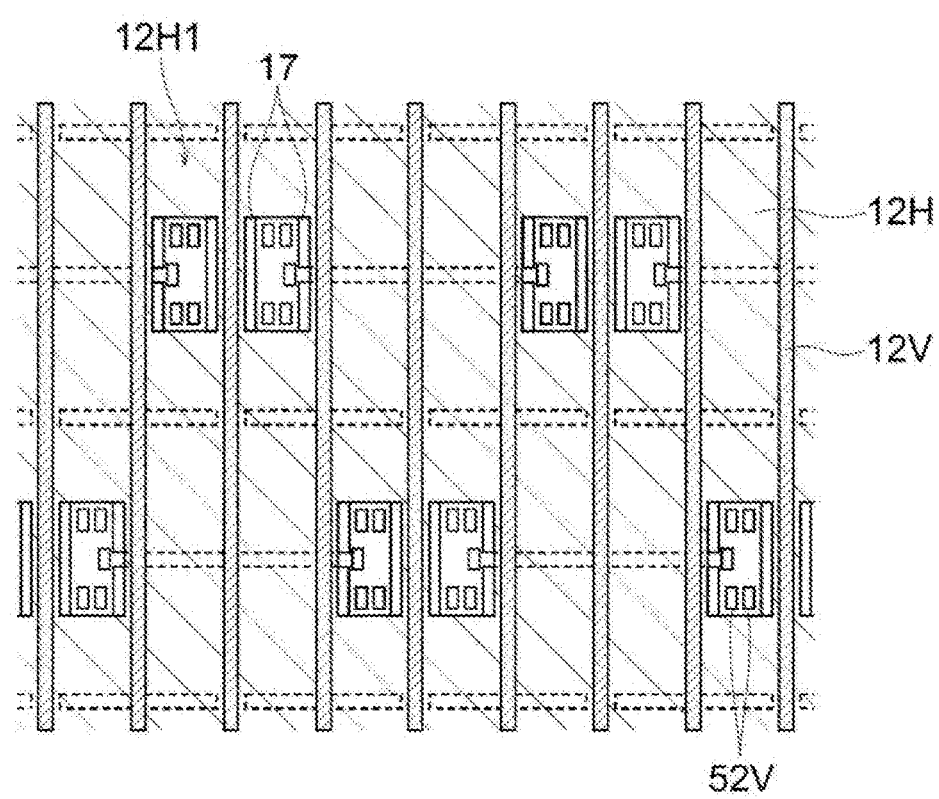
FIG. 6C is a final plan view of the horizontal light shielding portions 12H of the second light shielding unit 12.

Note that FIG. 6B illustrates a state in which the second crystal plane 11S2 and the third crystal plane 11S3 spreading from two etching stoppers 17 as base points form a diamond shape in a plan view. The diamond-shaped region surrounded by the second crystal plane 11S2 and the third crystal plane 11S3 is the Si remaining region, which is surrounded by the horizontal light shielding portions 12H of the light shielding unit 12, in which Si {111} remains. Note that if the etching further advances from FIG. 6B, then opening portions with a rectangular shape as in FIG. 6C are finally formed.

After the space 12Z extending in the horizontal direction is formed, the hard mask HM and the side wall 12S are removed through wet etching, for example. Note that the hard mask HM and the side wall 12S can be removed through isotropic dry etching in some cases. In the wet etching, it is desirable to use a chemical containing hydrofluoric acid (HF) such as dilute hydrofluoric acid (DHF) or buffered hydrofluoric acid (BHF), for example, in a case in which the hard mask HM and the like are made of SiO2. Alternatively, it is desirable to use a chemical containing a hot phosphoric acid or HF in a case in which the hard mask HM and the like are made of SiN. Note that the hard mask HM and the side wall 12S may not be removed.

Figure 12H:
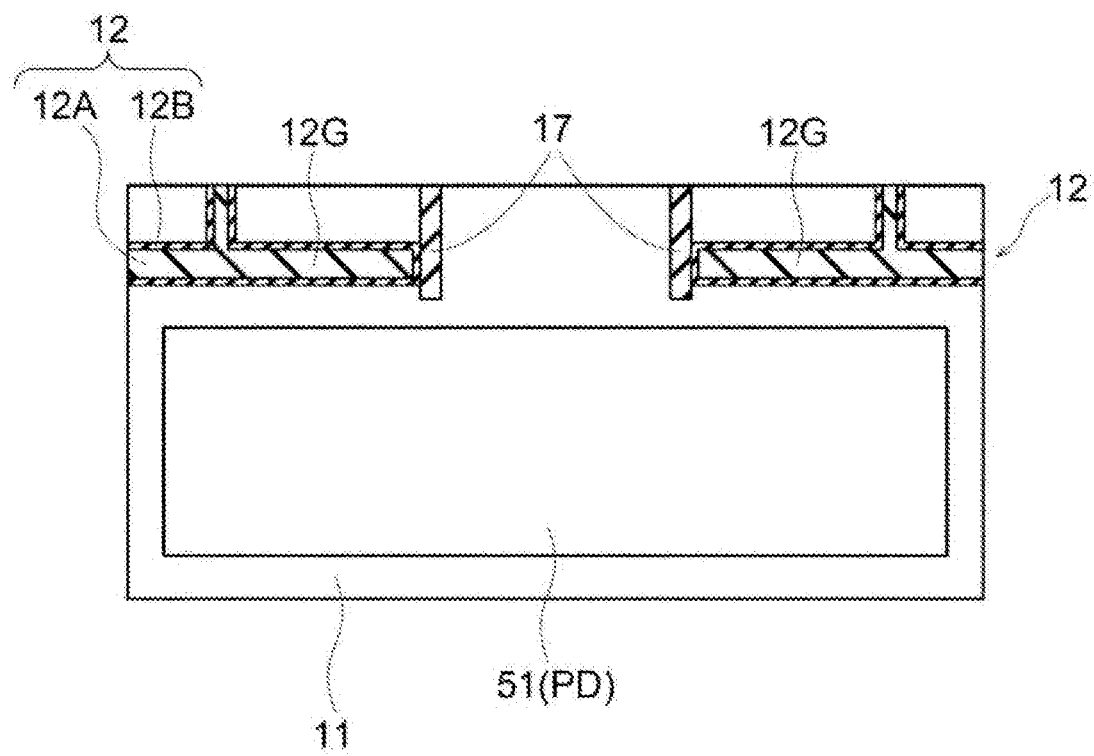
FIG. 12H is a process diagram, which is continuous with FIG. 12G.

Next, as illustrated in FIG. 12H, the outer layer portion 12B is formed using an insulating material or the like to cover the side surface 12TA of the trench 12T, the inner surface of the space 12Z, and the front surface 11A of the semiconductor substrate 11, and the inside of the outer layer portion 12B is filled with the inner layer portion 12A to fill the trench 12T and the space 12Z. In this manner, the second light shielding unit 12 including the vertical light shielding portions 12V that occupy the trench 12T and the horizontal light shielding portions 12H that occupy the space 12Z is formed. Note in order to fill the space 12Z without any gaps, it is desirable that the width of the trench 12T (the dimension in the X-axis direction) is wider than the thickness of the space 12Z (the dimension in the Z-axis direction). Also, in a case in which the inner layer portion 12A is filled with the aforementioned metal material in this stage, it is difficult to perform the following processing at a high temperature. Thus, it is desirable that the trench 12T and the space 12Z be temporarily filled with a temporarily filling material 12G with relatively excellent heat resistance, such as SiO2, SiN, or polysilicon, the following process at a high temperature be ended, the process for forming the second element separation units 20, for example, be then ended, and the replacement with a predetermined metal material be performed. FIG. 12H illustrates an example in which the temporarily embedding material such as SiO2 is formed at the inner layer portions of the trench and the space.

Note that the filling of the trench 12T may be performed through solid phase diffusion. More specifically, an insulating layer such as an SiO2 film containing P (phosphorus) that is an N-type impurity element, for example, is formed to cover the inner surface of the trench and the inner surface of the space. Next, P (phosphorus) contained in the insulating layer is solid-phase diffused to the inner surface of the trench and the inner surface of the space in the semiconductor substrate 11 through a heat treatment. Thereafter, the insulating layer is removed, the heat treatment is then performed again, and P (phosphorus) is diffused to the inside of the semiconductor substrate 11, thereby to form an N-type region. Next, an insulating layer such as an SiO2 film containing B (boron) that is a P-type impurity element is formed to cover the N-type region. Thereafter, B (boron) contained in the insulating layer is solid-phase diffused toward the inner surface of the trench and the inner surface of the space through a heat treatment. In this manner, a solid phase diffusion layer in which a P-type region is disposed inside the N-type region is obtained.

Figure 12I:
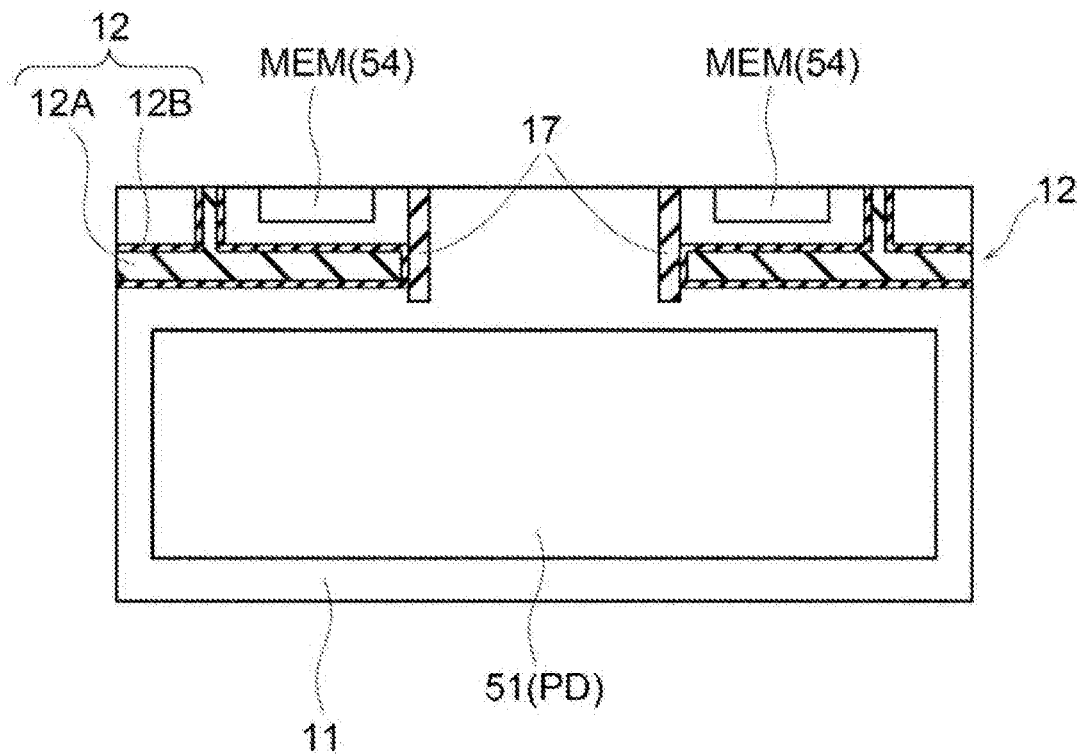
FIG. 12I is a process diagram, which is continuous with FIG. 12H.

Next, an N-type semiconductor region 54 that functions as the electrical charge holding unit (MEM) 54 is formed on the side of the front surface 11A of the semiconductor substrate 11 made of Si{111} as illustrated in FIG. 12I. Along with the formation of the electrical charge holding unit (MEM) 54, an N-type semiconductor region that functions as a floating diffusion is also formed.

Figure 12J:
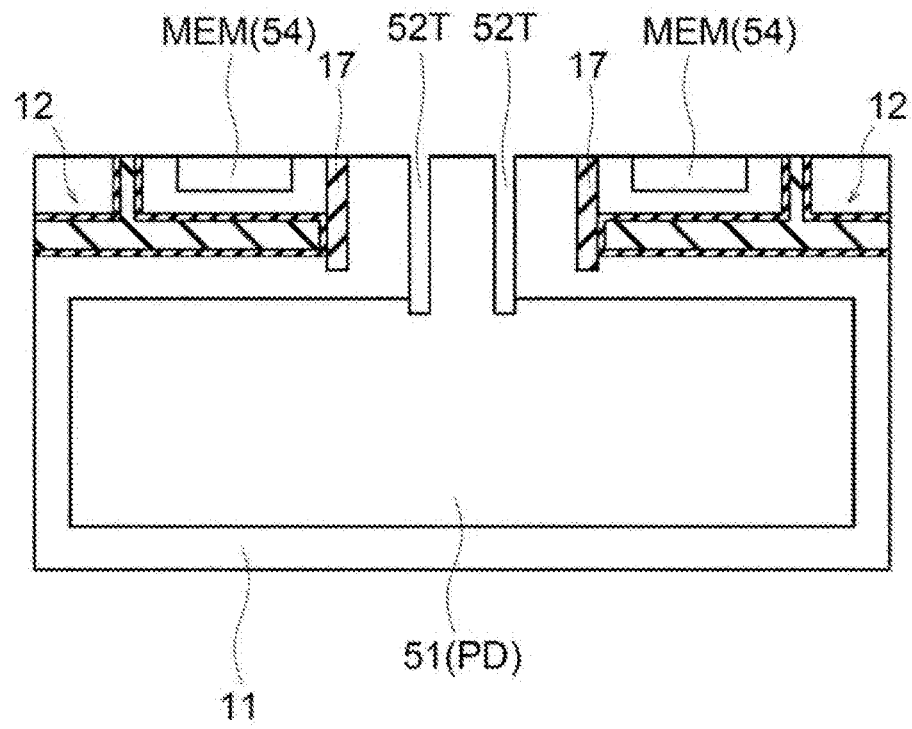
FIG. 12J is a process diagram, which is continuous with FIG. 12I.
Figure 12K:
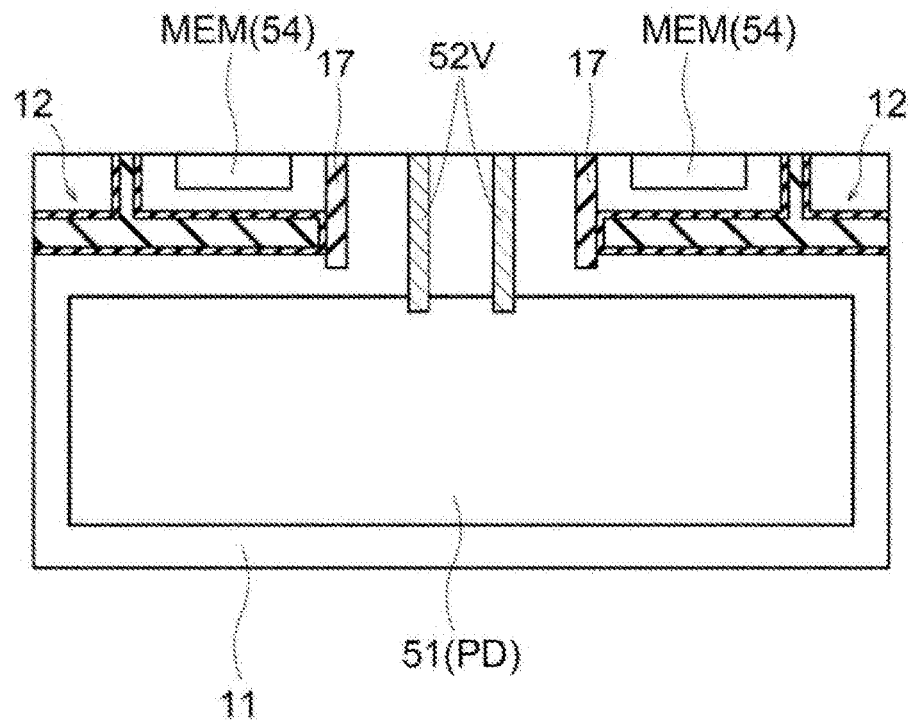
FIG. 12K is a process diagram, which is continuous with FIG. 12J.

Next, a trench 52T is formed in accordance with the position of the vertical gate electrode 52V as illustrated in FIG. 12J. The method for forming the trench 52T is similar to that of the trench 12T for the second light shielding unit 12 described above. Next, the vertical gate electrode 52V is formed by filling the trench 52T with polysilicon, for example, as illustrated in FIG. 12K.

Figure 12L:
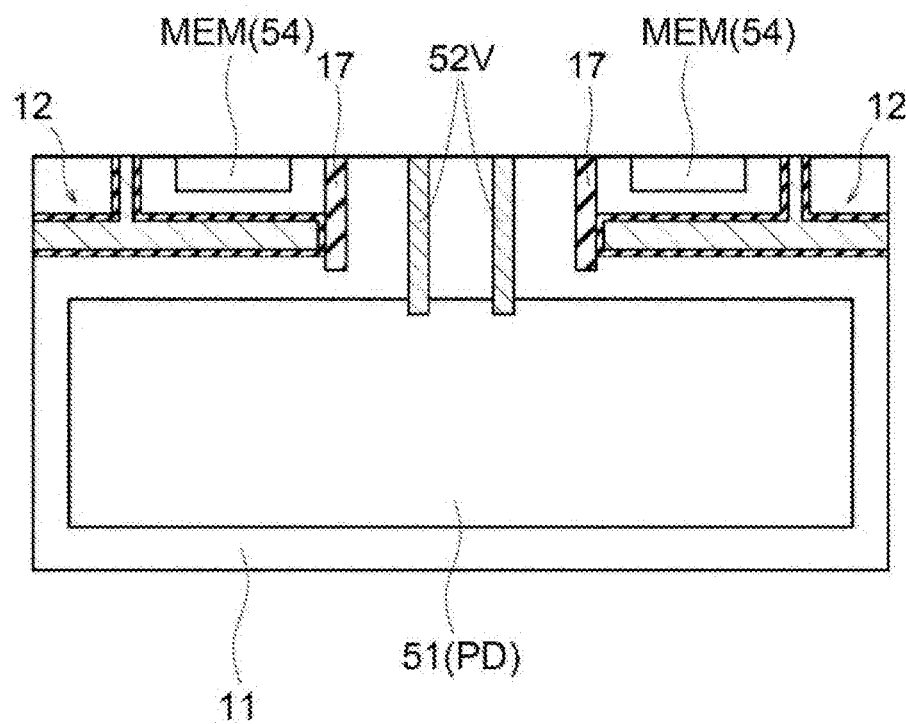
FIG. 12L is a process diagram, which is continuous with FIG. 12K.

Then, the insulator or the like that is the inner layer portion 12A of the trench 12T and the space 12Z in the second light shielding unit 12 is replaced with a metal material to form the second light shielding unit 12 as illustrated in FIG. 12L. The metal material of the inner layer portion 12A includes a material containing at least one type of a single metal, a metal alloy, a metal nitride and metal silicide with a light shielding property.

Figure 12M:
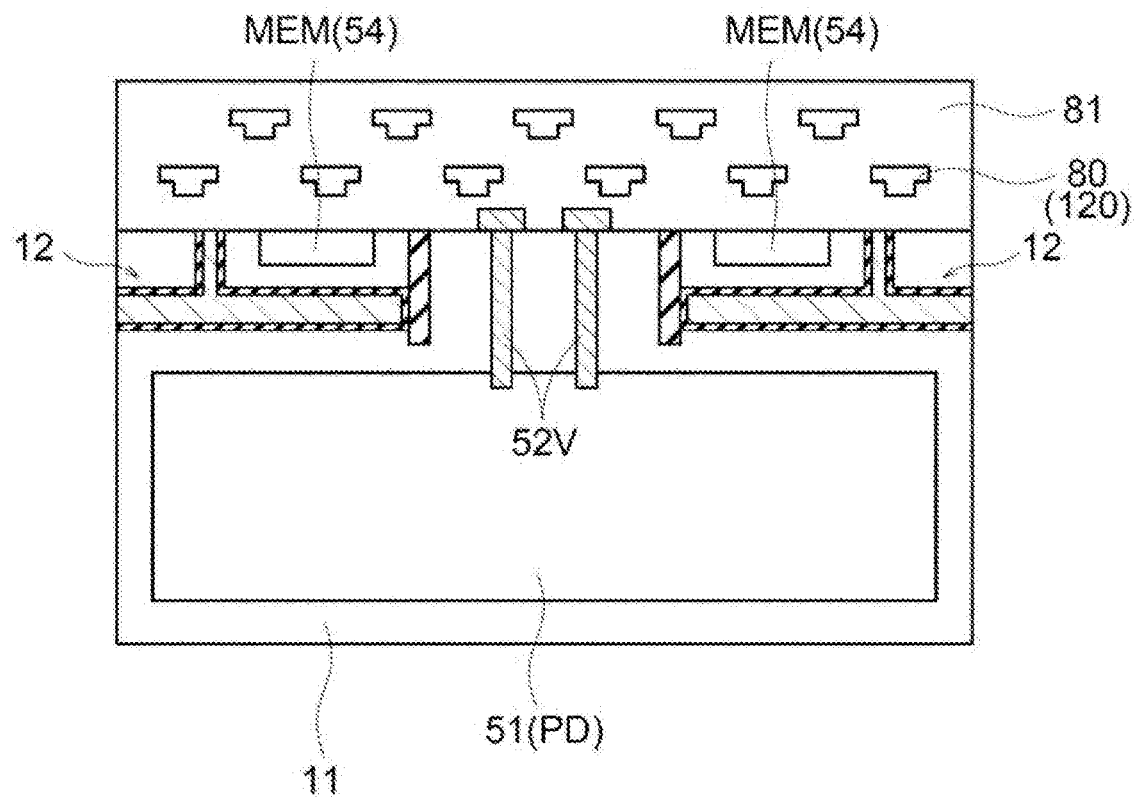
FIG. 12M is a process diagram, which is continuous with FIG. 12L.

Next, the reading circuit 120 and the wiring layer 80 are formed on the side of the front surface 11A of the semiconductor substrate 11 as illustrated in FIG. 12M. The reading circuit 120 may be formed on another semiconductor substrate 11, and the semiconductor substrates 11 may be attached to each other.

Figure 12N:
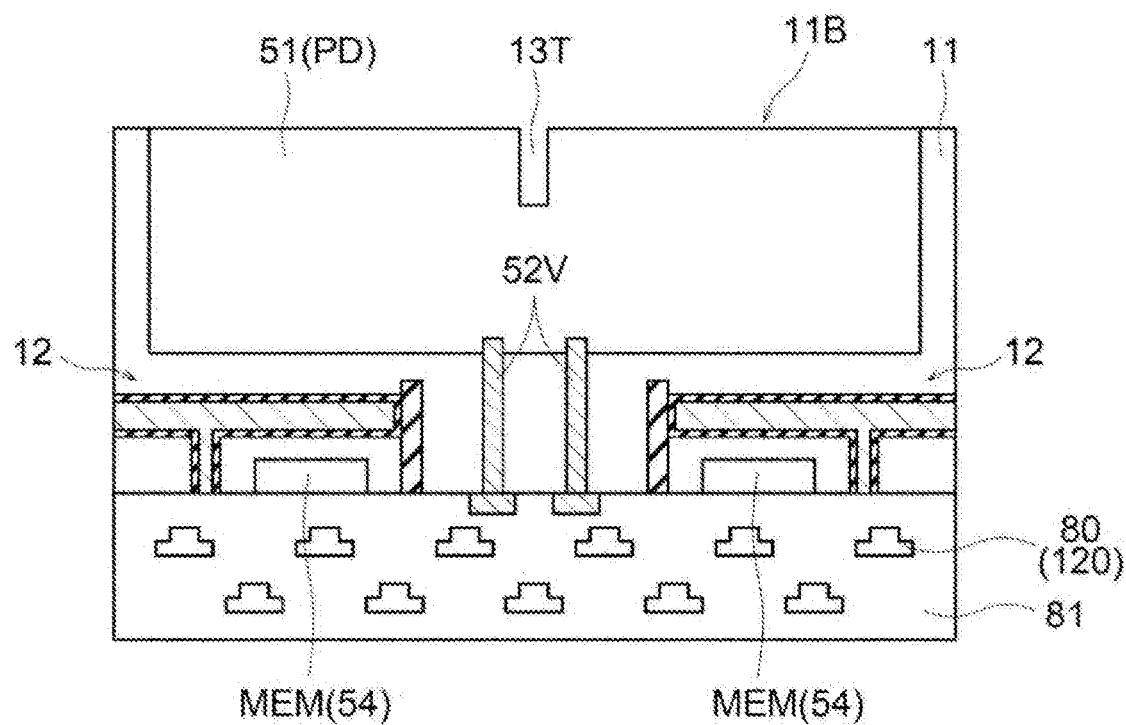
FIG. 12N is a process diagram, which is continuous with FIG. 12M.
Figure 12O:
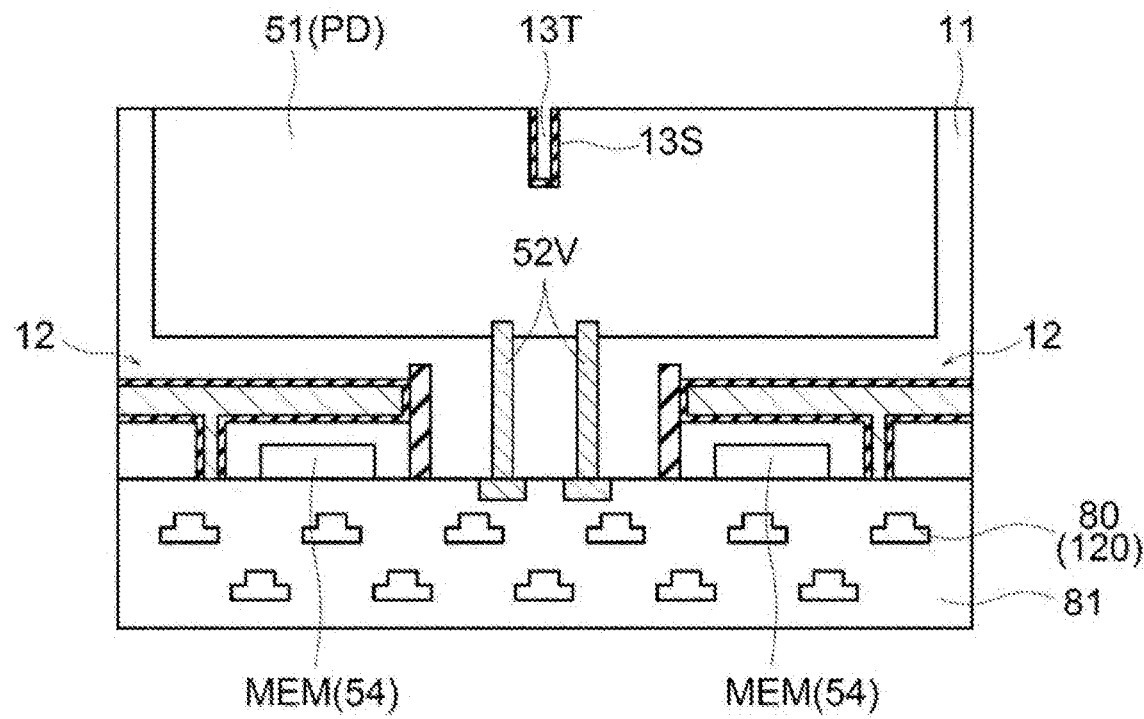
FIG. 12O is a process diagram, which is continuous with FIG. 12N.
Figure 12P:
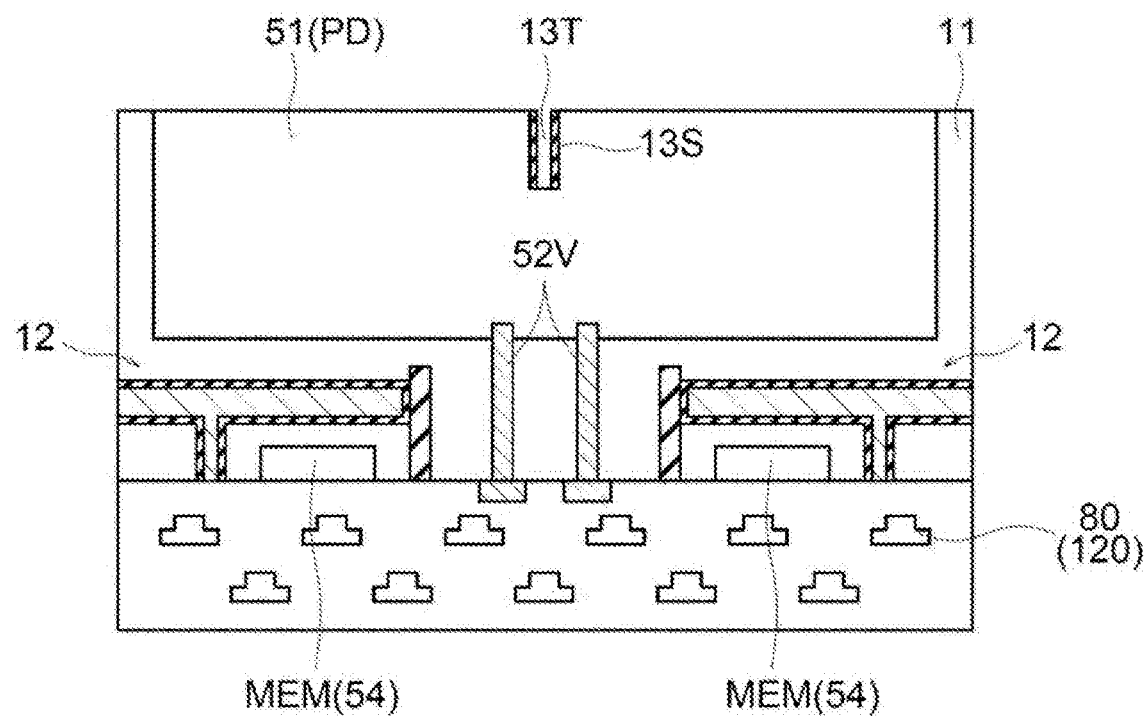
FIG. 12P is a process diagram, which is continuous with FIG. 12O.

Next, the side of the rear surface 11B of the semiconductor substrate 11 may be thinned through chemical mechanical polishing (CMP) or the like to form a trench 13T in accordance with the position of the first light shielding unit 13 as illustrated in FIG. 12N. The method for forming the trench 13T is similar to that of the trench 12T for the second light shielding unit 12 described above. Next, a side wall 13S is formed to cover the side surface and the bottom surface of the trench 13T as illustrated in FIG. 12O. The side wall 13S is formed of an insulating film made of SiN or SiO2, for example. Next, the insulating film at the bottom surface is removed with the insulating film at the side surface portion of the trench 13T left through dry etching, for example, as illustrated in FIG. 12P.

Figure 12Q:
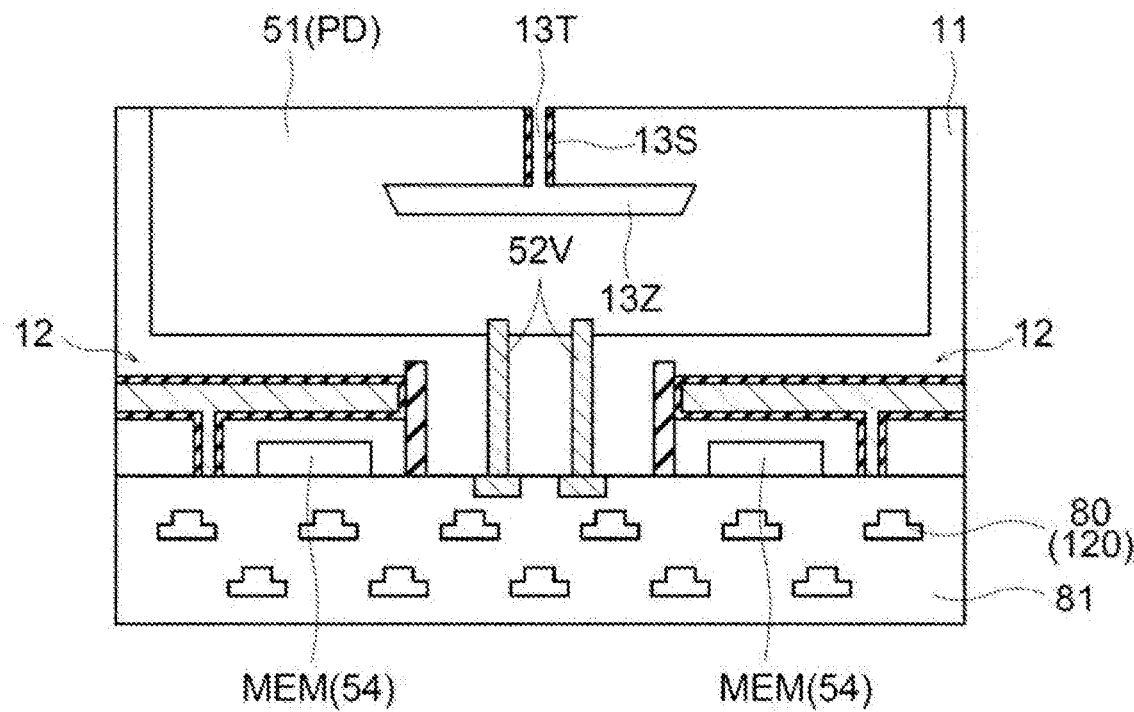
FIG. 12Q is a process diagram, which is continuous with FIG. 12P.

Next, a predetermined alkali aqueous solution is injected into the trench 13T, and anisotropic etching is performed thereon, thereby forming a space 13Z spreading in the horizontal direction as illustrated in FIG. 12Q. The space 13Z includes two third crystal planes 11S3 represented by the plane index {111} similarly to the space 12Z formed when the second light shielding unit 12 is formed. As a result, the shape of the space 13Z becomes the diamond shape as illustrated in FIG. 6B in a plan view and then becomes the rectangular shape as in FIG. 6C if the etching further advances.

Figure 12R:
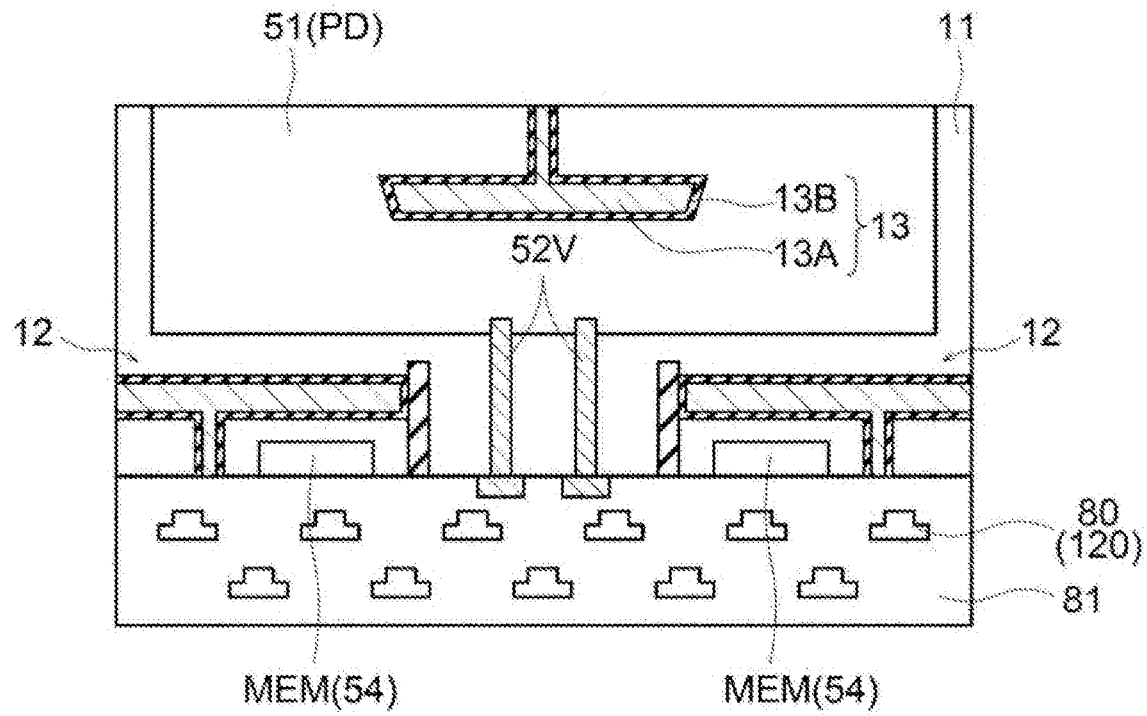
FIG. 12R is a process diagram, which is continuous with FIG. 12Q.

Next, the hard mask and the side wall used to form the trench 13T are removed through wet etching, for example, and an outer layer portion 13B made of an insulating material and an inner layer portion 13A made of a metal material are then formed on the side surface of the trench 13T and the inner surface of the space as illustrated in FIG. 12R. As described above, an insulating material, polysilicon, or the like may be temporarily embedded as the inner layer portion 13A.

Figure 12S:
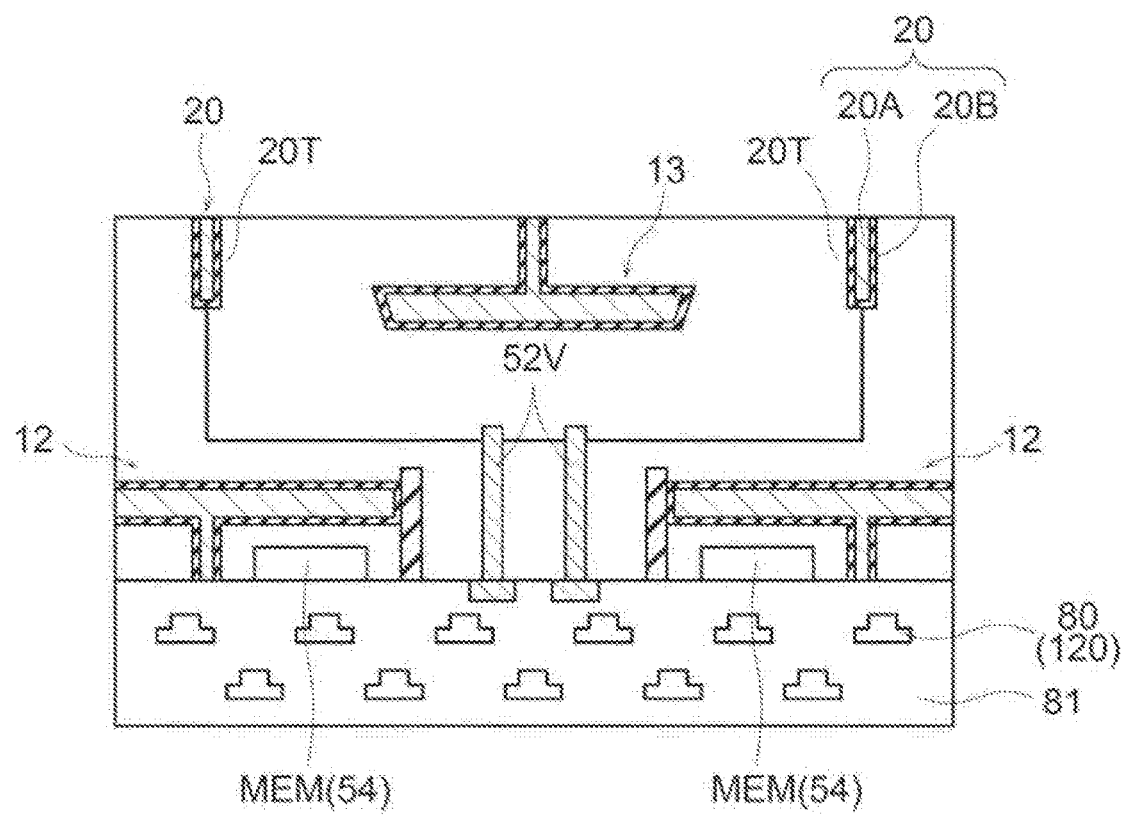
FIG. 12S is a process diagram, which is continuous with FIG. 12R.

Next, a trench 20T for element separation is formed along the boundary portion of the pixels, and an outer layer portion 20B made of an insulating material and an inner layer portion 20A made of a metal material are formed in the trench 20T as illustrated in FIG. 12S. Thereafter, the inner layer portion of the trench 13T in the first light shielding unit 13 may be replaced with a metal material.

Second Example of Process for Manufacturing Imaging Apparatus 101

In the first example of the manufacturing process illustrated in FIGS. 12A, 12B, 12C, 12D, 12E, 12F, 12G, 12H, 12I, 12J, 12K, 12L, 12M, 12N, 12O, 12P, 12Q, 12R, and 12S described above, the trench is formed in the depth direction of the silicon substrate 11, and the trench is then widened in the horizontal direction through wet etching to form the trench for the horizontal light shielding portion 13H. According to the manufacturing method, the shape of the trench for the horizontal light shielding portion 13H finally obtained depends on the plane orientation since the etching speed at the time of the wet etching changes depending on the plane orientation of the silicon substrate 11. On the other hand, in a case in which a manufacturing method of forming a hollow for the horizontal light shielding portion 13H first is employed, it is possible to form the horizontal light shielding portion 13H with a desired shape without depending on the plane orientation of the silicon substrate 11.

Figure 13A:
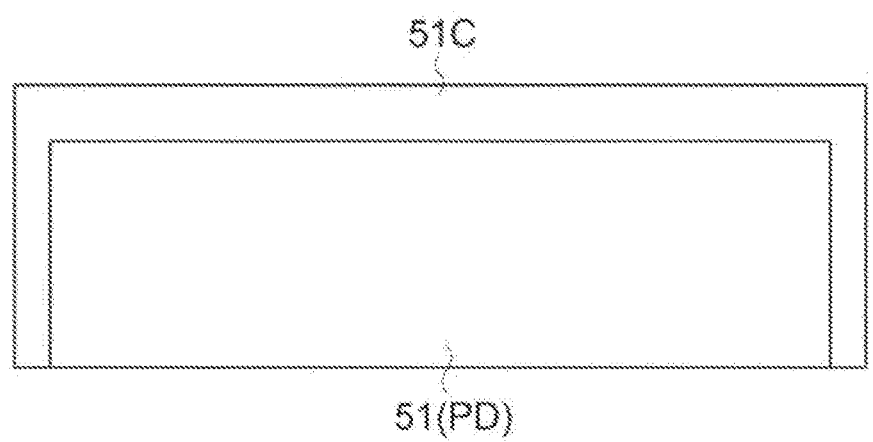
FIG. 13A is a process diagram illustrating a second example of a process of manufacturing the imaging apparatus.

FIGS. 13A, 13B, 13C, 13D, 13E, 13F, 13G, 13H, 13I, 13J, 13K, 13L, 13M, 13N, 13O, and 13P are process sectional views illustrating the second example of the process for manufacturing the imaging apparatus 101. First, a P-type semiconductor substrate (a silicon substrate, for example) 51C on which a photodiode 51 (PD) is formed is prepared, and the formation surface of the photodiode 51 (PD) is exposed as illustrated in FIG. 13A.

Figure 13B:
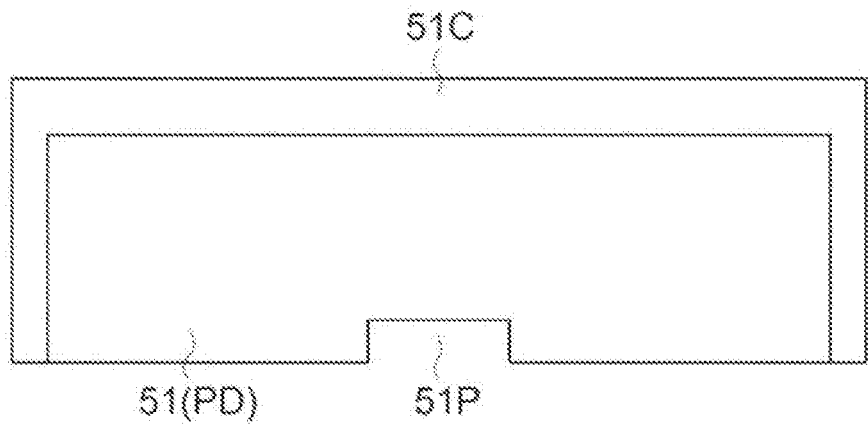
FIG. 13B is a process diagram, which is continuous with FIG. 13A.
Figure 13C:
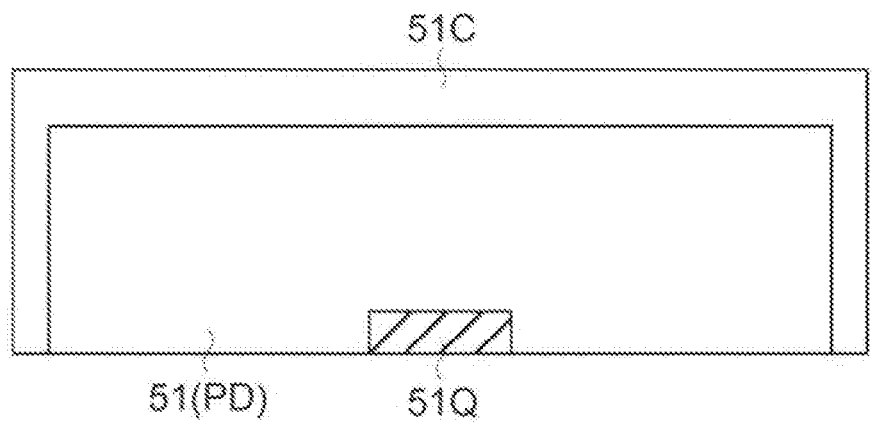
FIG. 13C is a process diagram, which is continuous with FIG. 13B.
Figure 13D:
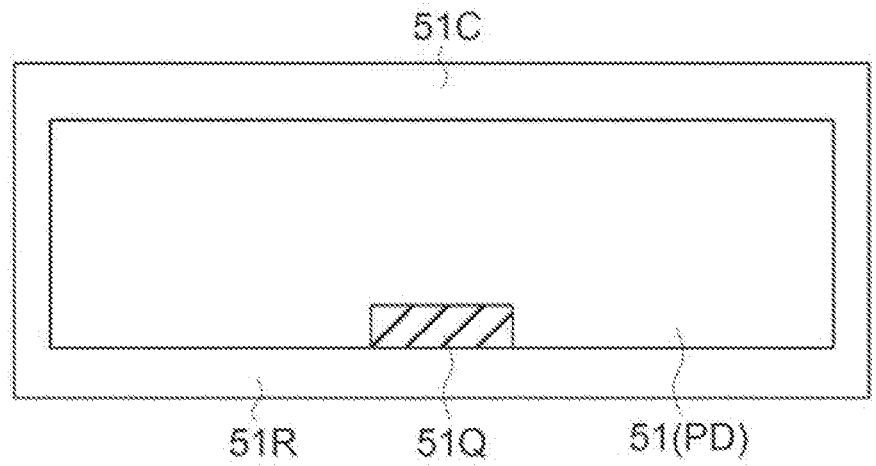
FIG. 13D is a process diagram, which is continuous with FIG. 13C.

Next, a partial region 51P of the photodiode 51 (PD) corresponding to the location where the horizontal light shielding portion 13H is formed is removed through etching, for example, as illustrated in FIG. 13B. Next, an oxide film 51Q is embedded in the region 51P removed through the etching, and the surface of the semiconductor substrate 51C is flattened as illustrated in FIG. 13C. It is possible to arbitrarily control the shape of the region 51P to be removed through the etching from the photodiode 51 (PD) by using a photomask or the like, and it is possible to arbitrarily control the shape of the horizontal light shielding portion 13 finally formed in the region 51P. Next, a p-type silicon layer 51R is formed on the semiconductor substrate 51C through epitaxial growth as illustrated in FIG. 13D.

Figure 13E:
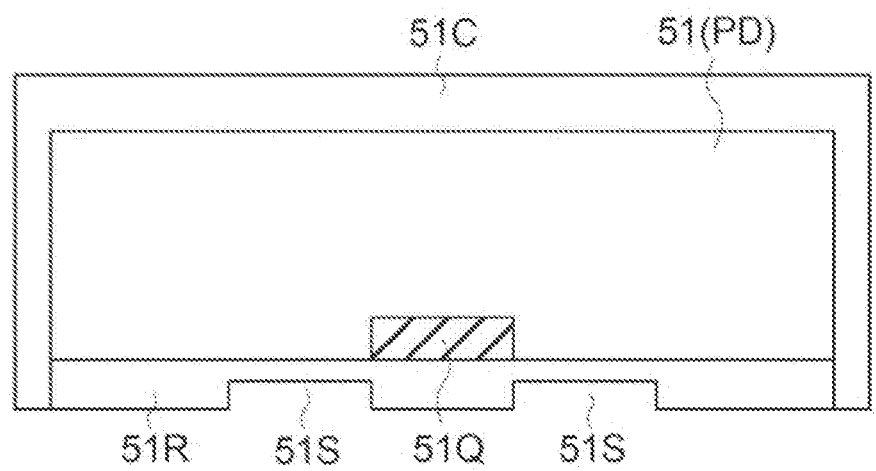
FIG. 13E is a process diagram, which is continuous with FIG. 13D.
Figure 13F:
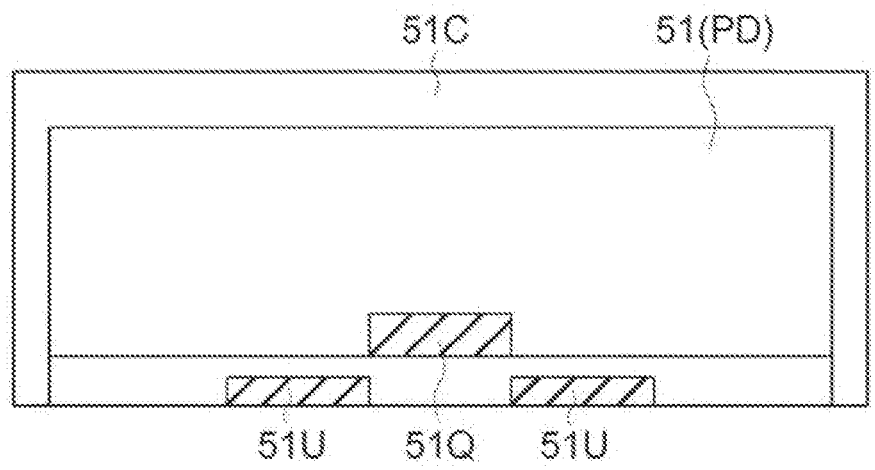
FIG. 13F is a process diagram, which is continuous with FIG. 13E.
Figure 13G:
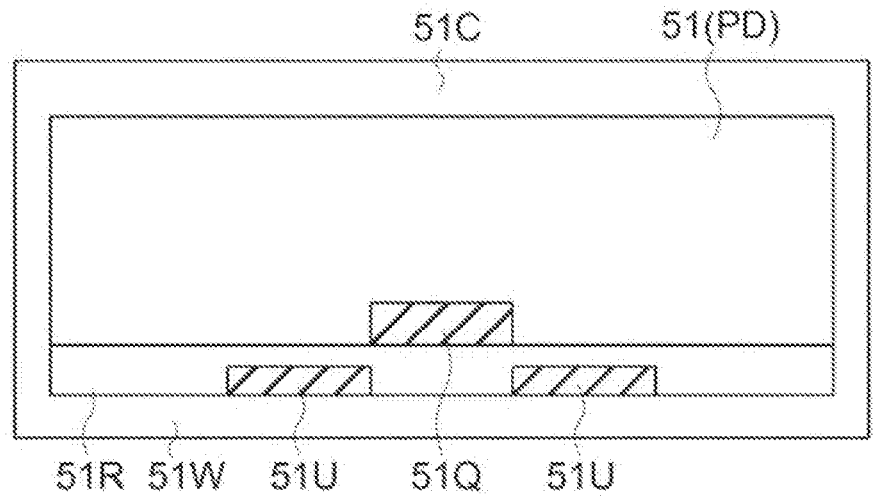
FIG. 13G is a process diagram, which is continuous with FIG. 13F.

Next, a hollow portion 51S for the horizontal light shielding portion 12H is formed as illustrated in FIG. 13E. The hollow portion 51S is disposed on the side closer to the front surface (first surface) of the semiconductor substrate 51C than the oxide film embedded region 51Q formed in FIG. 13C. Next, an oxide film 51U is embedded in the hollow portion 51S formed in FIG. 13E to flatten the substrate surface as illustrated in FIG. 13F. Next, a p-type silicon layer 51W is formed on the semiconductor substrate 51C through epitaxial growth as illustrated in FIG. 13G.

Figure 13H:
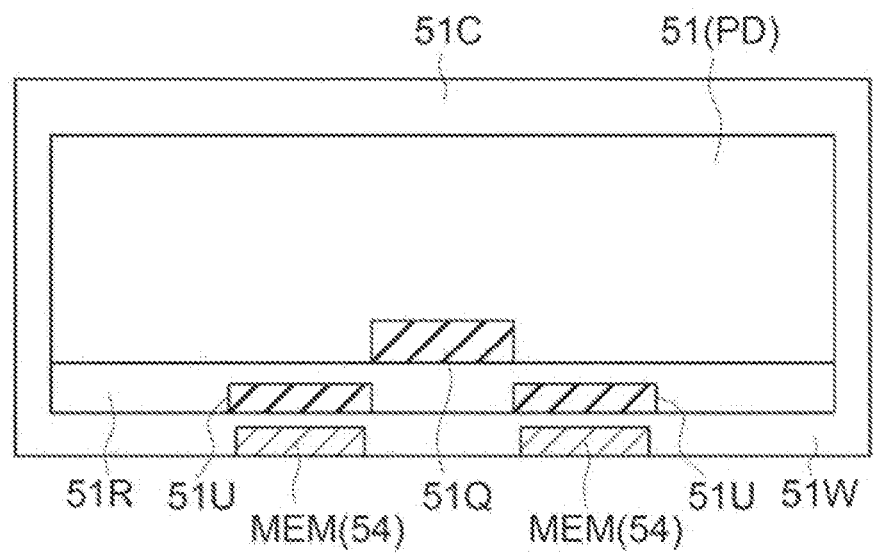
FIG. 13H is a process diagram, which is continuous with FIG. 13G.

Next, the electrical charge holding unit MEM (54) is formed inside the p-type silicon layer 51W on the side closer to the substrate surface than the oxide film embedded region 51U formed in FIG. 13F as illustrated in FIG. 13H. The electrical charge holding unit MEM (54) is formed in the N-type semiconductor region, for example.

Figure 13I:
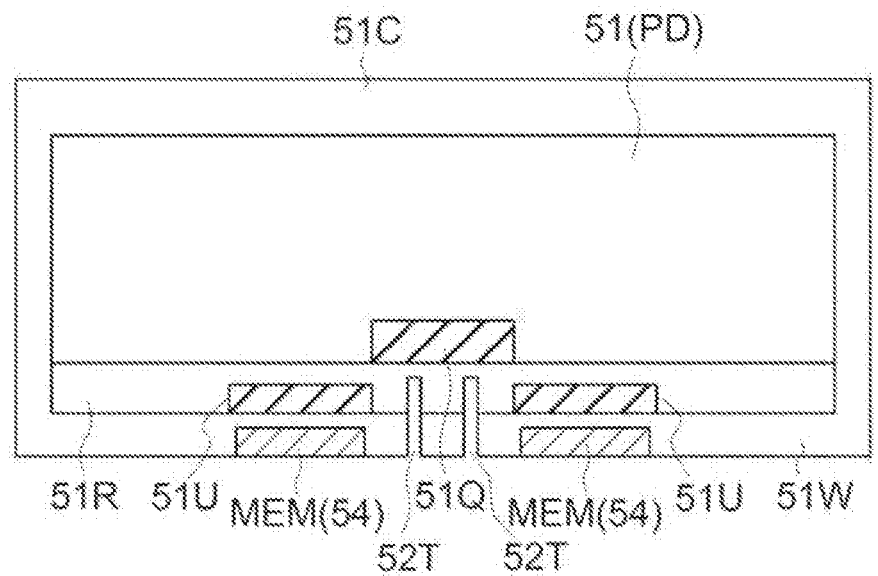
FIG. 13I is a process diagram, which is continuous with FIG. 13H.
Figure 13J:
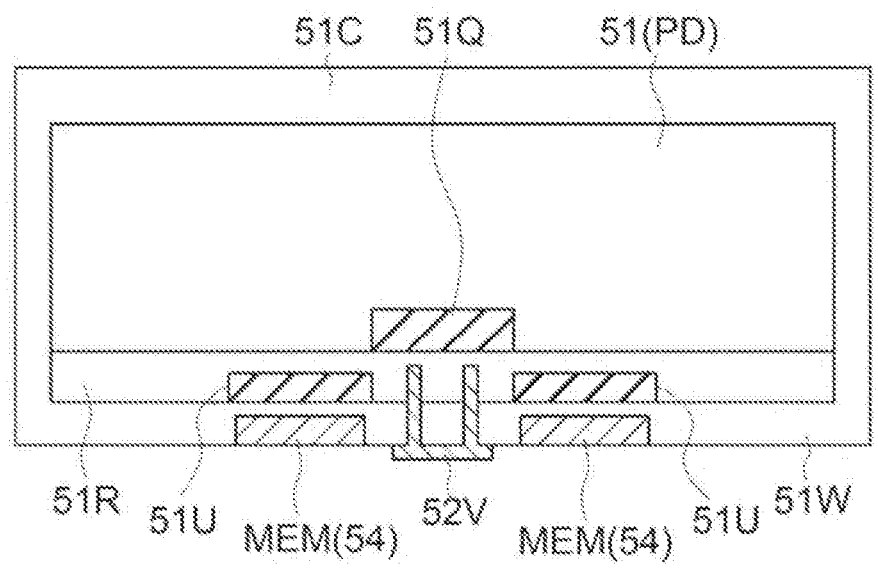
FIG. 13J is a process diagram, which is continuous with FIG. 13I.

Next, the trench 52T for the vertical gate electrode 52V is formed as illustrated in FIG. 13I. Next, a conductive material is embedded in the trench 52T formed in FIG. 13I to form the vertical gate electrode 52V as illustrated in FIG. 13J.

Figure 13K:
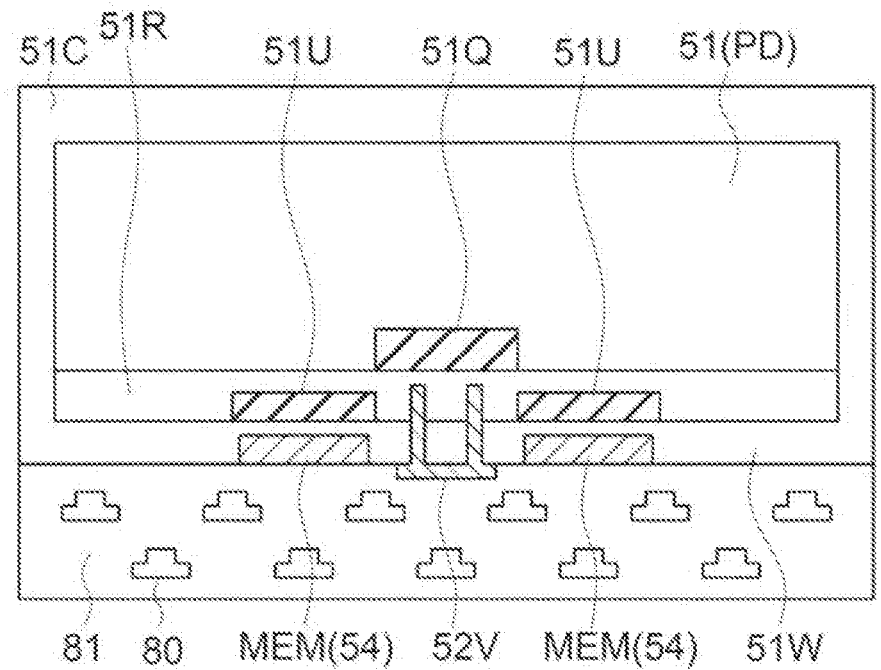
FIG. 13K is a process diagram, which is continuous with FIG. 13J.
Figure 13L:
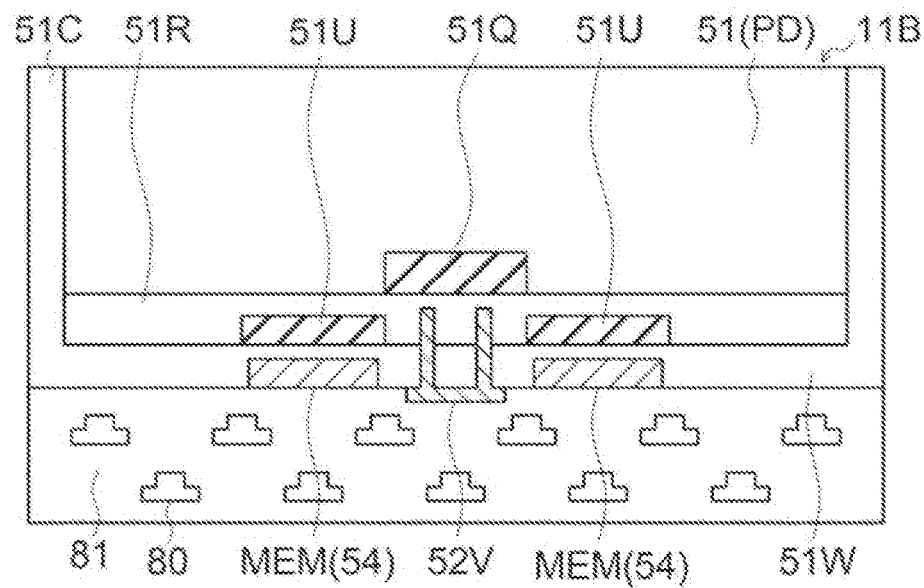
FIG. 13L is a process diagram, which is continuous with FIG. 13K.

Next, the wiring layer 80 and an insulating layer 81 covering the surroundings of the wiring layer 80 are formed on the substrate surface as illustrated in FIG. 13K. Next, the side of the rear surface 11B of the semiconductor substrate 11 is thinned through CMP or the like, and the formation surface of the photodiode 51 (PD) is exposed as illustrated in FIG. 13L. Next, trenches 12T and 13T are formed to reach the oxide film embedded region 51U for the horizontal light shielding portion 12H and the oxide film embedded region 51Q for the horizontal light shielding portion 13H in the depth direction from the formation surface of the exposed photodiode 51 (PD) as illustrated in FIG. 13M.

Figure 13M:
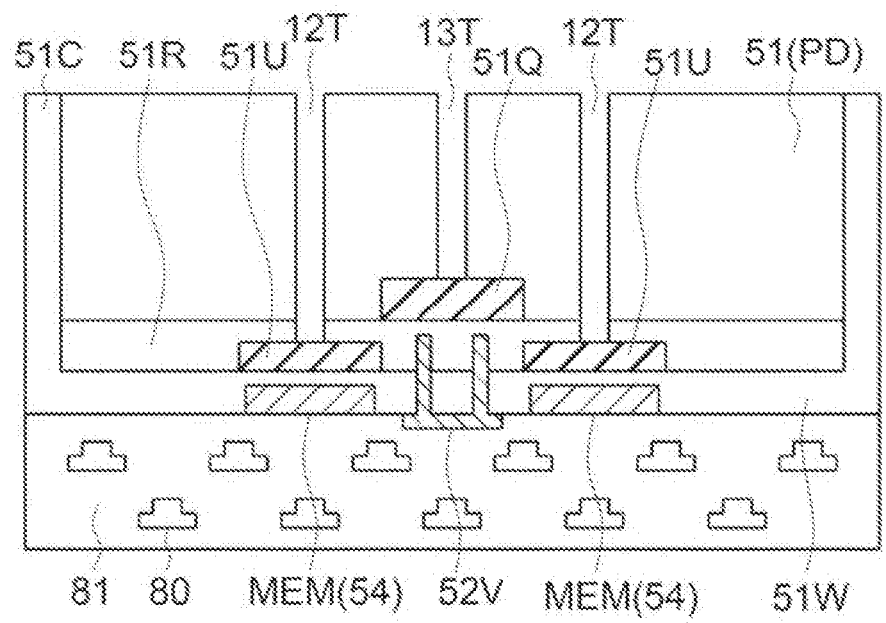
FIG. 13M is a process diagram, which is continuous with FIG. 13L.
Figure 13N:
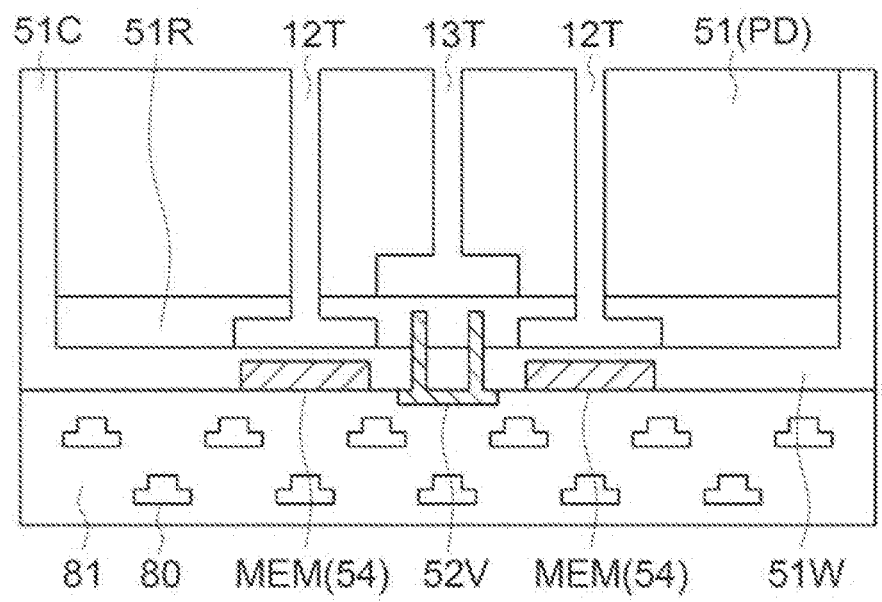
FIG. 13N is a process diagram, which is continuous with FIG. 13M.
Figure 13O:
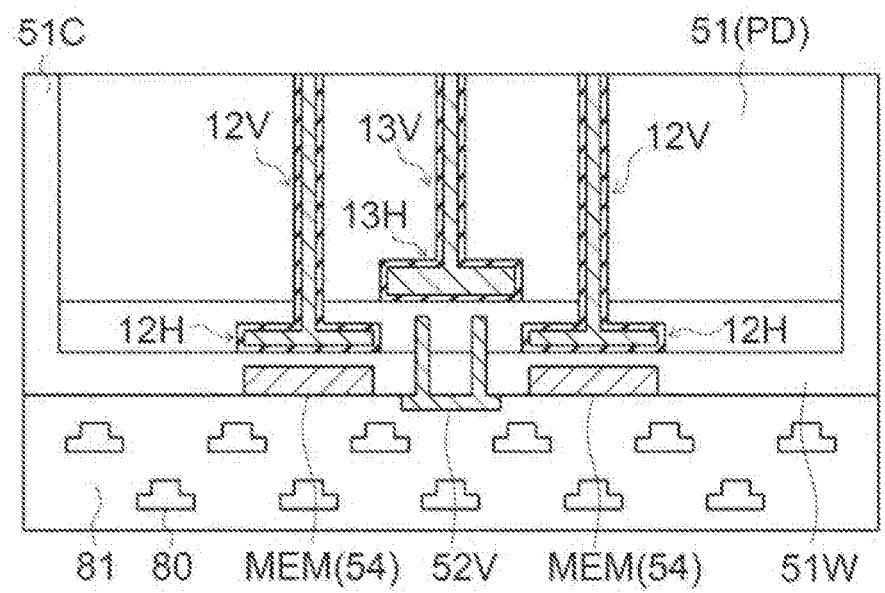
FIG. 13O is a process diagram, which is continuous with FIG. 13N.
Figure 13P:
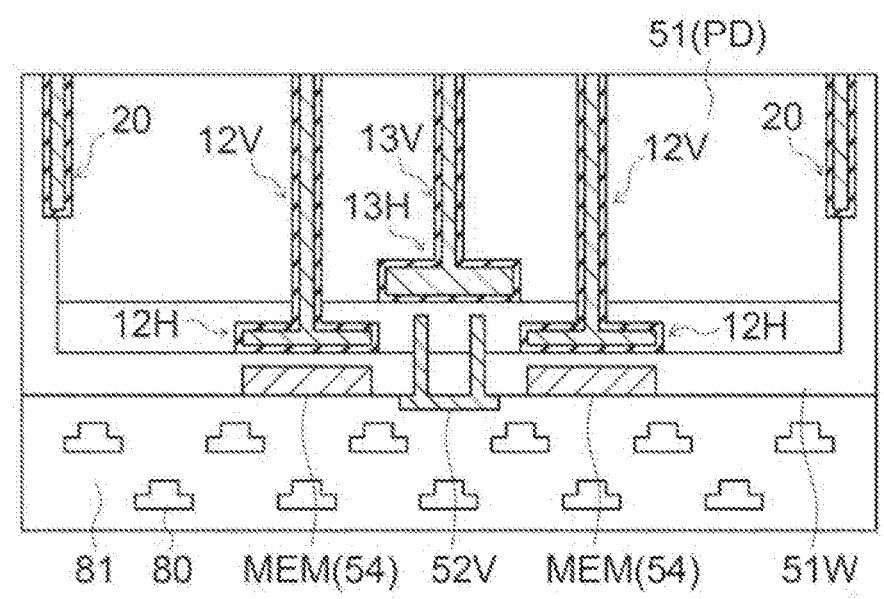
FIG. 13P is a process diagram, which is continuous with FIG. 13O.

Next, the oxide film embedded regions 51U and 51Q are removed to obtain hollows through wet etching via the trenches 12T and 13T formed in FIG. 13M as illustrated in FIG. 13N. Then, a light shielding material is embedded in the trenches 12T and 13T as illustrated in FIG. 13O. FIG. 13O illustrates an example in which the trenches 12T and 13T have double-phase structure therein. A metal material such as W (tungsten) may be embedded in the inner layer portion as described above, or a super critical fluid (SCM) may be embedded therein. The outer layer portion is an insulating layer. Note that the inside of the trench may be formed into a single-layer structure.

Although the horizontal light shielding portions 12H are connected to the vertical light shielding portions 12V extending from the side of the first surface (front surface) and the horizontal light shielding portion 13H are connected to the vertical light shielding portion 13V extending from the side of the second surface (rear surface) in the first example of the manufacturing process illustrated in FIGS. 12A, 12B, 12C, 12D. 12E, 12F, 12G, 12H, 12I, 12J, 12K, 12L, 12M, 12N, 12O, 12P, 12Q, 12R, and 12S, all the horizontal light shielding portions 12H and 13H are connected to the vertical light shielding portions 12V and 13V extending from the side of the rear surface in the second example of the manufacturing process. After the process in FIG. 13O, a trench for element separation may be formed along the boundary portion of the pixels as in FIG. 13P, and the outer layer portion made of an insulating material and an inner layer portion made of a metal material may be formed inside the trench to form the pixel boundary light shielding layer 20.

Since the hollows for the horizontal light shielding portions 12H and 13H are formed before the wet etching or the like, and the vertical light shielding portions 12V and 13V are then formed in the second example of the manufacturing process, it becomes easy to form the horizontal light shielding portions 12H and 13H into arbitrary shapes. More specifically, it is possible to form the horizontal light shielding portions 12H and 13H with arbitrary shapes without depending on the plane orientation of the silicon substrate 11 according to the second example of the manufacturing process. Since the silicon substrate with the plane index (100) has high mobility and a satisfactory interface state, for example, it is possible to improve electric properties of the solid imaging apparatus and to reduce defects if the horizontal light shielding portions 12H and 13H are formed using the silicon substrate 11. Also, it is not necessary to form the etching stoppers 17 when the hollows for the horizontal light shielding portions 12H are formed, and it is thus possible to simplify the manufacturing process.

Third Example of Process for Manufacturing Imaging Apparatus 101

Figure 14A:
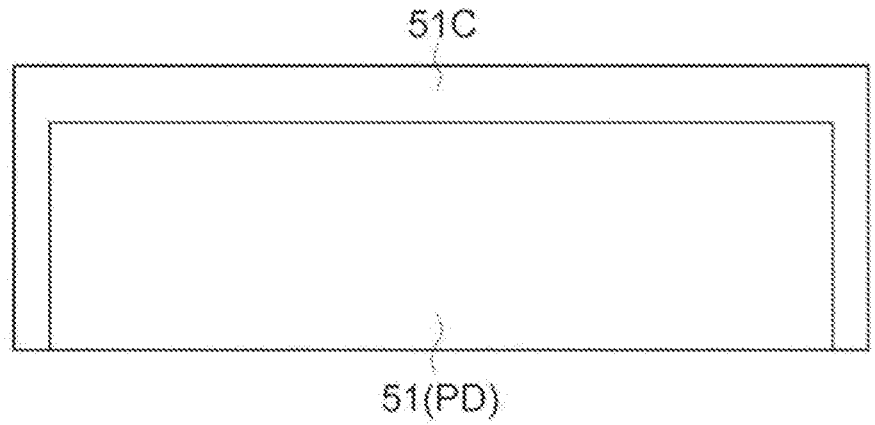
FIG. 14A is a process diagram illustrating a third example of a process of manufacturing the imaging apparatus.
Figure 14B:
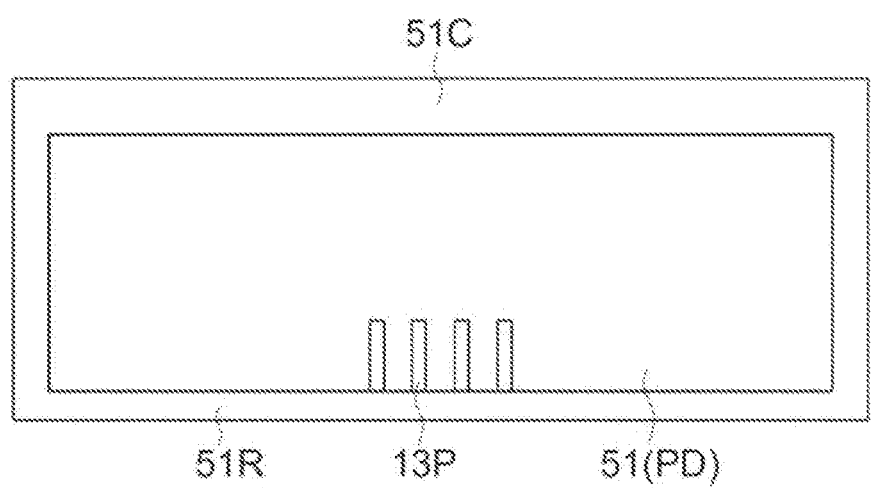
FIG. 14B is a process diagram, which is continuous with FIG. 14A.
Figure 14C:
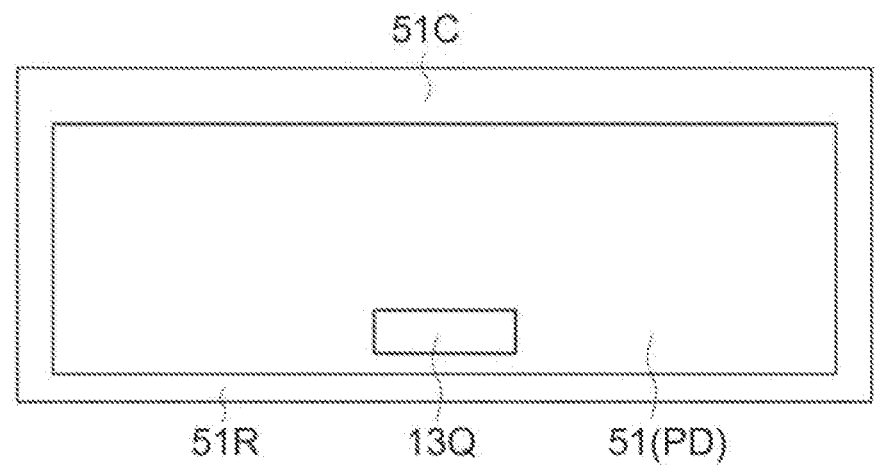
FIG. 14C is a process diagram, which is continuous with FIG. 14B.

FIGS. 14A, 14B, 14C, 14D, 14E, 14F, 14G, 14H, 14I, 14J, 14K, 14L, 14M. 14N and 14O are process sectional views illustrating a third example of the method for manufacturing the imaging apparatus. First, the formation surface of the photodiode 51 (PD) on the semiconductor substrate 51C in FIG. 14A is exposed, a plurality of trenches 13P are then formed to be adjacent in one direction, and a p-type semiconductor layer 51R is then formed thereon through epitaxial growth as illustrated in FIG. 14B. Next, a heat treatment is performed in a hydrogen atmosphere in which a reducing atmosphere can be formed as illustrated in FIG. 14C. In this manner, the plurality of trenches 13P formed to be adjacent to each other are integrated into a spherical shape, and a hollow 13Q is formed inside the photodiode 51 (PD). The hollow 13Q with a volume equivalent to that of the horizontal light shielding portion 13H is formed by repeating the processes in FIGS. 14B and 14C while slightly shifting the formation locations of the plurality of trenches 13P in FIG. 14B.

Figure 14D:
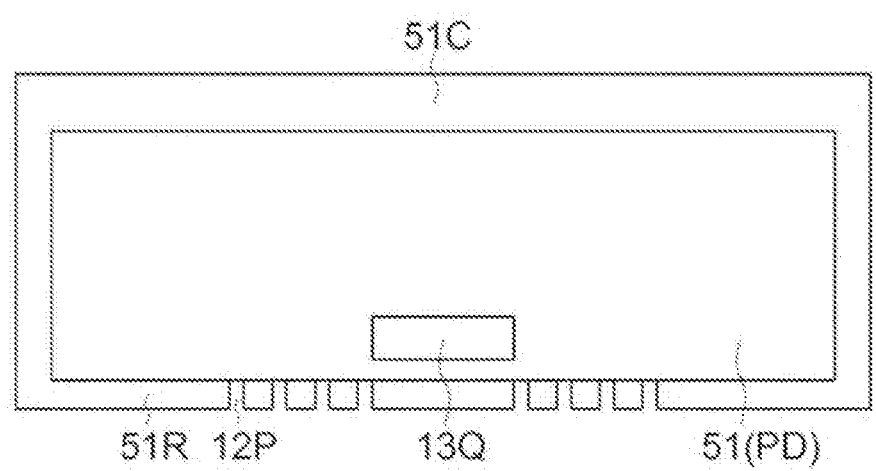
FIG. 14D is a process diagram, which is continuous with FIG. 14C.
Figure 14E:
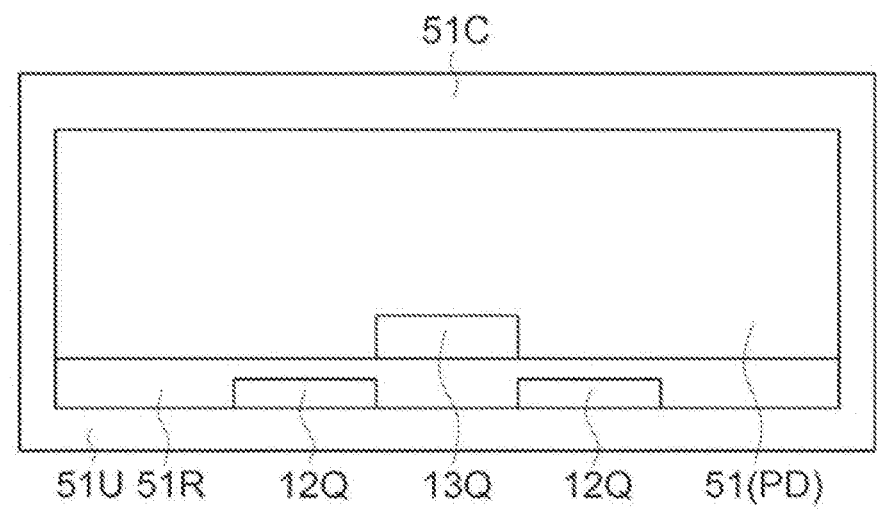
FIG. 14E is a process diagram, which is continuous with FIG. 14D.

Next, a plurality of trenches 12P are formed to be adjacent to each other at locations shallower than the hollow 13Q as illustrated in FIG. 14D. Next, a heat treatment is performed in a hydrogen atmosphere in which a reducing atmosphere can be formed as illustrated in FIG. 14E. In this manner, a hollow 12Q for the horizontal light shielding portion 12H is formed at a position shallower than the hollow 13Q formed in FIG. 14C. The hollow 12Q with a volume equivalent to that of the horizontal light shielding portion 12H is formed by repeating the processes in FIGS. 14D and 14E while slightly shifting the formation locations of the plurality of trenches 12P. A p-type silicon layer 51U is formed on the hollow 12Q through epitaxial growth.

Figure 14F:
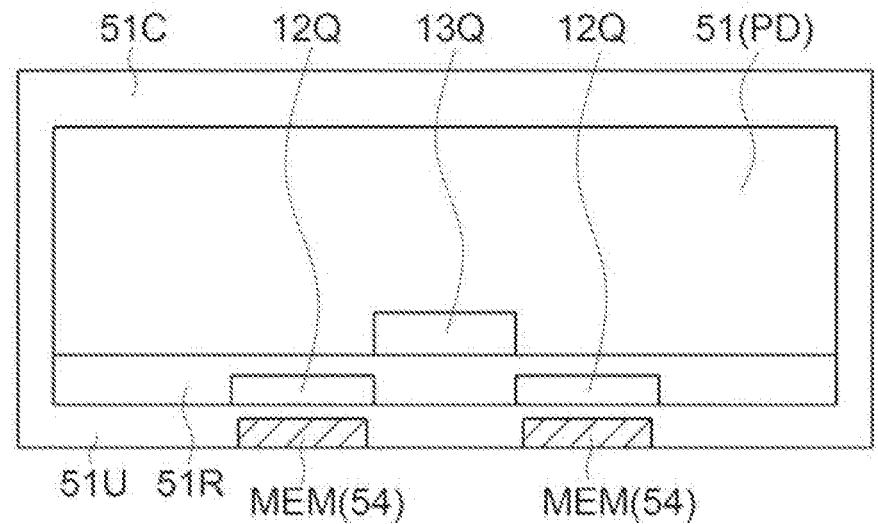
FIG. 14F is a process diagram, which is continuous with FIG. 14E.

Next, an electrical charge holding unit MEM (54) that is an N-type semiconductor region is formed inside the p-type silicon layer 51U on the side closer to the front surface than the hollow 12Q for the horizontal light shielding portion 12H as illustrated in FIG. 14F.

Figure 14G:
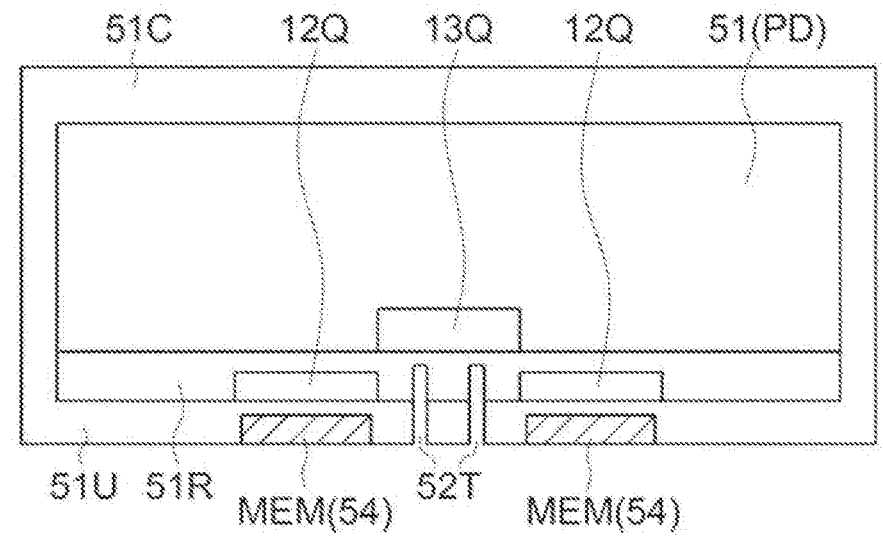
FIG. 14G is a process diagram, which is continuous with FIG. 14F.
Figure 14H:
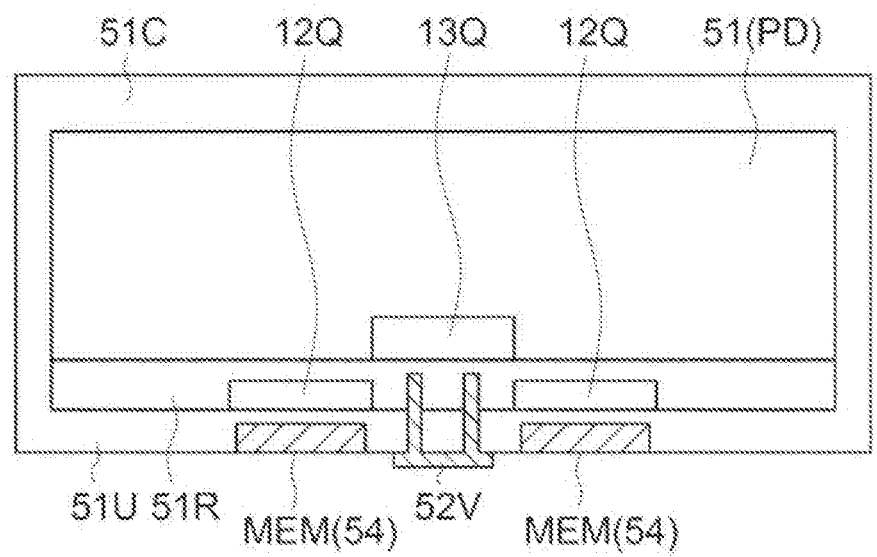
FIG. 14H is a process diagram, which is continuous with FIG. 14G.

Next, the trench 52T for the vertical gate electrode 52V is formed as illustrated in FIG. 14G. Next, a conductive material is embedded in the trench 52T to form the vertical gate electrode 52V as illustrated in FIG. 14H.

Figure 14I:
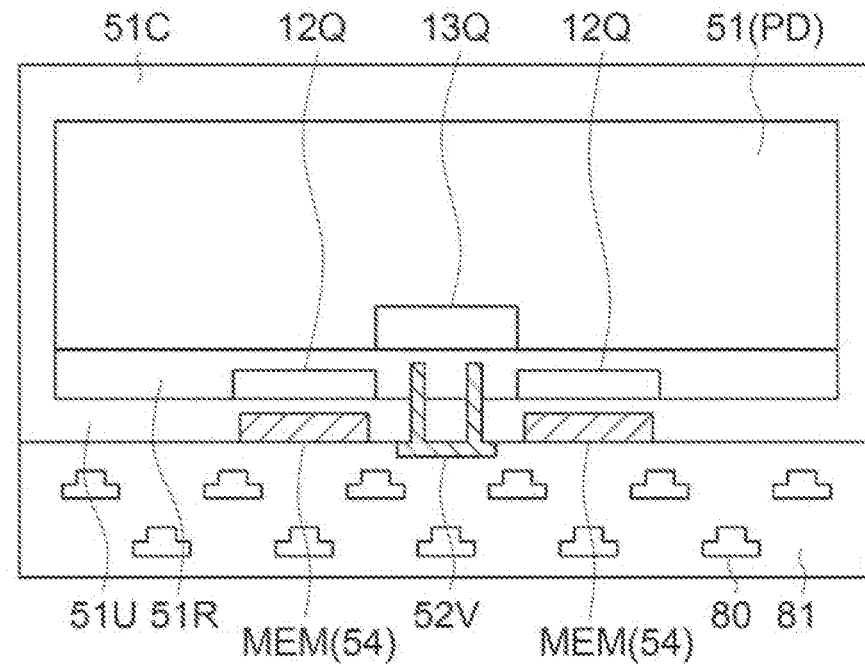
FIG. 14I is a process diagram, which is continuous with FIG. 14H.
Figure 14J:
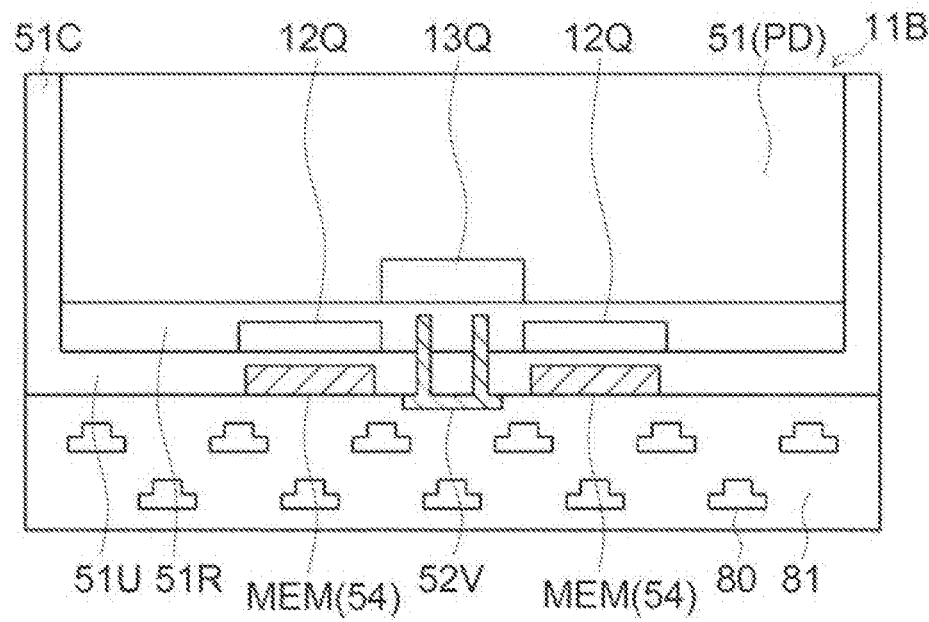
FIG. 14J is a process diagram, which is continuous with FIG. 14I.
Figure 14K:
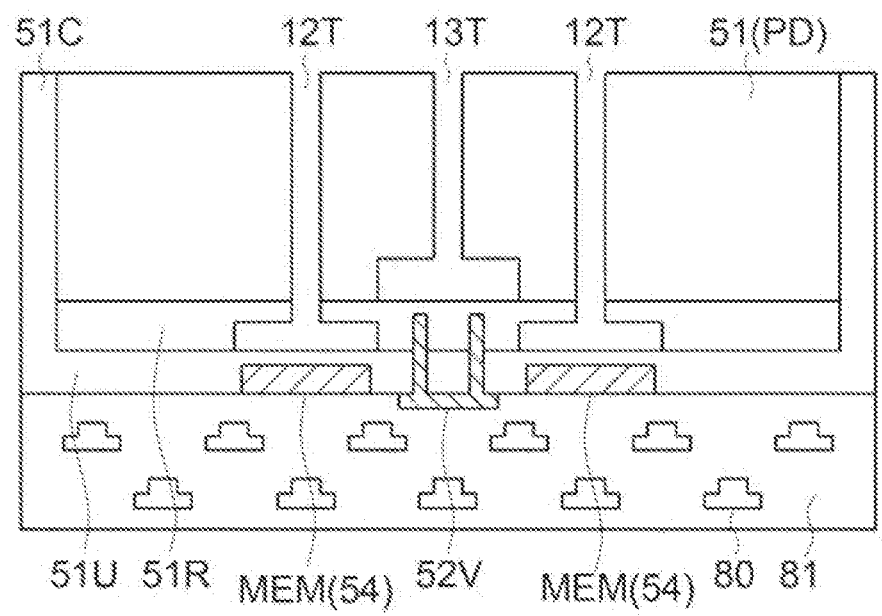
FIG. 14K is a process diagram, which is continuous with FIG. 14J.
Figure 14L:
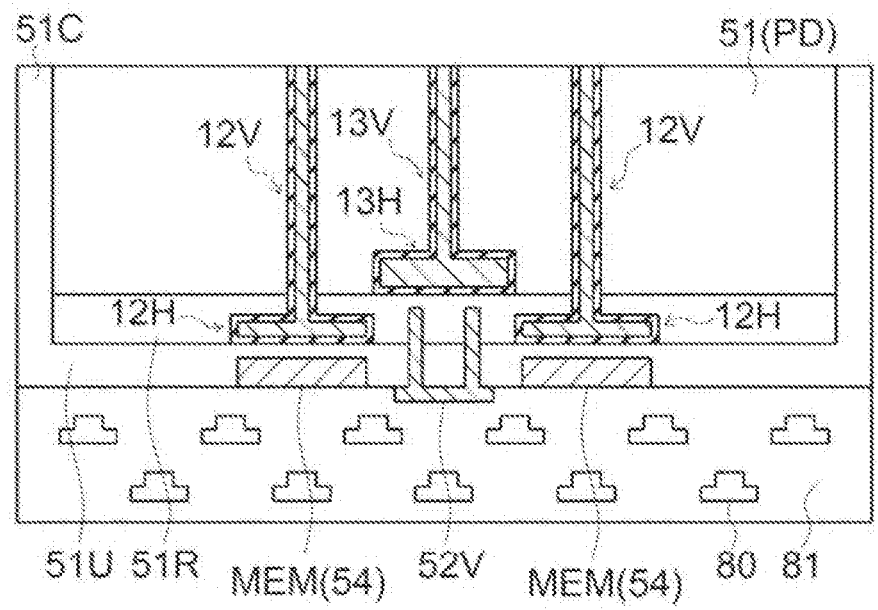
FIG. 14L is a process diagram, which is continuous with FIG. 14K.
Figure 14M:
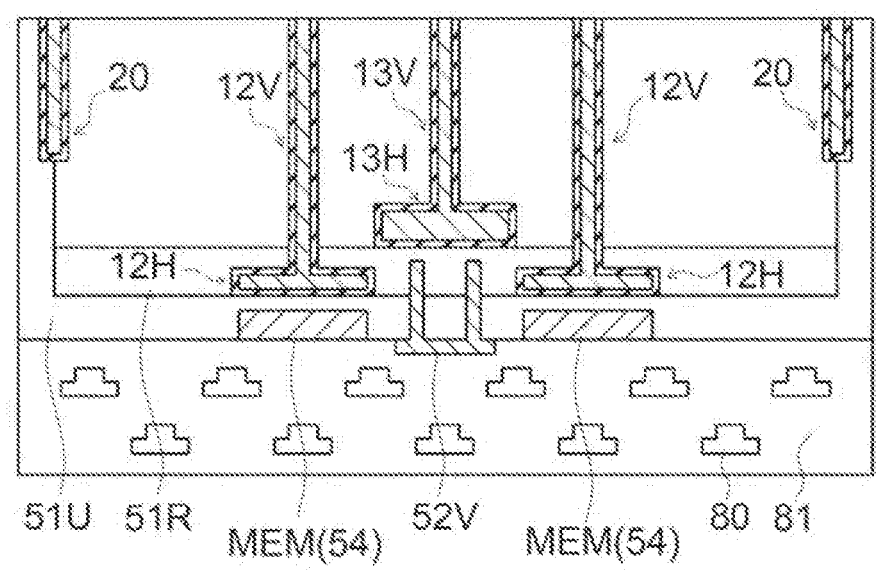
FIG. 14M is a process diagram, which is continuous with FIG. 14L.

Next, the wiring layer 80 and an insulating layer 81 covering the surroundings of the wiring layer 80 are formed on the substrate surface as illustrated in FIG. 14I. Next, the side of the rear surface 11B of the semiconductor substrate 11 is thinned through CMP or the like, and the formation surface of the photodiode 51 (PD) is exposed as illustrated in FIG. 14J. Next, new trenches 12T and 13T that reach the hollow 12Q for the horizontal light shielding portion 12H and the hollow 13Q for the horizontal light shielding portion 13H are formed in the depth direction from the formation surface of the exposed photodiode 51 (PD) as illustrated in FIG. 14K. Next, the inside of the trenches 12T and 13T is removed through wet etching, and a light shielding material or the like is then embedded in the trenches 12T and 13T as illustrated in FIG. 14L. Thereafter, a pixel boundary structure may be formed as illustrated in FIG. 14M.

Although the example in which the first light shielding unit 13 includes the vertical light shielding portion 13V connected to the horizontal light shielding portion 13H and the second light shielding unit 12 includes the vertical light shielding portions 12V connected to the horizontal light shielding portions 12H has been described in each of the aforementioned examples, at least either the vertical light shielding portions 12V or 13V may be a hole member or a contact member with a diameter that is necessary to fill the hollows for the horizontal light shielding portions 12H and 13H with the light shielding material.

FIGS. 15A, 15B, 15C, 15D, 15E, and 15F are plan views illustrating an example in which hole members or contact members 12PH or 13PH are used instead of at least either the vertical light shielding portions 12V or 13V. FIGS. 15A, 15B, 15C, and 15D are schematic plan views seen from the side of the second surface (rear surface) of the solid imaging apparatus and illustrate a state in which the horizontal light shielding portion 12H is disposed below the horizontal light shielding portion 13H. FIGS. 15A, 15B, 15C and 15D illustrate the horizontal light shielding portions 13H with mutually different shapes. Note that the shape of the horizontal light shielding portion 13H is not limited to those illustrated in FIGS. 15A, 15B, 15C, and 15D.

In FIGS. 15A, 15B, 15C, and 15D, hole members 12PH extending from the side of the second surface (rear surface), for example, are formed at four corners of the horizontal light shielding portion 12H with a rectangular shape, and the hollow for the horizontal light shielding portion 12H is filled with a light shielding material or the like through the hole members 12PH to form the horizontal light shielding portion 12H, Similarly, a hole member 13PH extending from the side of the rear surface, for example, is formed at substantially the center portion of the horizontal light shielding portion 13H disposed near the center of the horizontal light shielding portion 12H, and a hollow for the horizontal light shielding portion 13H is filled with a light shielding material or the like through the hole member 13PH to form the horizontal light shielding portion 13H. The light shielding material or the like may be embedded inside the hole members 12PH and 13PH to form contact members after the horizontal light shielding portions 12H and 13H are formed, or the hole members 12PH and 13PH may be left as the hole members.

Although FIGS. 15A, 15B, 15C, and 15D illustrate an example in which the hole members 12PH are provided at the four corners of the horizontal light shielding portion 12H and the hole members 12PH are filled with the light shielding material for the horizontal light shielding portions 12H and 13H, the number and disposition locations of the hole members 12PH are arbitrarily selected, and the hole members 12PH may not necessarily provided at the corner portions of the horizontal light shielding portion 12H. Also, a plurality of hole members 13PH for the horizontal light shielding portion 13H may be provided.

Figure 15A:
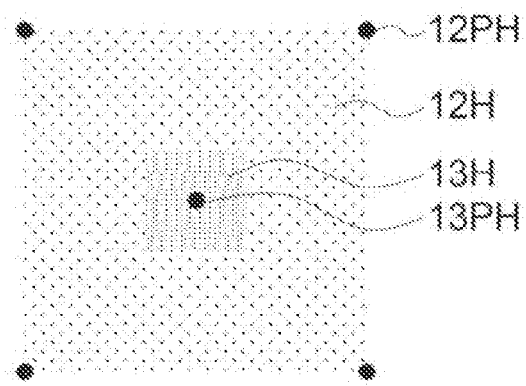
FIG. 15A is a plan view illustrating an example in which a hole member or a contact member is used instead of the vertical light shielding portion.
Figure 15B:
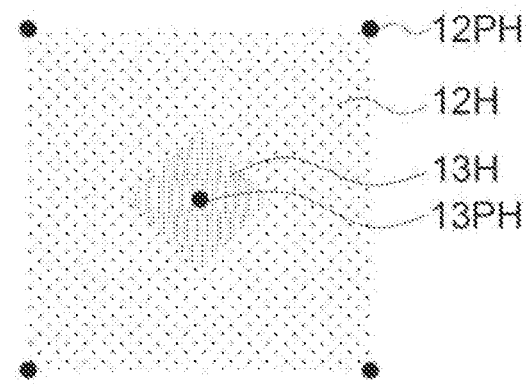
FIG. 15B is a plan view illustrating another modification example of FIG. 15A.
Figure 15C:
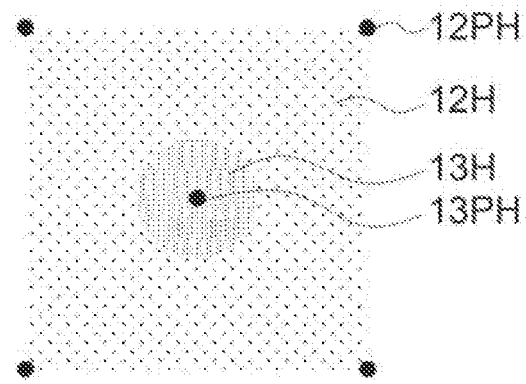
FIG. 15C is a plan view illustrating another modification example of FIG. 15A.
Figure 15D:
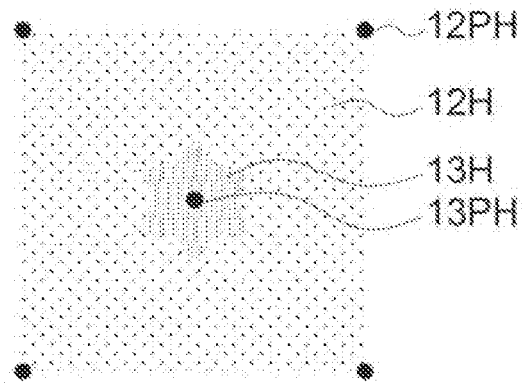
FIG. 15D is a plan view illustrating another modification example of FIG. 15A.
Figure 15E:
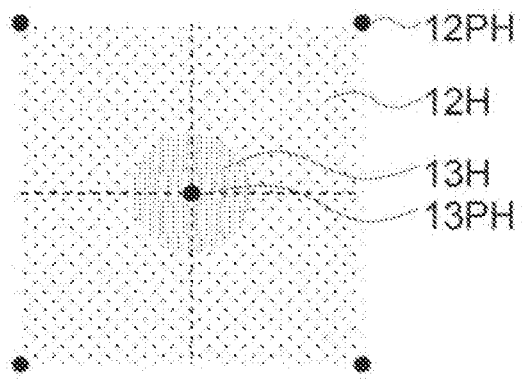
FIG. 15E is a plan view illustrating another modification example of FIG. 15A.

FIG. 15E illustrates an example in which the hole members 12PH are provided at the four corners of the horizontal light shielding portion 12H to lie across four adjacent pixels and the horizontal light shielding portion 13H and the hole member 13PH for the horizontal light shielding portion 13H are provided at the center portion of the four pixels. The number and disposition locations of the hole members 12PH and 13PH are arbitrarily selected in FIG. 15E as well.

Figure 15F:
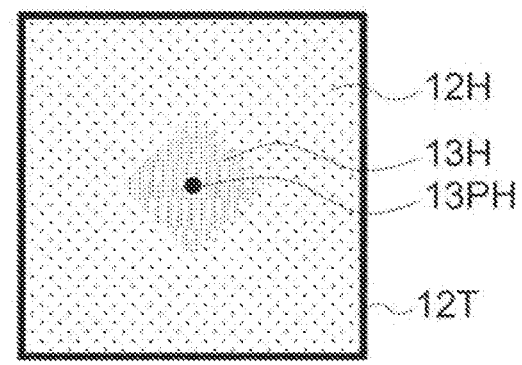
FIG. 15F is a plan view illustrating another modification example of FIG. 15A.

In FIG. 15F, the trench 12T is formed to surround the periphery of the horizontal light shielding portion 12H, a hollow for the horizontal light shielding portion 12H is filled with a light shielding portion or the like from the trench 12T to form the horizontal light shielding portion 12H, and the trench 12T is filled to form the vertical light shielding portion 12V. Also, a hollow for the horizontal light shielding portion 13H is formed at the center portion of the horizontal light shielding portion 12H, the hole member 13PH is formed at the center portion of the horizontal light shielding portion 13H, and the hole member 13PH is filled with a light shielding material or the like for the horizontal light shielding portion 13H to form the horizontal light shielding portion 13H.

As illustrated in FIG. 15F, one of the horizontal light shielding portions 12H and 13H may have a vertical light shielding portion while the other one may have a hole member or a contact member.

(Materials for Second Light Shielding Unit 12, First Light Shielding Unit 13, and Second Element Separation Units 20)

The second light shielding unit 12, the first light shielding unit 13, and the second element separation units 20 in the present embodiment have a property of absorbing or reflecting incident light, and various materials can be applied thereto. For example, an insulating film such as SiN or SiO2 may be used as an example of the material. Alternatively, a metal material such as tungsten or aluminum may be used. Tungsten has a property of absorbing light while aluminum has a property of reflecting light. Additionally, the aforementioned material may be polysilicon. Polysilicon has an excellent light reflecting property. Alternatively, the aforementioned material may be a metal oxide film (aluminum oxide or aluminum nitride, for example). Alternatively, the aforementioned material may be a carbon compound or an organic material. Alternatively, the aforementioned material may be an electrochromic material. The electrochromic material is a material capable of switching a light reflectance or absorptance by applying a voltage or a current thereto (for example, polyaniline or porogen).

It is only necessary for the second light shielding unit 12, the first light shielding unit 13, and the second element separation units 20 to have light absorbing property or light reflecting property. Note that in the specification, a case in which light is absorbed and a case in which light is reflected will collectively be referred to as "light shielding". In other words, "light shielding" in the specification means that a property of not allowing light to penetrate therethrough is included. Note that it is assumed that a case in which light is allowed to slightly penetrate therethrough is interpreted as being included in "light shielding", The second light shielding unit 12 and the first light shielding unit 13 may be referred to as light control members because of the light absorbing or reflecting property.

(Attachment Structure of Imaging Apparatus 101)

Figure 16:
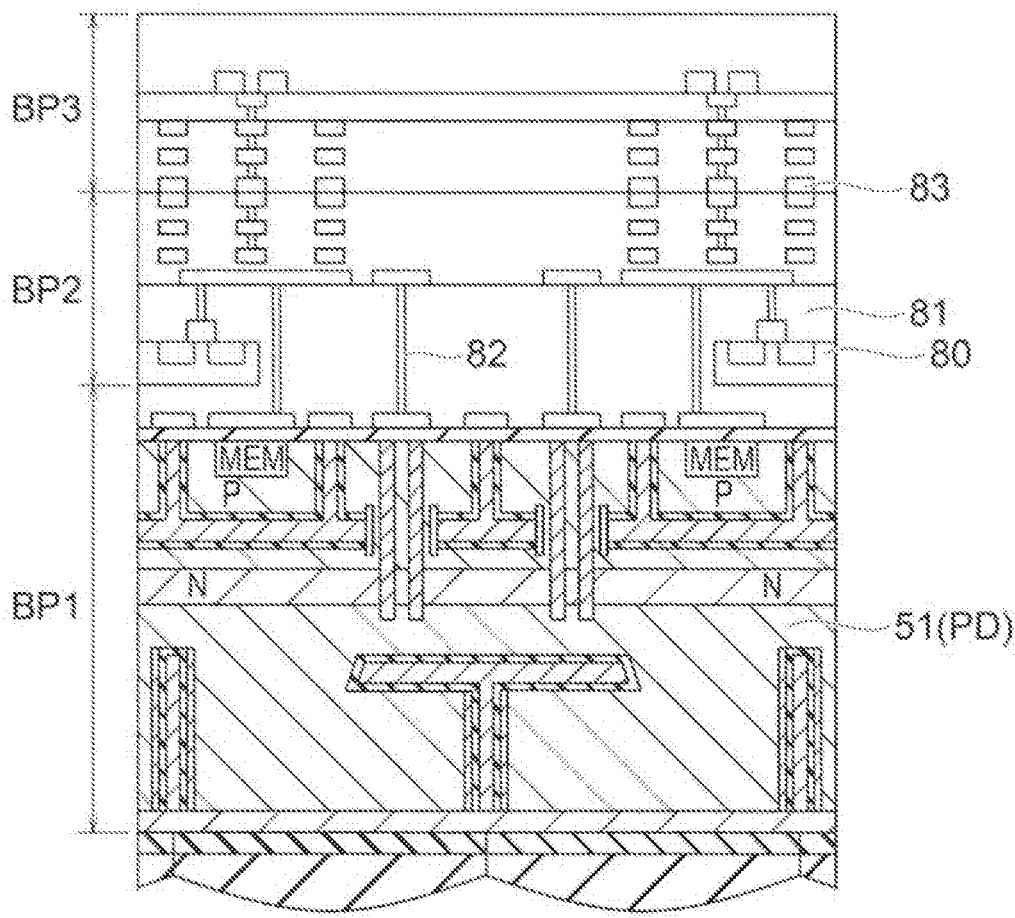
FIG. 16 is a sectional view of the imaging apparatus constituted by first to third semiconductor substrates attached to each other.

The imaging apparatus 101 according to the present embodiment is configured by attaching, to the semiconductor 11 on which the pixel array unit 111 is formed, another semiconductor substrate 11 on which the reading circuit 120 and the like are formed. FIG. 16 is a sectional view of the imaging apparatus 101 configured by attaching first to third semiconductor substrates BP1 to BP3. The sensor pixel 121 is formed in the first semiconductor substrate BP1. The reading circuit 120, the wiring layer 80, and the insulating layer 81 are formed in the second semiconductor substrate BP2. Electrical continuity is established between the first semiconductor substrate BP1 and the second semiconductor substrate BP2 through a penetrating wire 82. The reading circuit 120 is a circuit illustrated in FIG. 2 and is a circuit that outputs a pixel signal based on electrical charge output from the sensor pixel 121. A plurality of pixel drive lines 122 and a plurality of vertical signal lines 123 are formed in the wiring layer 83. The surroundings of the reading circuit 120 and the wiring layer 80 are covered with the insulating layer 81. A logic circuit CR3, the wiring layer 63, and the insulating layer 62 are formed in the third semiconductor substrate BP3. The logic circuit CR3 includes, for example, the vertical drive unit 112, the ramp wave module 113, the column signal processing unit 114, the clock module 115, the data storage unit 116, the horizontal drive unit 117, the system control unit 118, the signal processing unit 119, and the like. The surroundings of the logic circuit and the wiring layer are covered with the insulating layer. Electric continuity is established between the second semiconductor substrate BP2 and the third semiconductor substrate BP3 with Cu—Cu junction 83, for example.

In this manner, according to the first embodiment, the first light shielding unit 13 including the vertical light shielding portion 13V and the horizontal light shielding portion 13H is disposed inside the photoelectric conversion unit 51 below the vertical gate electrode 52V in the backside irradiation-type imaging apparatus 101, and it is thus possible to prevent the concern that the light that has been incident from the rear surface 11B penetrates through the photoelectric conversion unit 51 and is then incident on the vertical gate electrode 52V. The first light shielding unit 13 is relatively easily manufactured since the vertical light shielding portion 13V and the horizontal light shielding portion 13H are integrally formed. Also, since the sectional shape of the first light shielding unit 13 is a T shape and the horizontal light shielding portion 13H does not penetrate through the vertical light shielding portion 13V, there is no concern that the vertical light shielding portion 13V prevents movement of the electrons generated by the photoelectric conversion unit 51.

Also, it is possible to arbitrarily adjust the height of the vertical light shielding portion 13V in the first light shielding unit 13, to arbitrarily adjust the height of the second element separation units 20 as well, and thereby to improve the photoelectric conversion efficiency Qe, that is, sensitivity without increasing noise and color mixing by optimizing the heights of the vertical light shielding portion 13V and the second element separation units 20 such that the vertical light shielding portion 13V and the second element separation units 20 do not prevent the movement of the electrons generated by the photoelectric conversion unit 51.

Moreover, the vertical light shielding portion 13V of the first light shielding unit 13 is disposed at the boundary portion of the pixels, can prevent leakage of light to adjacent pixels, and can reduce blooming due to color mixing. Furthermore, it is possible to further enhance the effect of reducing crosstalk between pixels by providing the second element separation units 20 at the boundary portions of the pixels in addition to the first light shielding unit 13.

Also, it is possible to prevent the concern that light is incident on the electrical charge holding unit (MEM) 54 and to reduce noise by providing the second light shielding unit 12 covering the electrical charge holding unit (MEM) 54 in addition to the first light shielding unit 13.

Second Embodiment

Although the example in which the section of the first light shielding unit 13 has a T shape and the second light shielding unit 12 and the second element separation units 20 are present has been described in the first embodiment, the second element separation units 20 are not necessarily essential. Also, various modification examples are conceivable for the shapes of the second element separation units 20 and the second light shielding unit 12.

(Specific Shapes of Second Light Shielding Unit 12, First Light Shielding Unit 13, and Second Element Separation Units 20)

FIGS. 17A, 17B, 17C, 17D, 17D, 17E, 17F, 17G, 17H, 17I, 17J, 17K, 17L, 17M, 17N and 17O are sectional views illustrating various modification examples of the second light shielding unit 12, the first light shielding unit 13, and the second element separation units 20. FIGS. 17A, 17B, 17C, 17D, 17D, 17E, 17F, 17G, 17H, 17I, 17J, 17K, 17L, 17M, 17N and 17O schematically illustrate sectional structures of surroundings of a second light shielding unit 12, a first shielding unit 13, and second element separation units 20 of an imaging apparatus 101 according to a second embodiment.

Figure 17A:
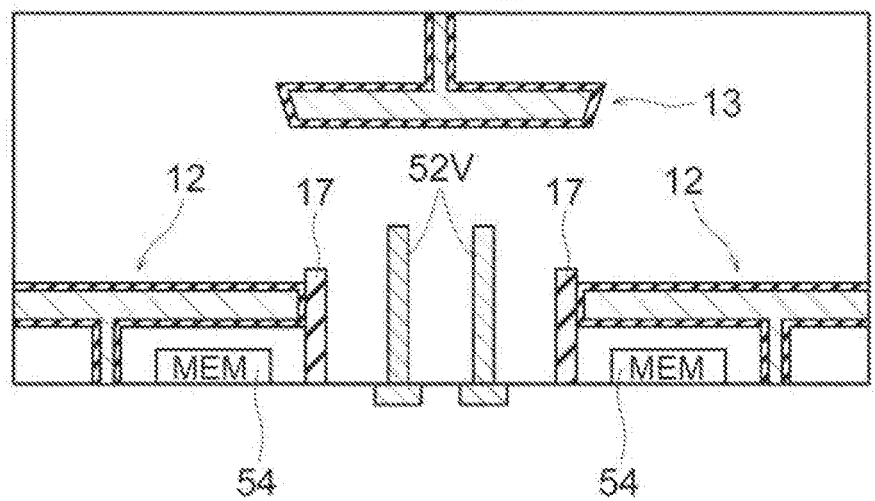
FIG. 17A is a sectional view illustrating various modification examples of the second light shielding unit, the first light shielding unit, and the element separation unit.

FIG. 17A is a sectional view of the imaging apparatus 101 from which the second element separation units 20 are omitted. Although leakage of light to the adjacent sensor pixels 121 increases due to omission of the second element separation units 20, light that is incident on the adjacent sensor pixels 121 does not lead to degradation of image quality in a case in which the imaging apparatus 101 performs monochrome imaging, and it is thus possible to omit the second element separation units 20. It becomes easier for the electrons generated by the photoelectric conversion unit 51 to move due to the omission of the second element separation units 20, and it is possible to improve the photoelectric conversion efficiency Qe, that is, sensitivity.

Figure 17B:
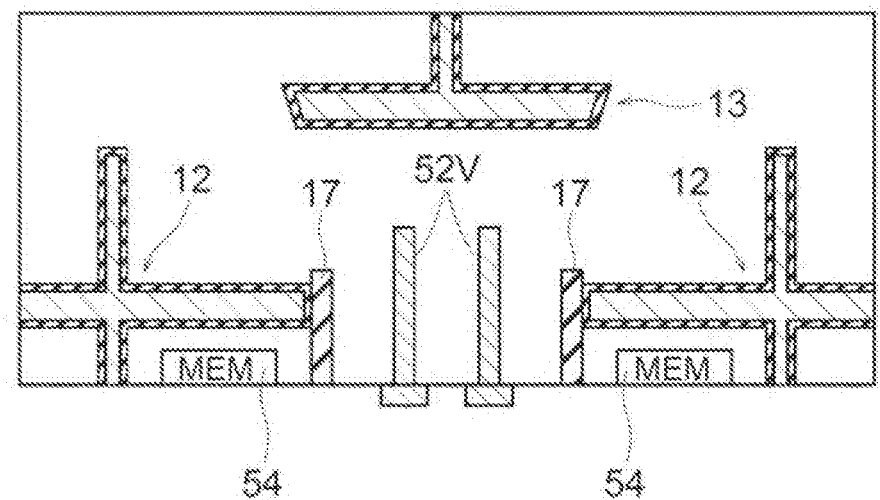
FIG. 17B is a sectional view of the imaging apparatus including the second light shielding unit with a cross-shaped section.

FIG. 17B is a sectional view of the imaging apparatus 101 in which the section of the second light shielding unit 12 has a cross shape. It is possible to curb leakage of light to the adjacent sensor pixels 121 at the vertical light shielding portions by causing the vertical light shielding portions 12V of the second light shielding unit 12 to extend to be long in the depth direction of the semiconductor substrate 11. In other words, since the vertical light shielding portions 12V of the second light shielding unit 12 functions to separate pixels, there is no need to provide the second element separation units 20. Also, the horizontal light shielding portions 12H of the second light shielding unit 12 can be provided at arbitrary positions in the extending direction of the vertical light shielding portions 12V.

Figure 17C:
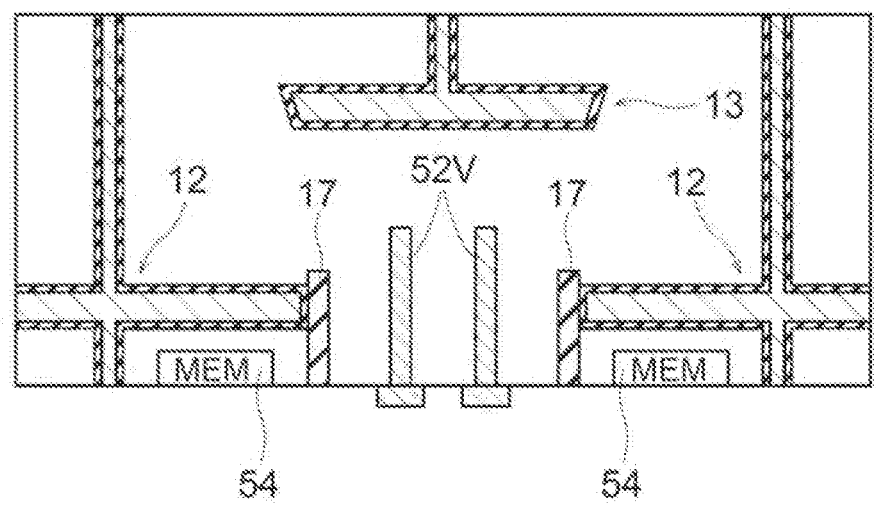
FIG. 17C is a sectional view of an imaging apparatus according to a modification example of FIG. 17B.

FIG. 17C is a sectional view of the imaging apparatus 101 according to a modification example of FIG. 17B. In FIG. 17C, the vertical light shielding portions 12V of the second light shielding unit 12 penetrates from the front surface 11A to the rear surface 11B of the semiconductor substrate 11. In this manner, the vertical light shielding portions 12V of the second light shielding unit 12 also function as the second element separation units 20. In the imaging apparatus 101 in FIG. 17C, effects similar to that of the second element separation units 20 can be obtained without forming the second element separation units 20, and it is thus possible to omit time and efforts to separately form the second element separation units 20. Also, the horizontal light shielding portions 12H of the second light shielding unit 12 can be provided at arbitrary depth positions in the semiconductor substrate 11 in FIG. 17C as well.

Figure 17D:
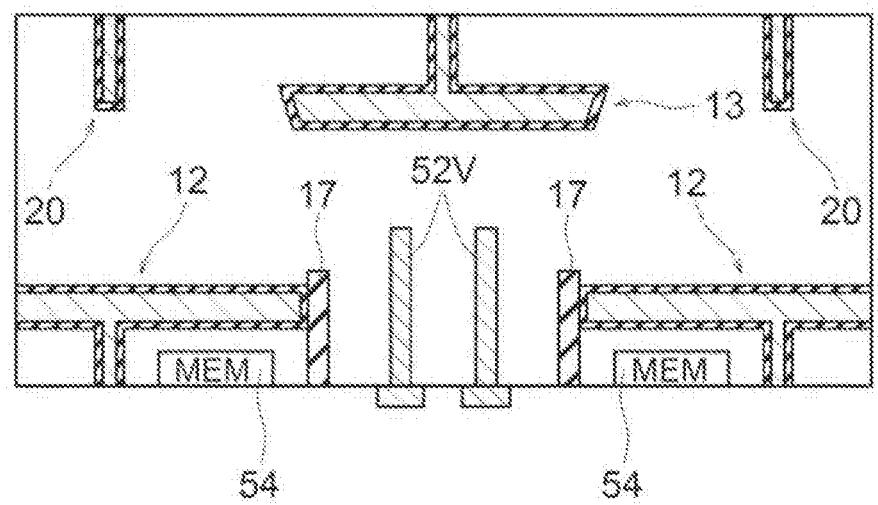
FIG. 17D is a sectional view including the second light shielding unit and the element separation unit in addition to the first light shielding unit with a T-shaped section.

FIG. 17D includes a structure similar to that of the imaging apparatus 101 according to the first embodiment, and the second light shielding unit 12 and the second element separation units 20 are included in addition to the first light shielding unit 13 with a T-shaped section. Although the number of manufacturing processes increases since it is necessary for the second light shielding unit 12, the first light shielding unit 13, and the second element separation units 20 to be separately formed for the imaging apparatus 101 in FIG. 17D, both the effects of curbing color mixing and noise reduction can be obtained.

Figure 17E:
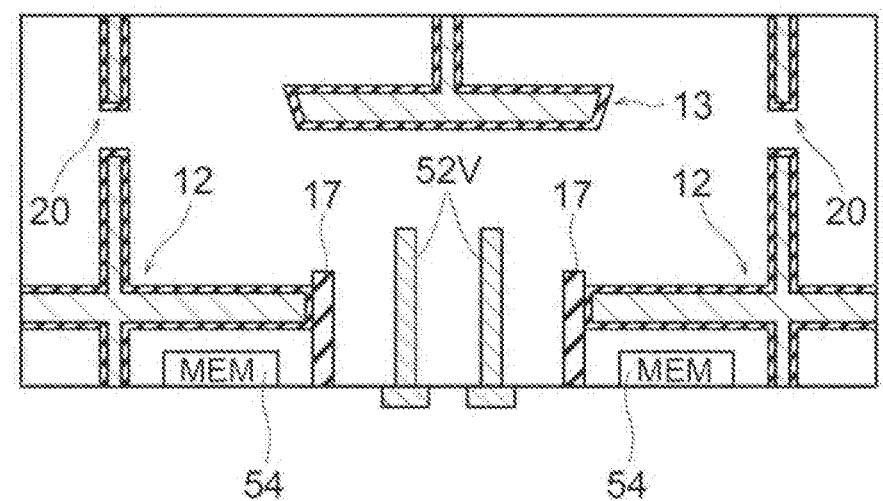
FIG. 17E is a sectional view of the second light shielding unit 12 with a cross-shaped section.

FIG. 17E is different from FIG. 17D in that the section of the second light shielding unit 12 has a cross shape instead of a T shape. In FIG. 17E, since the vertical light shielding portions 12V of the second light shielding unit 12 and the second element separation units 20 are disposed to face each other, and the region therebetween is narrowed, light is less likely to be incident on other adjacent sensor pixels 121, and it is possible to reduce crosstalk between the pixels.

Figure 17F:
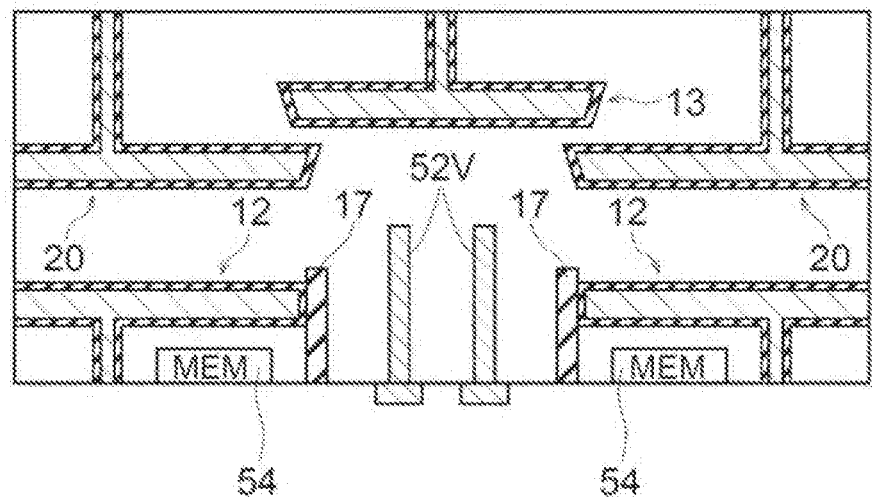
FIG. 17F is a sectional view of the imaging apparatus 101 in which both the sections of the first light shielding unit 13 and the second element separation units 20 have T shapes.

FIG. 17F is a sectional view of the imaging apparatus 101 in which both the sections of the first light shielding unit 13 and the second element separation units 20 have a T shape. In the example in FIG. 17F, the height of the horizontal light shielding portion 13H of the first light shielding unit 13 is lower than the height of the horizontal light shielding portions of the second element separation units 20. Therefore, the light that is incident from the rear surface 11B is less likely to enter the adjacent sensor pixels 121. It is desirable that the height of the vertical light shielding portion 13V of the first light shielding unit 13 be set to be different from the height of the vertical light shielding portions 20V of the second element separation units 20 and the distance between the horizontal light shielding portion 13H of the first light shielding unit 13 and the horizontal light shielding portions 20H of the second element separation units 20 in the depth direction be maximized to prevent movement of the electrons generated by the photoelectric conversion unit 51 from being hindered by the horizontal light shielding portion 13H of the first light shielding unit 13 and the horizontal light shielding portions 20H of the second element separation units 20.

Figure 17G:
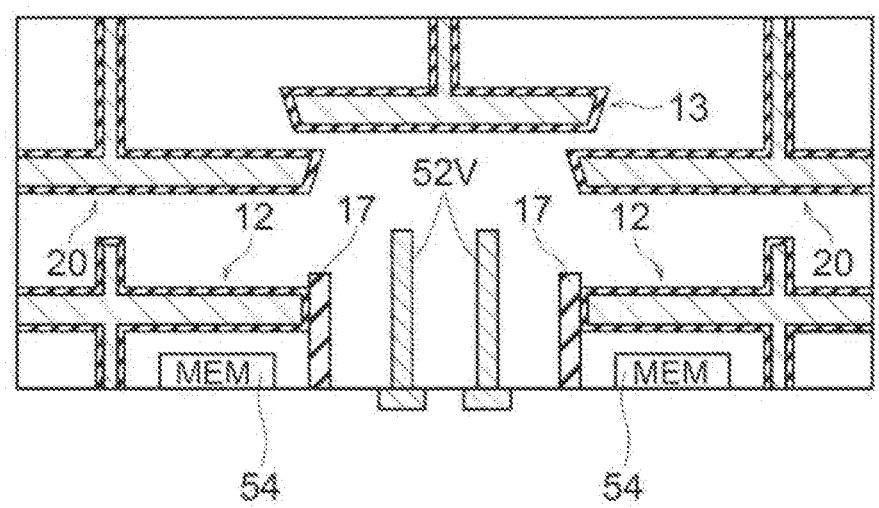
FIG. 17G is a sectional view of the imaging apparatus 101 according to a first modification example of FIG. 17F.

FIG. 17G is a sectional view of an imaging apparatus 101 according to a first modification example of FIG. 17F. The imaging apparatus 101 in FIG. 17G is different from the imaging apparatus 101 in FIG. 17F in that the section of the second light shielding unit 12 has a cross shape instead of a T shape. Since the distance between the vertical light shielding portions 12V of the second light shielding unit 12 and the horizontal light shielding portions 20H of the second element separation units 20 is shortened in the case of FIG. 17G, it is possible to reduce leakage of light to the adjacent sensor pixels 121 and to reduce crosstalk between the pixels.

Figure 17H:
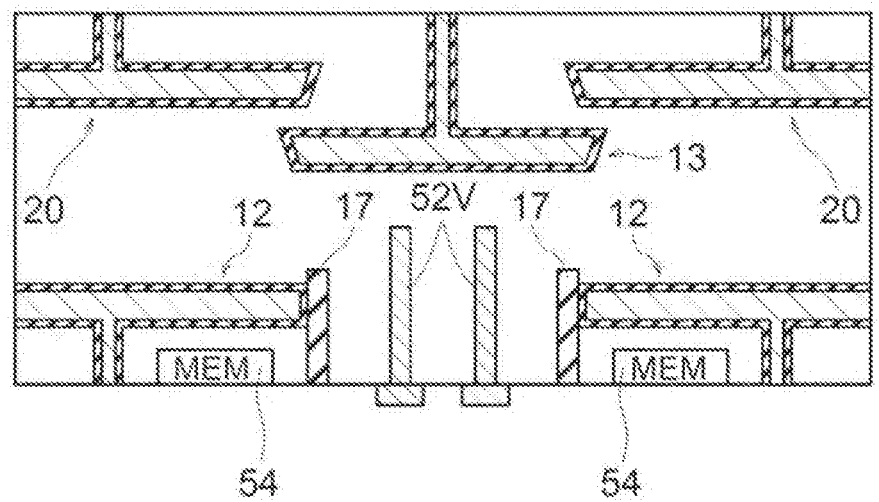
FIG. 17H is a sectional view of the imaging apparatus 101 according to a second modification example of FIG. 17F.

FIG. 17H is a sectional view of an imaging apparatus 101 according to a second modification example of FIG. 17F. The imaging apparatus 101 in FIG. 17H is different from that in FIG. 17F in that the height of the horizontal light shielding portion 13H of the first light shielding unit 13 from the rear surface 11B is higher than the height of the horizontal light shielding portions of the second element separation units 20 from the rear surface 11B. Since the horizontal light shielding portion 13H of the first light shielding unit 13 is disposed to be closer to the vertical gate electrode 52V, it is possible to further prevent light from being incident on the vertical gate electrode 52V, and noise has less influences.

Figure 17I:
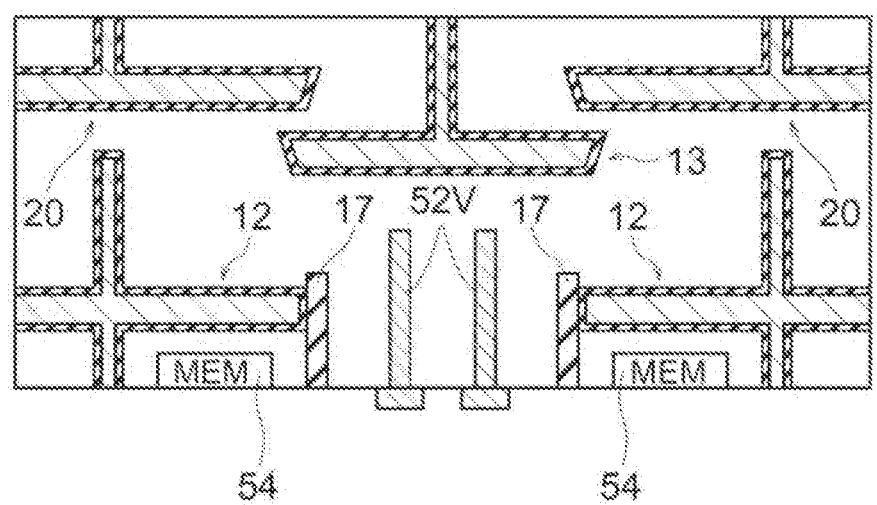
FIG. 17I is a sectional view of the imaging apparatus 101 according to a first modification example of FIG. 17H.
Figure 17J:
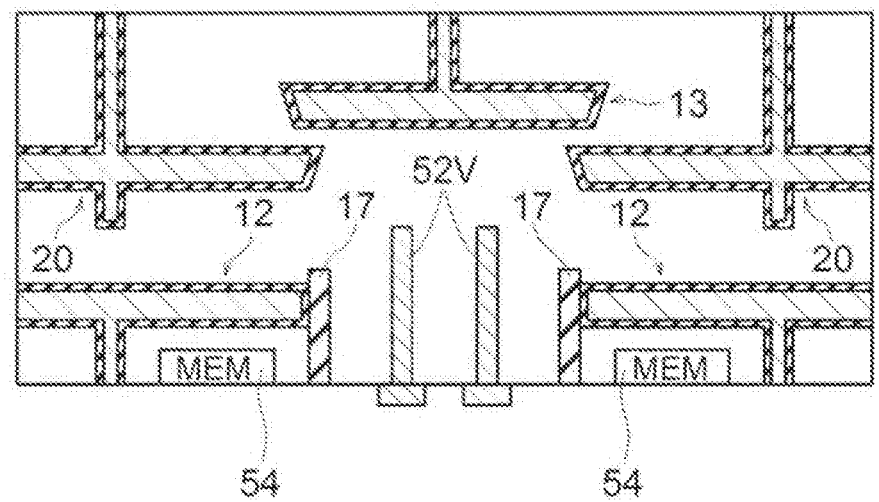
FIG. 17J is a sectional view of the imaging apparatus 101 according to a second modification example of FIG. 17H.

FIG. 17I is a sectional view of an imaging apparatus 101 according to a first modification example of FIG. 17H. The imaging apparatus 101 in FIG. 17I is different from that in FIG. 17H in that the section of the second light shielding unit 12 has a cross shape instead of a T shape. On the other hand, FIG. 17J is a sectional view of an imaging apparatus 101 according to a second modification example of FIG. 17H. The imaging apparatus 101 in FIG. 17J is different from that in FIG. 17H in that the section of the second element separation units 20 has a cross shape instead of a T shape. Both the imaging apparatuses 101 in FIGS. 17I and 17J can reduce a probability of light being incident on the adjacent sensor pixels 121.

Figure 17K:
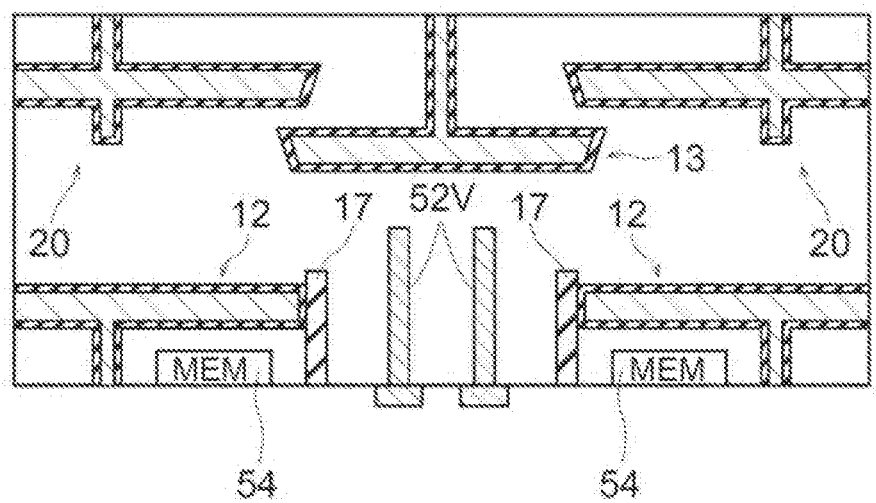
FIG. 17K is a sectional view of the imaging apparatus 101 according to a modification example of FIG. 17J.

FIG. 17K is a sectional view of an imaging apparatus 101 according to a modification example of FIG. 17J. In the imaging apparatus 101 in FIG. 17K, the horizontal light shielding portion 13H of the first light shielding unit 13 is disposed on a side closer to the front surface 11A than the horizontal light shielding portions 20H of the second element separation units 20. Therefore, the distance between the horizontal light shielding portions 12H of the second light shielding unit 12 and the vertical light shielding portions 20V of the second element separation units 20 in the imaging apparatus 101 in FIG. 17K is longer than that in the imaging apparatus 101 in Fig. J, and it is possible to further curb leakage of light in FIG. 17J than in FIG. 17K in terms of leakage of light to the adjacent sensor pixels 121.

Figure 17L:
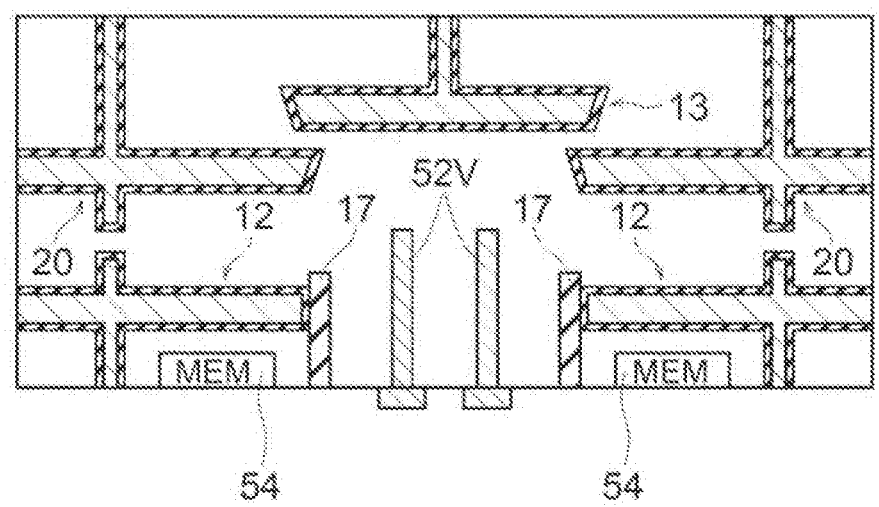
FIG. 17L is a sectional view of the imaging apparatus in which sections of the second light shielding unit and the element separation unit have cross shapes.
Figure 17M:
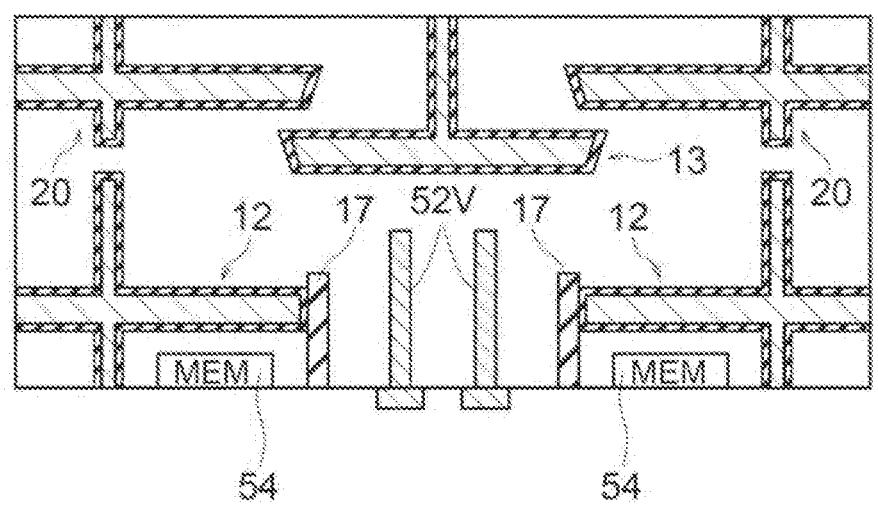
FIG. 17M is a sectional view of the imaging apparatus in which sections of the second light shielding unit and the element separation unit have cross shapes.

FIGS. 17L and 17M are sectional views of an imaging apparatus 101 in which both the sections of the second light shielding unit 12 and the second element separation units 20 have cross shapes. In FIGS. 17L and 17M, the heights of the horizontal light shielding portion 13H of the first light shielding unit 13 and the horizontal light shielding portions 20H of the second element separation units 20 are the opposite.

Figure 17N:
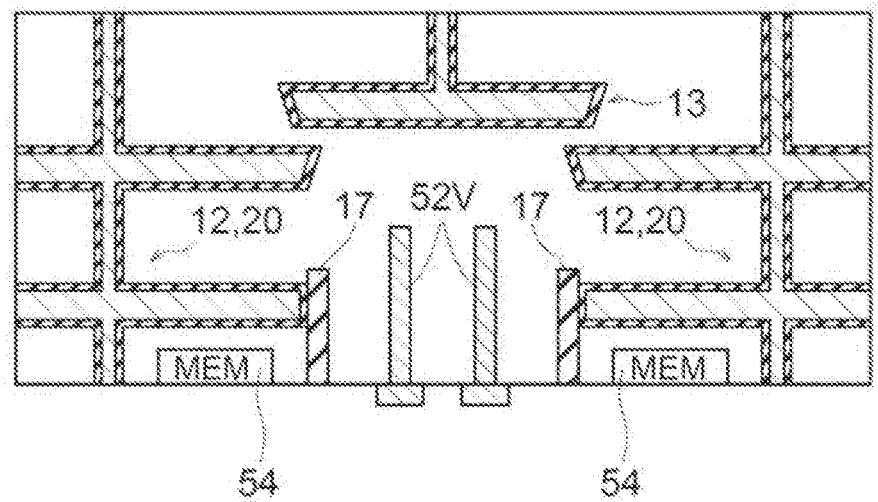
FIG. 17N is a sectional view of the imaging apparatus in which the second light shielding unit and the element separation unit are provided as an integrated structure and a vertical light shielding portion penetrating from a surface 11A to a rear surface of the semiconductor substrate is provided.
Figure 17O:
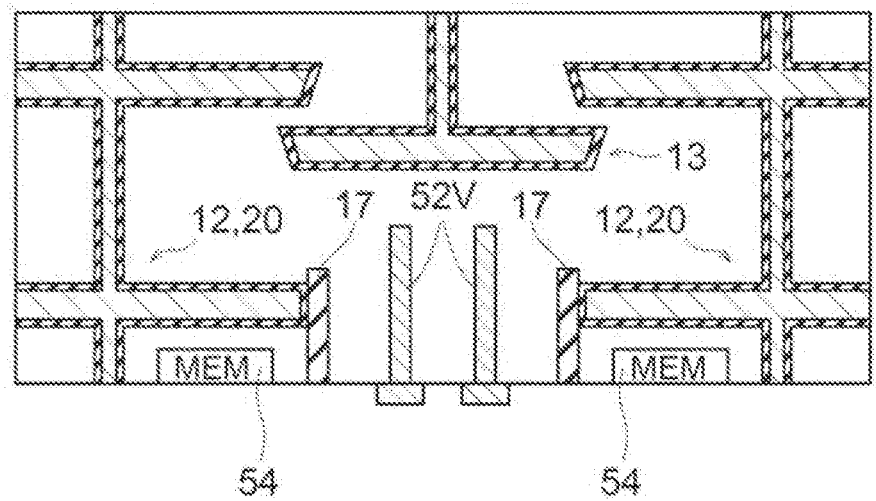
FIG. 17O is a sectional view of the imaging apparatus in which the second light shielding unit and the element separation unit are provided as an integrated structure and a vertical light shielding portion penetrating from a surface 11A to a rear surface of the semiconductor substrate is provided.

FIGS. 17N and 17O are sectional views of an imaging apparatus 101 in which vertical light shielding portions penetrating from the front surface 11A to the rear surface 11B of the semiconductor substrate 11 are provided with the second light shielding unit 12 and the second element separation units 20 formed as an integrated structure. In FIGS. 17N and 17O, the height of the horizontal light shielding portion 13H of the first light shielding unit 13 and the horizontal light shielding portions of the second element separation units 20 are the opposite. Both in FIGS. 17N and 17O, the boundaries between the adjacent sensor pixels 121 are locked with the vertical light shielding portions penetrating from the front surface 11A to the rear surface 11B of the semiconductor substrate 11, and it is thus possible to reliably prevent light leakage due to color mixing.

Note that only some representative examples of combinations of the first light shielding unit 13 with a T-shaped section, the second light shielding unit 12 with various sectional shapes, and the second element separation units 20 with various sectional shape have been illustrated in FIGS. 17A and 17O and combinations of sectional shapes, which are not illustrated, may be employed.

Figure 17P:
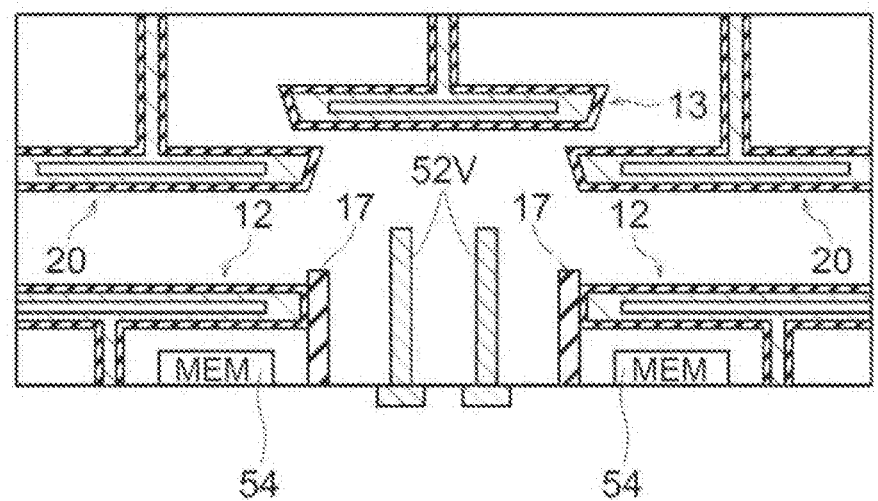
FIG. 17P is a sectional view in a case in which a gap is generated in an inner layer portion.
Figure 17Q:
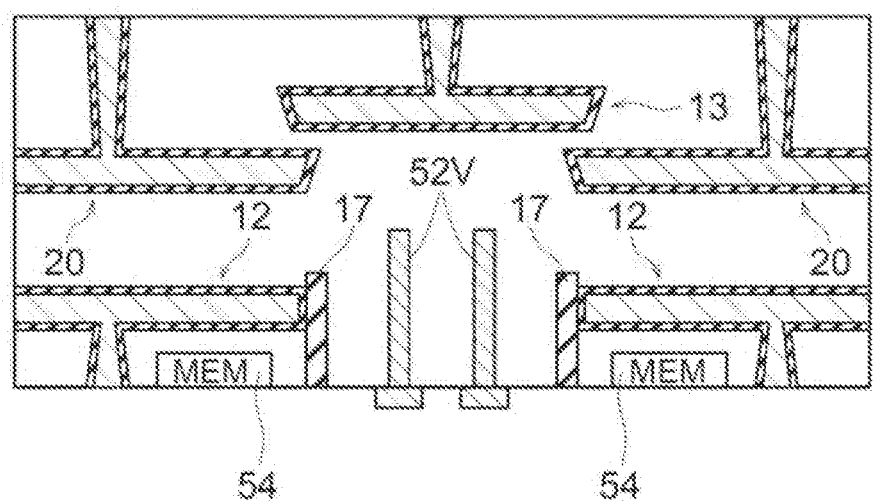
FIG. 17Q is a sectional view of the imaging apparatus with a tapered vertical light shielding portion.

In a case in which volumes of the space 13Z and the space 12Z of the horizontal light shielding portion 13H of the first light shielding unit 13 and the horizontal light shielding portions 12H of the second light shielding unit 12 manufactured in the manufacturing process in FIGS. 17A, 17B, 17C, 17D, 17D, 17E, 17F, 17G, 17H, 17I, 17J, 17K, 17L, 17M, 17N and 17O are large, a gap (void) may occur even if the inner layer portion is filled as in FIG. 17P, but there are no problems in performance, in particular. Also, the vertical light shielding portions 13V and 12V may be tapered as in FIG. 17Q in practice. In the specification, a case in which the vertical light shielding portions have a shape that does not completely perpendicularly intersect the horizontal plane of the semiconductor substrate 11 and intersects the horizontal plane is also included in the concept of the vertical light shielding portions.

In this manner, according to the second embodiment, light that is incident on the vertical gate electrode 52V and the electrical charge holding unit (MEM) 54 is curbed, and leakage of light to adjacent sensor pixels 121 is also prevented while keeping movement of the electrical charge generated by the photoelectric conversion unit 51 not prevented as much as possible, by changing the sectional shapes of the second light shielding unit 12 in various manners in addition to the first light shielding unit 13 with a T-shaped section. Also, it is possible to reliably prevent leakage of light to the adjacent sensor pixels 121 by providing the second element separation units 20 with various shapes in addition to the first light shielding unit 13 with a T-shaped section and the second light shielding unit 12 with various sectional shapes.

Third Embodiment

In an imaging apparatus 101 with a sectional structure illustrated in FIGS. 4A and 4B, an $N^-$-type semiconductor region 51A is included on the side of a rear surface 11B inside the photoelectric conversion unit 51, an N-type semiconductor region 51B is included thereon, and a potential gradient and an impurity concentration gradient are present only in the depth direction of the semiconductor substrate 11. On the other hand, since the potential gradient and the impurity concentration gradient are not present in the horizontal direction (substrate surface direction) of the semiconductor substrate 11, there is a problem that electrons generated by the photoelectric conversion unit 51 are unlikely to move in the horizontal direction. Although it is necessary for the electrons generated near the vertical light shielding portion 13V of the first light shielding unit 13 to move to the vertical gate electrode 52V by bypassing the horizontal light shielding portion 13H since the horizontal light shielding portion is an obstacle in the imaging apparatus 101 illustrated in FIG. 16, for example, there are no potential gradient and impurity concentration gradient in the horizontal direction of the semiconductor substrate 11, and it is thus not easy to move the electrons in the horizontal direction.

Thus, the imaging apparatus 101 according to the third embodiment is provided with an impurity concentration gradient in the horizontal direction inside the photoelectric conversion unit 51 to cause the electrons to easily move in the horizontal direction.

Figure 18A:
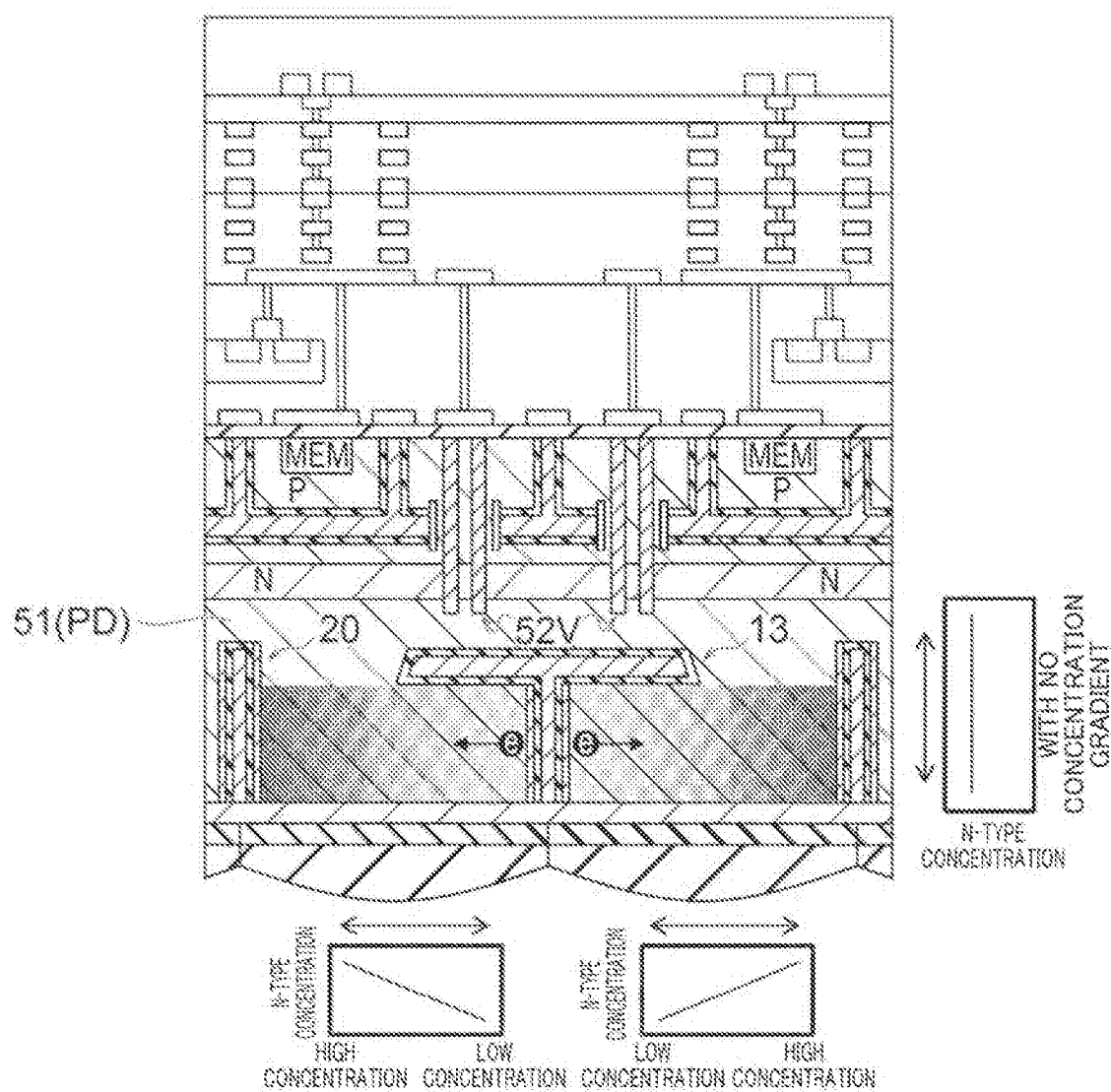
FIG. 18A is a sectional view of an imaging apparatus according to a third embodiment.

FIG. 18A is a sectional view of the imaging apparatus 101 according to the third embodiment. The sectional view illustrates a sectional structure in the direction of the line A-A in FIG. 3, and the basic sectional structure is similar to that in FIG. 5. In FIG. 18A, gradation is schematically applied to the impurity concentration gradient inside the photoelectric conversion unit 51, and a part that is closer to black represents a higher impurity concentration while a part that is closer to white represents a lower impurity concentration. A simple graph illustrating an impurity concentration gradient is shown next to the sectional view in FIG. 18A. In these graphs, the horizontal axis represents position coordinates in the horizontal direction, and the vertical axis represents an N-type impurity concentration. As illustrated in these graphs, the N-type impurity concentration increases toward the vertical light shielding portions of the second element separation units 20 in the horizontal direction with reference to the vertical light shielding portion 13V of the first light shielding unit 13. On the other hand, the concentration of the N⁻-type semiconductor region in the depth direction inside the photoelectric conversion unit 51 is substantially constant. Note that although the N-type impurity concentration substantially linearly changes in FIG. 18A, the N-type impurity concentration may change in a non-linear manner.

In the specification, the region from the horizontal light shielding portion 13H to the side of the rear surface 11B in the photoelectric conversion unit 51 will be referred to as a first region, and the region from the horizontal light shielding portion 13H to the side of the front surface 11A in the photoelectric conversion unit 51 will be referred to as a second region. In FIG. 18A, the N-type impurity concentration gradient is included in the horizontal direction inside the first region.

In this manner, the N-type impurity concentration is set to be lower toward the side closer to the vertical light shielding portions of the second element separation units 20, and the N-type impurity concentration is set to be higher toward the side closer to the vertical light shielding portions 12V of the second light shielding unit 12, in the imaging apparatus 101 in FIG. 18A. In this manner, the electrons generated through the photoelectric conversion on the side closer to the vertical light shielding portions of the second element separation units 20 are more likely to move near the second element separation units 20 on a high impurity concentration side. Since the impurity concentration gradient is originally provided in the depth direction of the semiconductor substrate 11, the electrons that have moved near the second element separation units 20 move to the side of the front surface 11A and is attracted to the vertical gate electrode VG since a positive potential is applied to the vertical gate electrode VG.

In a case in which there is no impurity concentration gradient in the horizontal direction of the semiconductor substrate 11, electrons generated on the side closer to the rear surface 11B than the horizontal light shielding portion 13H of the first light shielding unit 13 in the photoelectric conversion unit 51 are prevented from moving to the vertical gate electrode 52V with the horizontal light shielding portions functioning as obstacles. However, if the concentration gradient as in the drawing is included inside the photoelectric conversion unit 51, then the electrons is more likely to move in the direction of the second element separation units 20, and thereafter, the electrons move in the direction of the vertical gate electrode 52V in accordance with the impurity concentration gradient in the depth direction of the semiconductor substrate 11 and the positive potential applied to the vertical gate electrode 52V.

The vertical light shielding portions of the second element separation units 20 in FIG. 18A have a three-layer structure, for example, in which the innermost layer is a metal layer, a layer outside the metal layer is an N-type region, and the outermost layer is a P-type region. The N-type region and the P-type region are formed through solid-phase diffusion, for example. It is possible to increase the PN junction surface inside the photoelectric conversion unit 51 and to improve electrical charge generation efficiency when light is incident, by disposing the P-type region in the outermost layer of the vertical light shielding portions. As for the N-type impurity concentration gradient as in FIG. 18A, it is possible to gradually diffuse the N-type impurities in the horizontal direction of the photoelectric conversion unit 51 and to include a concentration gradient by forming an insulator of SiO2 or the like containing P (phosphorus) or As (arsenic) inside a trench and performing a heat treatment thereon in the solid phase diffusion process when the vertical light shielding portions of the second element separation units 20 are formed. In the example in FIG. 18A, a concentration gradient is included in the horizontal direction inside the range from the side of the rear surface 11B of the semiconductor substrate 11 to the horizontal light shielding portion 13H of the first light shielding unit 13. In this case, although electrons generated in the region in which the concentration gradient is included inside the photoelectric conversion unit 51 move in the direction of the second element separation units 20, there is a concern that the electrons generated on the side closer to the front surface 11A inside the photoelectric conversion unit 51 do not move near the vertical gate electrode 52V. Thus, the impurity concentration gradient may be included in the horizontal direction in a wider range in the photoelectric conversion unit 51.

Figure 18B:
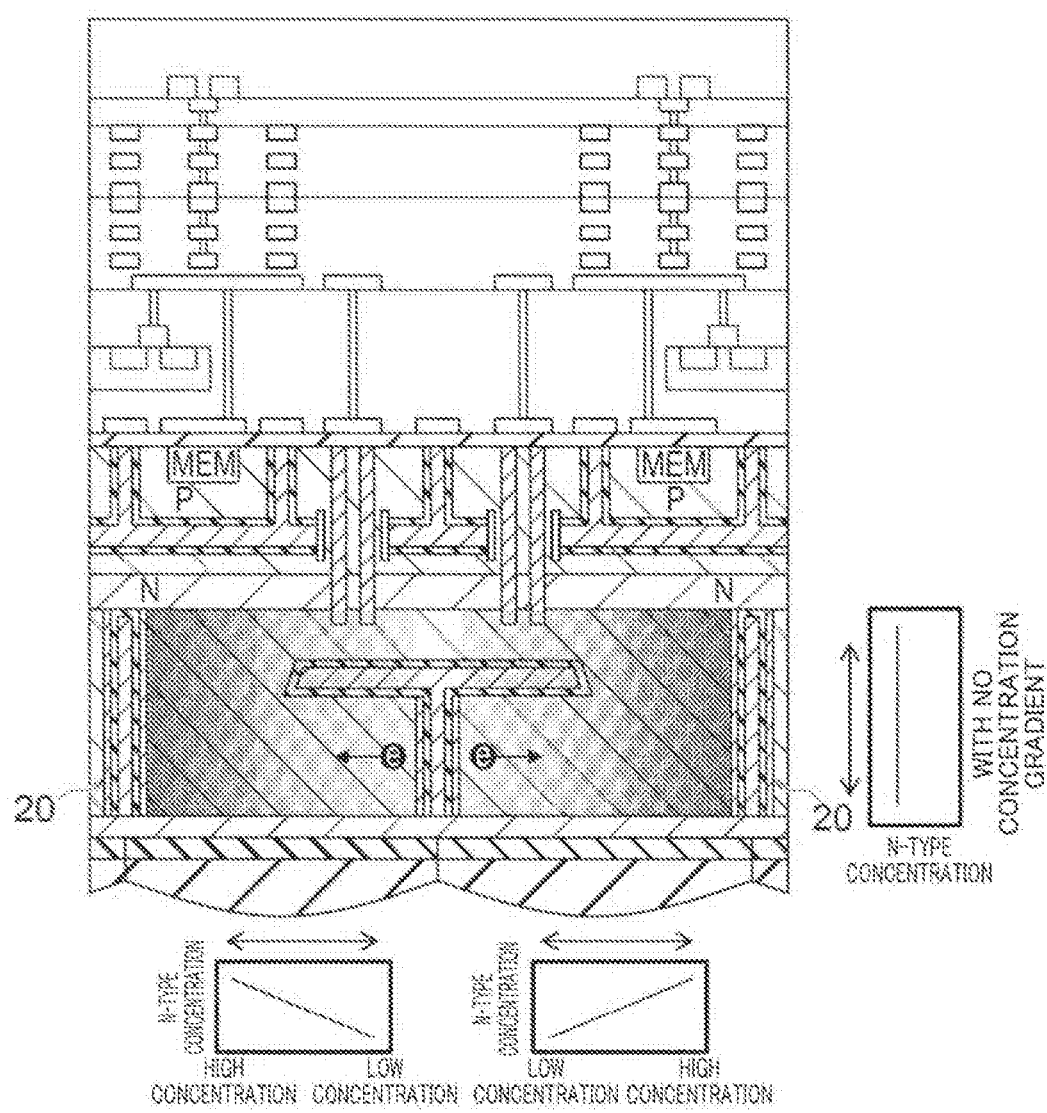
FIG. 18B is a schematic sectional view illustrating an example in which a concentration gradient in the horizontal direction is included within a wider range than that in FIG. 18A inside a photoelectric conversion unit.

FIG. 18B is a schematic sectional view illustrating an example in which a concentration gradient is included in the horizontal direction in the wider range than that in FIG. 18A inside the photoelectric conversion unit 51. FIG. 18B illustrates an example in which the second element separation units 20 have a longer length in the depth direction than the second element separation units 20 in FIG. 18A. The photoelectric conversion unit 51 has an impurity concentration gradient in the horizontal direction in a region corresponding to the length of the second element separation units 20 in the depth direction, that is, the aforementioned first region and the second region. In this case, electrons attracted near the second element separation units 20 move to the vertical gate electrode 52V through the N-type semiconductor region 51B, for example.

In order to cause the electrons that have been attracted near the second element separation units 20 to easily move to the vertical gate electrode 52V, a concentration gradient in the opposite direction may be included inside the photoelectric conversion unit 51 on the side closer to the front surface 11A than the horizontal light shielding portion 13H of the first light shielding unit 13.

Figure 18C:
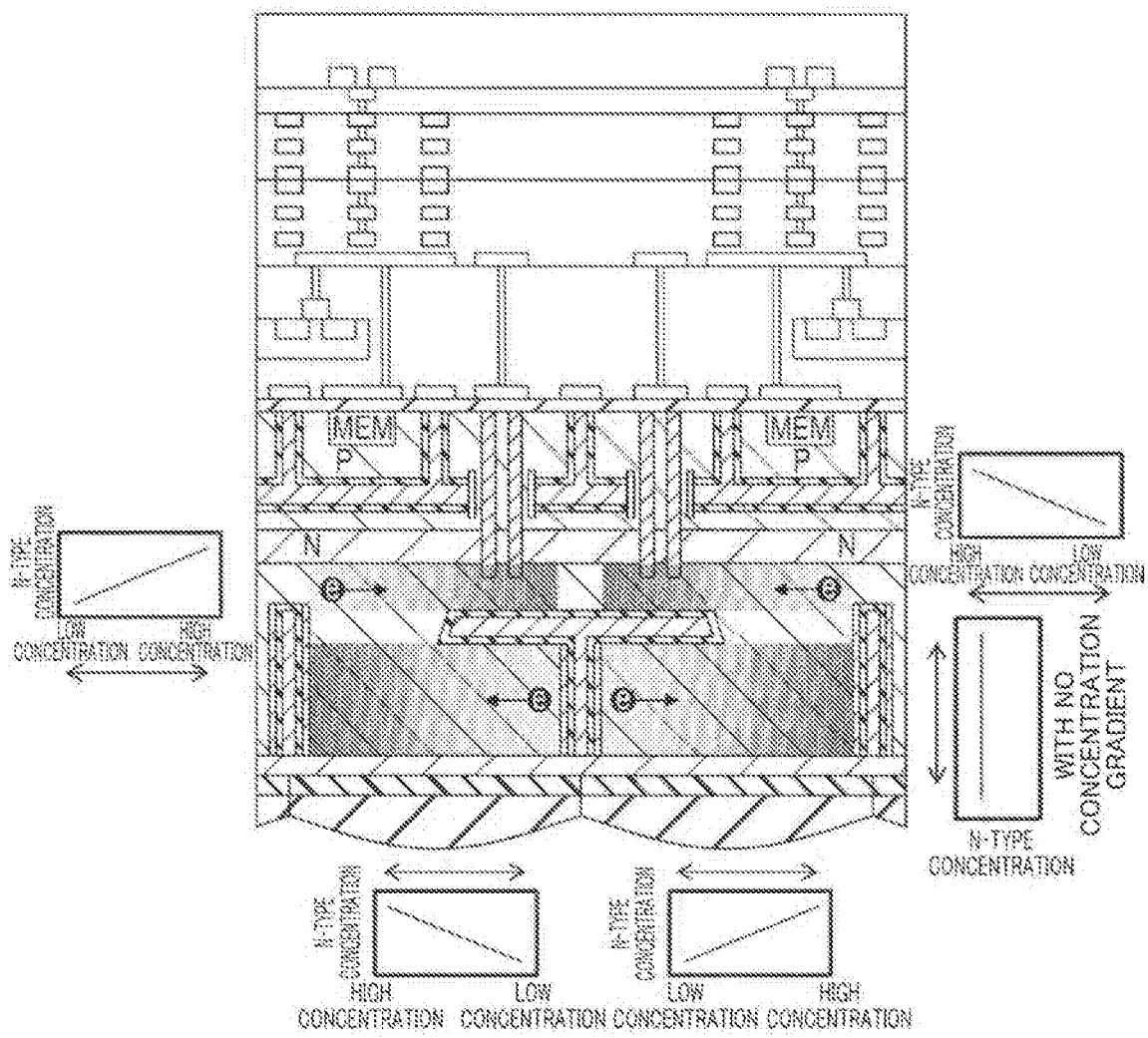
FIG. 18C is a schematic sectional view illustrating an example in which the concentration gradient in the photoelectric conversion unit is vertically inverted.

FIG. 18C is a schematic sectional view illustrating an example in which opposite concentration gradients are included inside the photoelectric conversion unit 51 on the side of the rear surface 11B and on the side of the front surface 11A from the horizontal light shielding portion 13H of the first light shielding unit 13. In the example in FIG. 18C, the impurity concentration is set to increase toward the second element separation units 20 similarly to FIGS. 18A and 18B on the side of the rear surface 11B from the horizontal light shielding portion 13H of the first light shielding unit 13, that is, in the first region. On the other hand, the impurity concentration is set to increase toward the vertical light shielding portion 13V of the first light shielding unit 13 on the side of the front surface 11A from the horizontal light shielding portion 13H of the first light shielding unit 13, that is, in the second region. In this manner, electrons that have been attracted near the second element separation units 20 slightly move to the side of the front surface 11A in accordance with an electric field in the depth direction and then move to the vertical gate electrode 52V in accordance with the concentration gradient in the opposite direction.

Figure 18D:
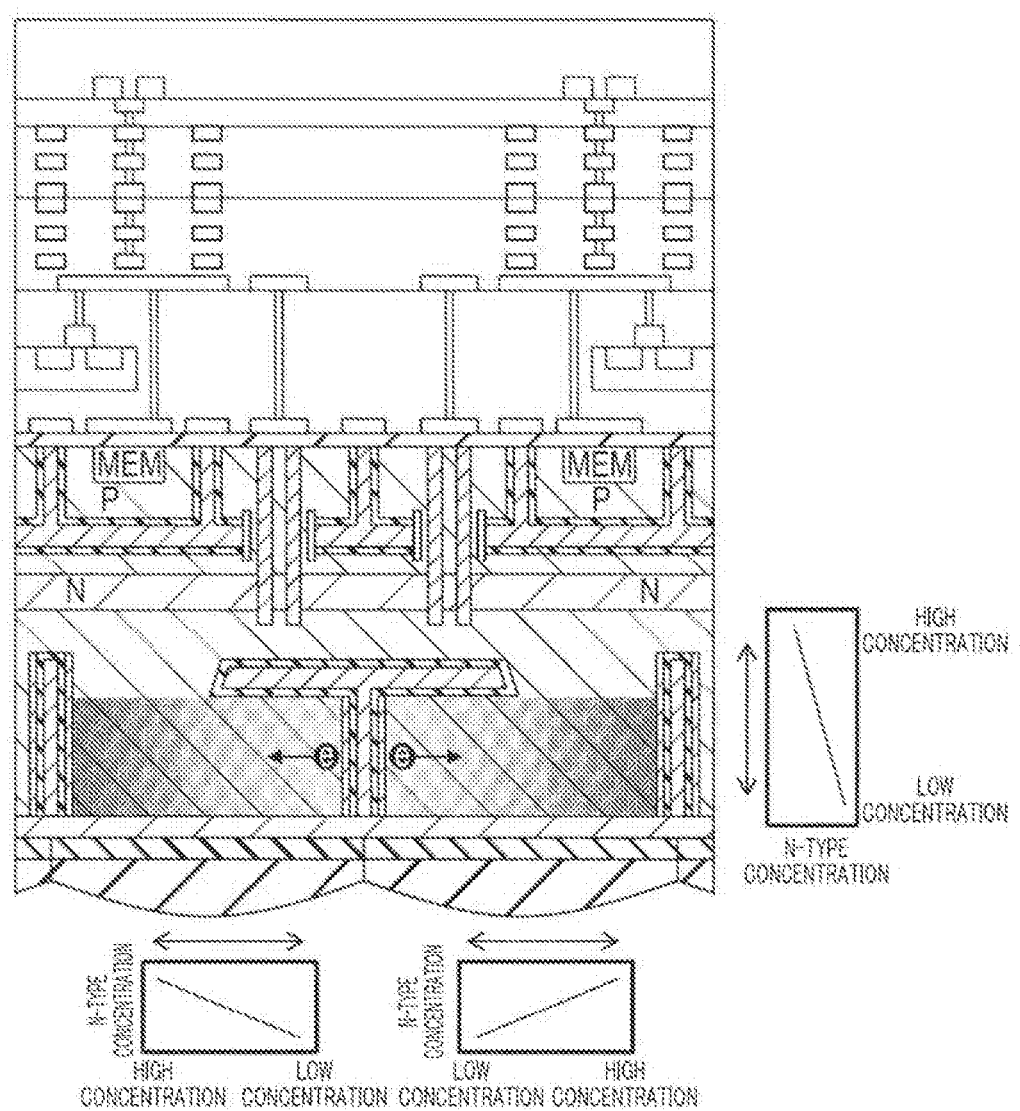
FIG. 18D is a sectional view illustrating an example in which a concentration gradient in a depth direction is included in addition to FIG. 18A.
Figure 18E:
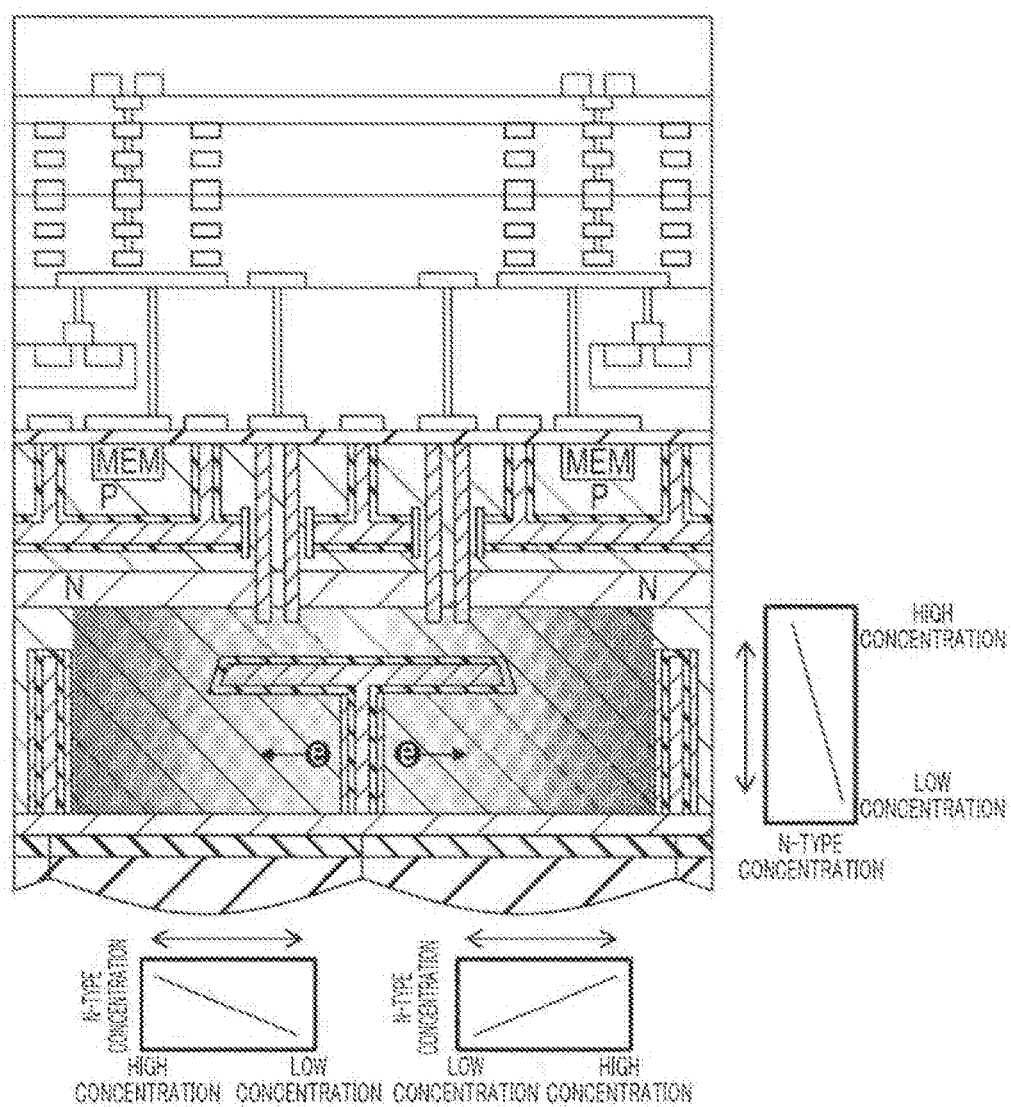
FIG. 18E is a sectional view illustrating an example in which a concentration gradient in a depth direction is included in addition to FIG. 18B.
Figure 18F:
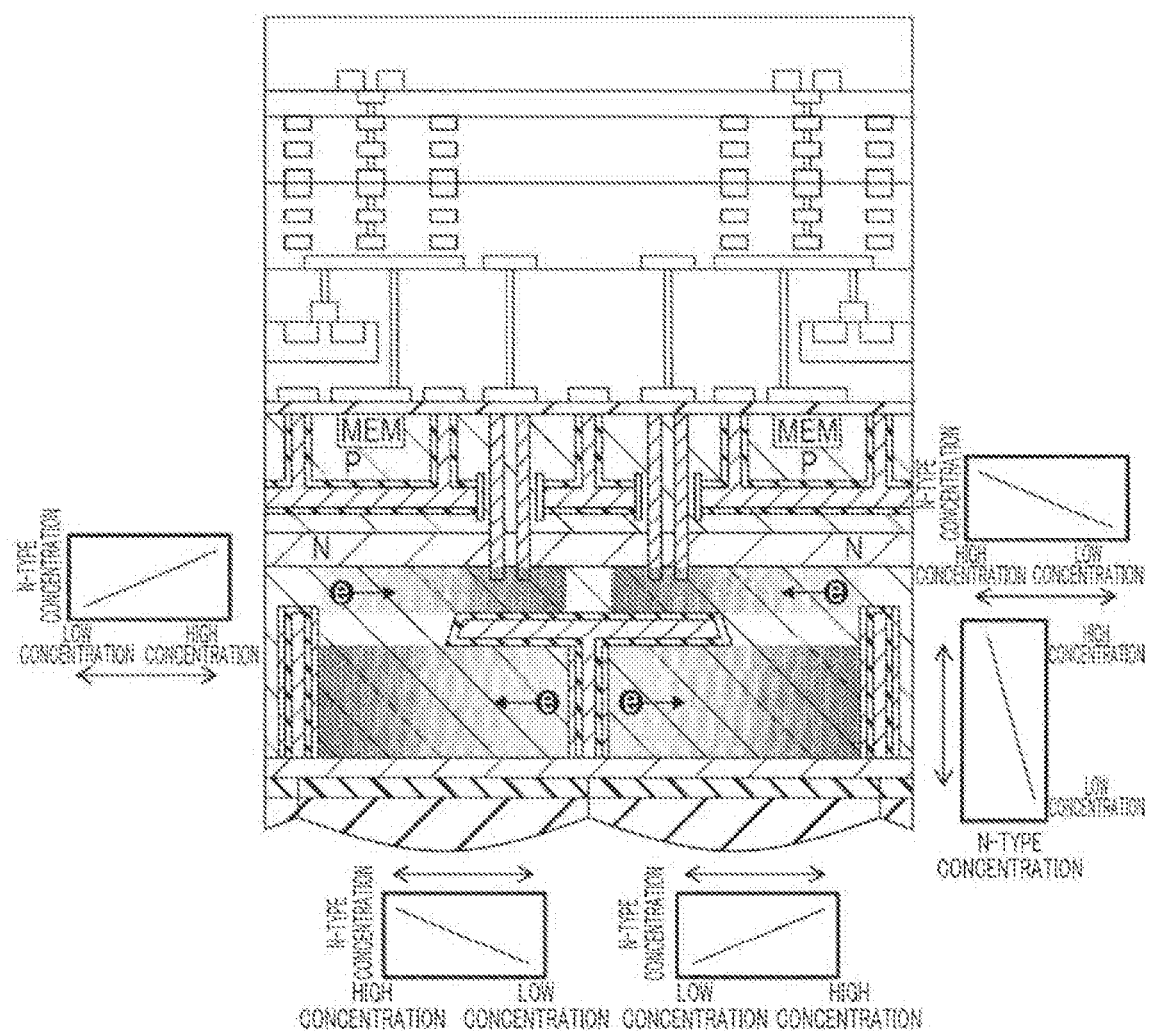
FIG. 18F is a sectional view illustrating an example in which a concentration gradient in a depth direction is included in addition to FIG. 18C.

Since a reverse bias is typically applied to the photoelectric conversion unit 51, an electric field is generated in the depth direction inside the photoelectric conversion unit 51, and electrons generated inside the photoelectric conversion unit 51 try to move to the side of the front surface 11A in accordance with the electric field. However, if structures such as the second light shielding unit 12, the first light shielding unit 13, and the second element separation units 20 are present, then movement of the electrons caused by the electric field is prevented. Thus, the N-type impurity concentration gradient may be included not only in the horizontal direction of the photoelectric conversion unit 51 but also in the depth direction as illustrated in FIGS. 18D, 18E, and 18F. Each of FIGS. 18D, 18E, and 18F illustrate an example in which a concentration gradient is included in the depth direction in addition to the concentration gradient in the horizontal direction in FIGS. 18A, 18B, and 18C. In this case, the N-type impurity concentration is set to increase toward the front surface 11A of the semiconductor substrate 11. The electrons that have been attracted near the second element separation units 20 are more likely to move to the side of the front surface 11A by including such concentration gradients in the horizontal direction and the vertical direction, more electrons can be collected by the vertical gate electrode 52V, and photoelectric conversion efficiency Qe, that is, sensitivity can be improved.

In this manner, since the impurity concentration gradient is included in the horizontal direction inside the photoelectric conversion unit 51 in the third embodiment, it is possible to cause the electrons generated on the side closer to the rear surface 11B than the horizontal light shielding portion 13H of the first light shielding unit 13 to move once in the direction of the second element separation units 20 and to prevent the concern that the horizontal light shielding portion 13H becomes an obstacle for movement of the electrons. Also, the electrons that have moved near the second element separation units 20 are more likely to move to the side of the front surface 11A by including the concentration gradient in the depth direction of the photoelectric conversion unit 51 as well, the electrons are more likely to be collected by the vertical gate electrode 52V, and photoelectric conversion efficiency Qe, that is, sensitivity can be improved.

Fourth Embodiment

Figure 19:
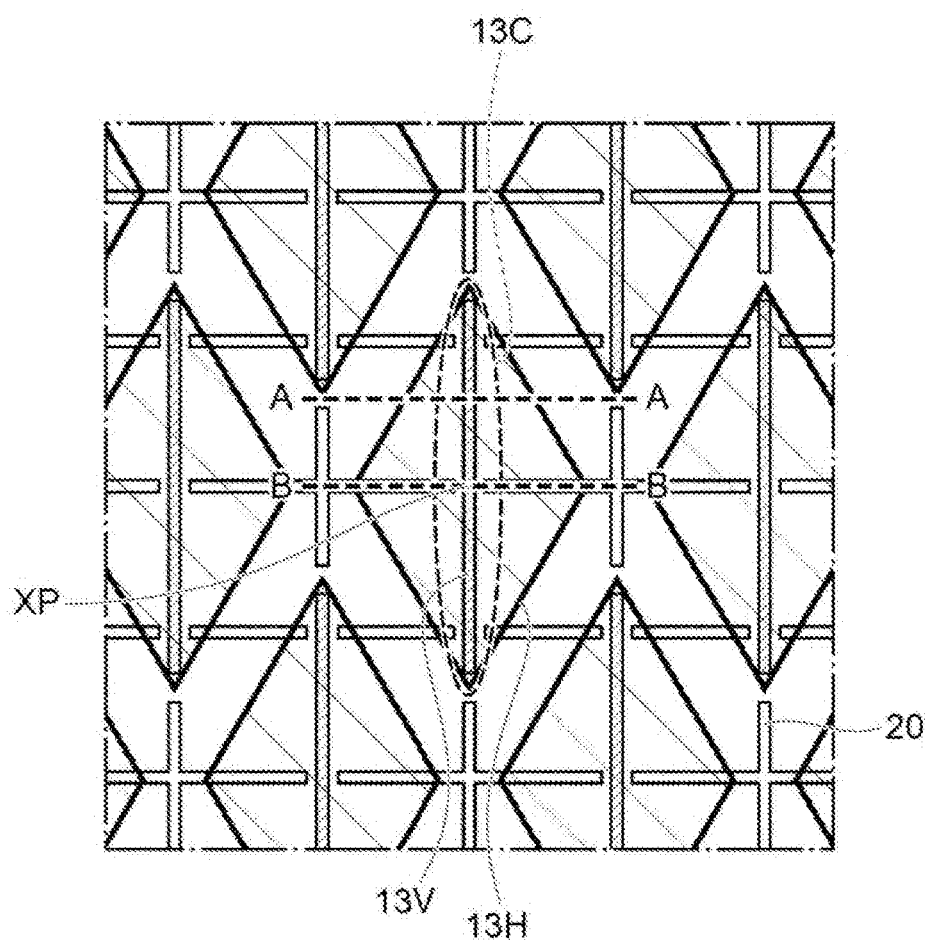
FIG. 19 is a plan view schematically illustrating a configuration of pixels 121A and 121B according to a fourth embodiment.
Figure 20A:
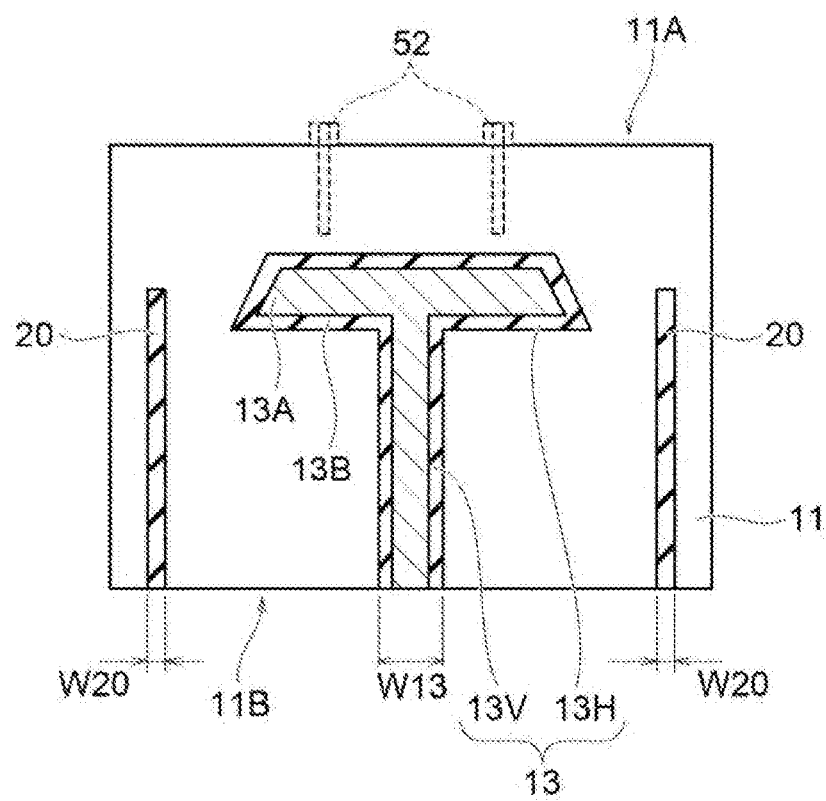
FIG. 20A is a sectional view along the line A-A in FIG. 19.
Figure 20A:
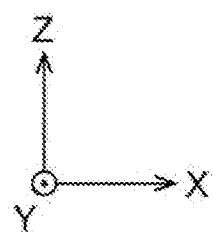
Figure 20B:
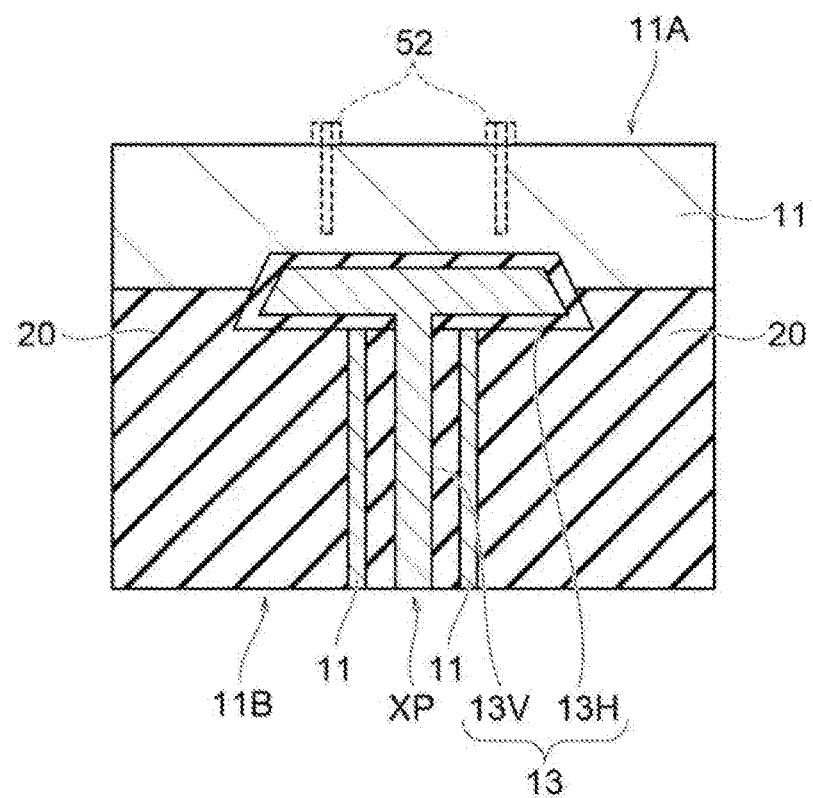
FIG. 20B is a sectional view along the line B-B in FIG. 19.

FIG. 19 is a plan view schematically illustrating configurations of sensor pixels 121A and 121B according to a fourth embodiment. FIG. 20A is a sectional view along the line A-A in FIG. 19. FIG. 20B is a sectional view along the line B-B in FIG. 19. In the fourth embodiment, configurations of a first light shielding unit (first element separation unit) 13 and second element separation units 20 will be described in more detail. Note that FIG. 19 illustrates a plane of a semiconductor substrate 11 seen from the side of a rear surface 11B. FIGS. 20A and 20B are sectional views with the upper end corresponding to a front surface 11A and with the lower end corresponding to the rear surface 11B.

As illustrated in FIG. 19, the first and second element separation units 13 and 20 are provided between a plurality of sensor pixels 121 and electrically or optically separate the plurality of sensor pixels 121. The first element separation unit 13 is constituted by horizontal light shielding portion 13H with substantially diamond shapes and vertical light shielding portion 13V provided in a diagonal direction (Y direction) of the horizontal light shielding portion 13H similarly to the aforementioned embodiment. On the other hand, the second element separation units 20 do not include the horizontal light shielding portions and are constituted only by the horizontal light shielding portions. Although not illustrated here, the vertical gate electrode 52V that is a part of the transfer transistor TRZ is provided immediately above a part near each of four corners of a cross point XP at which the first and second element separation units 13 and 20 intersect each other and is disposed at a position overlapping the horizontal light shielding portion 13H in a plan view (see FIGS. 20A and 20B). In this manner, light can be shielded by the horizontal light shielding portion 13H for the vertical gate electrode 52V.

Note that in the present disclosure, the first and second element separation units 13 and 20 are separated from each other without overlapping or connected to each other. For example, the vertical light shielding portion 13V of the first element separation unit 13 extends in the Y direction as illustrated in FIG. 19, is separated from the second element separation units 20 similarly extending in the Y direction, and is also separated from the second element separation units 20 disposed in the X direction. In this manner, it is possible to curb the trenches of the first and second element separation units 13 and 20 from being excessively deep at the cross point XP at which the first and second element separation units 13 and 20 intersect each other. As illustrated in FIG. 20B, for example, end portions of the vertical light shielding portions of the second element separation units 20 extending in the X direction are located before connection to the vertical light shielding portion 13V of the first element separation unit 13 extending in the Y direction and are not connected to the vertical light shielding portions 20V of the second element separation units 20 extending in the X direction and the vertical light shielding portion 13V of the first element separation unit 13 extending in the Y direction. In this manner, it is possible to prevent a disadvantage that the depths of the trenches for the vertical light shielding portions become excessively deep at the cross point XP between the first and second element separation units 13 and 20.

Referring to FIG. 20A, the first element separation unit 13 includes the vertical light shielding portion 13V and the horizontal light shielding portion 13H, an end portion of the vertical light shielding portion 13V is connected to the horizontal light shielding portion 13H, and the section in the depth direction have T shapes. Also, the second element separation units 20 do not include the horizontal light shielding portions and are constituted only by the vertical light shielding portions 20V. Note that as described above, the second element separation units 20 may also be provided with the horizontal light shielding portions 20H.

The first element separation unit 13 includes the inner layer portion 13A and an outer layer portion 13B as described above. The inner layer portion 13A is made of a light shielding material, which may be at least one type of a single metal, a metal alloy, a metal nitride, or metal silicide.

The outer layer portion 13B is a material covering the inner layer portion 13A, has a lower refractive index than that of the semiconductor substrate 11 (silicon, for example), and has a lower light extinction coefficient K than that of the inner layer portion 13A. For example, the outer layer portion 20B is constituted by an insulating material such as SiO2, SiN, SiCN, SiON, Al2O3, SiOC, TiO2, or Ta2O5.

Figure 21A:
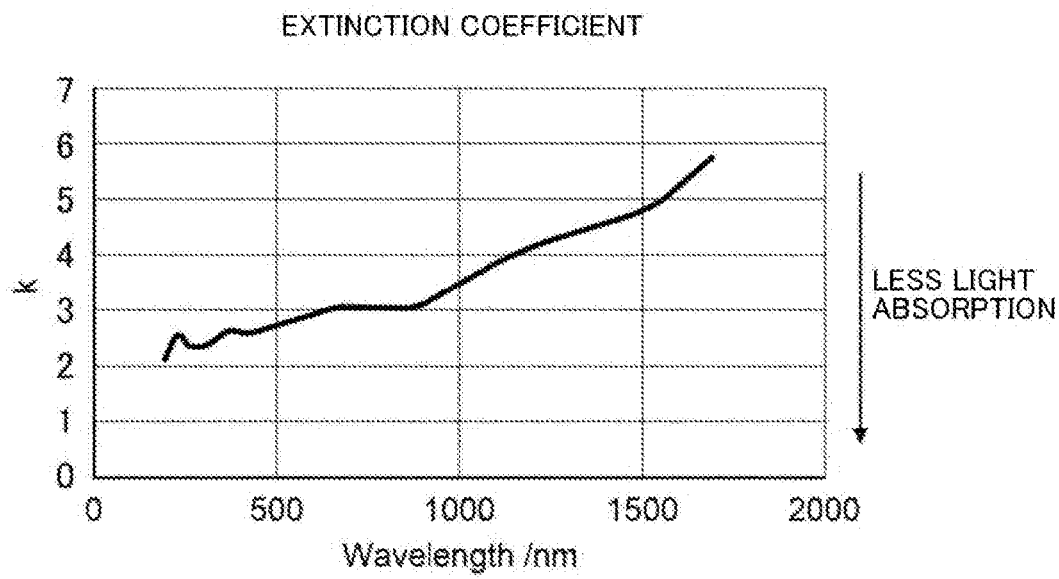
FIG. 21A is a graph illustrating an extinction coefficient of tungsten as an example of a material of the inner layer portion 13A.
Figure 21B:
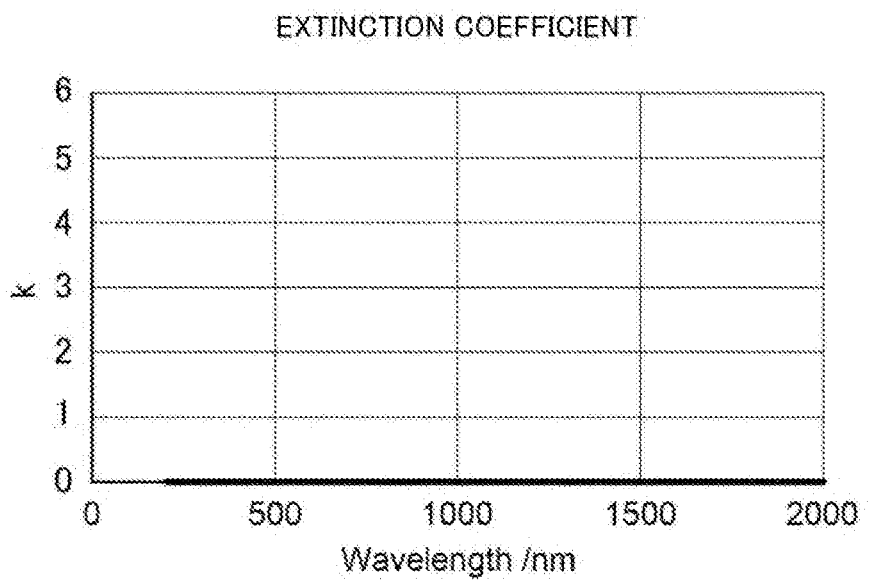
FIG. 21B is a graph illustrating an extinction coefficient of a silicon oxide film as an example of a material of an outer layer portion 13B.

FIG. 21A is a graph illustrating an extinction coefficient of tungsten as an example of the material for the inner layer portion 13A. FIG. 21B is a graph illustrating an extinction coefficient of a silicon oxide film as an example of the material for the outer layer portion 13B. In a case in which tungsten is used as the inner layer portion 13A and a silicon oxide film is used as the outer layer portion 13B, the extinction coefficient of the outer layer portion 13B is lower than that of the inner layer portion 13A. Therefore, since the inner layer portion 13A absorbs incident light while the outer layer portion 13B hardly absorbs incident light, the first element separation unit 13 has an excellent light shielding property.

Figure 22A:
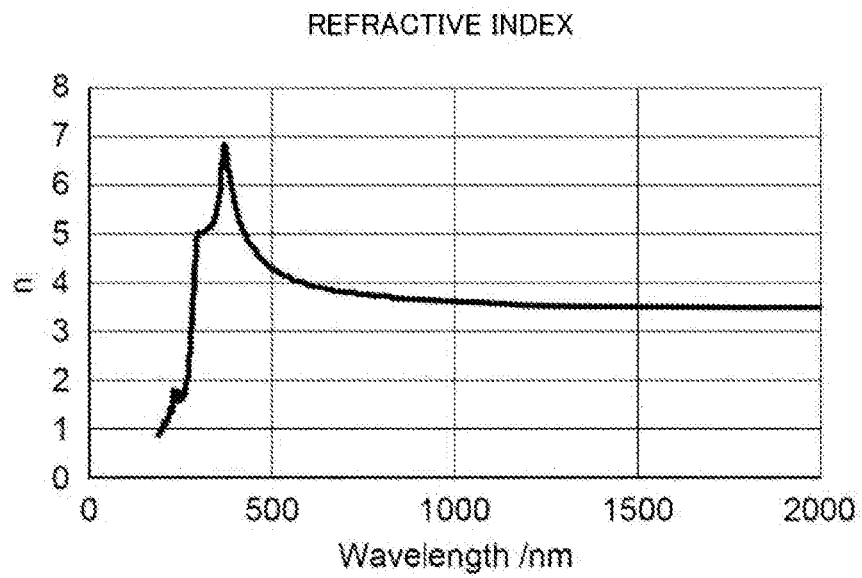
FIG. 22A is a graph illustrating a refractive index of a silicon monocrystal as an example of the semiconductor substrate 11.
Figure 22B:
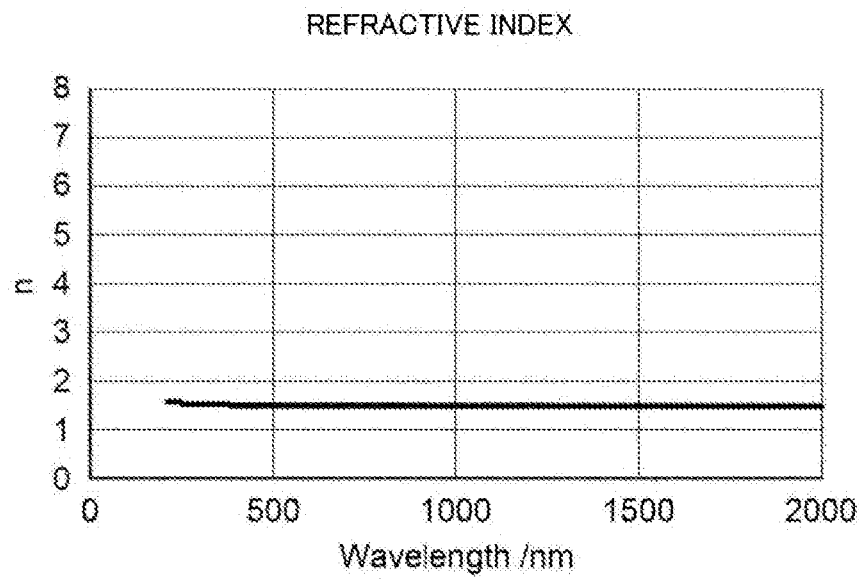
FIG. 22B is a graph illustrating a reflective index of a silicon oxide film as an example of a material of the outer layer portion 13B.

FIG. 22A is a graph illustrating a refractive index of a silicon monocrystal as an example of the semiconductor substrate 11. FIG. 22B is a graph illustrating a refractive index of a silicon oxide film as an example of the material for the outer layer portion 13B. In a case in which silicon is used as the semiconductor substrate 11, and a silicon oxide film is used as the outer layer portion 13B of the first element separation unit 13 and the second element separation units 20, incident light from the semiconductor substrate 11 is likely to be reflected at the interface between the first element separation unit 13 or the second element separation units 20 and the semiconductor substrate 11. Note that the refractive index of silicon is 3.9 and the refractive index of the silicon oxide film is 1.46 with respect to incident light with a wavelength of 633 nm, for example. In this case, the refraction angle of the incident light from the semiconductor substrate 11 to the first element separation unit 13 or the second element separation units 20 is greater than the incident angle, and the light is likely to be fully reflected.

Electrical insulation between the inner layer portion 13A and the semiconductor substrate 11 is secured by covering the inner layer portion 13A with the outer layer portion 13B. Additionally, since the outer layer portion 13B has a lower refractive index than that of the semiconductor substrate 11 and has a lower light extinction coefficient K than that of the inner layer portion 13A, the first element separation unit 13 can reflect the incident light at the interface between the outer layer portion 13B and the semiconductor substrate 11. In this manner, it is possible to improve photoelectric conversion efficiency Qe. Moreover, since the inner layer portion 13A has a relatively high light extinction coefficient K and has a light shielding property, the first element separation unit 13 does not allow the incident light to penetrate therethrough even if the outer layer portion 13B is a transparent material. Therefore, the vertical light shielding portion 13V of the first element separation unit 13 can curb crosstalk between the pixels, and the horizontal light shielding portion 13H can curb entrance of noise into the transfer transistor TRZ.

On the other hand, the second element separation units 20 do not contain the material for the inner layer portion and are constituted only by a material similar to that of the outer layer portion 13B. In other words, the second element separation units 20 are made of a material that has a lower refractive index than that of the semiconductor substrate 11 and has a lower light extinction coefficient K than that of the inner layer portion 13A. The second element separation units 20 are constituted by a transparent insulating material, for example, and reflect the incident light at the interface between the second element separation units 20 and the semiconductor substrate 11 without extinguishing the incident light that much. In this manner, the second element separation units 20 can curb crosstalk between the pixels and further improve photoelectric conversion efficiency Qe.

Note that although the material of the second element separation units 20 may be the same material as that of the outer layer portion 13B, the material may be another material that is different from the material of the outer layer portion 13B as long as the material has the aforementioned property.

Here, a first width W13 of the vertical light shielding portion 13V of the first element separation unit 13 in the horizontal direction can be larger than a second width W20 of the second element separation units 20 in the horizontal direction. The reason is because the second element separation units 20 are formed only by the material for the outer layer portion 13B while the first element separation unit 13 has a two-layer structure of the outer layer portion 13B and the inner layer portion 13A. In a case in which the film thickness of the outer layer portion 13B is defined as x and the film thickness of the inner layer portion 13A is defined as y, for example, the first width W13 is preferably greater than 2x and smaller than 2x+2y. The second width W20 is preferably smaller than 2x.

Note that there is no problem if void remains to some extent inside the inner layer portion 13A of the horizontal light shielding portion 13H as long as the light shielding performance can be obtained. Therefore, the width (thickness) of the inner layer portion 13A in the Z direction may be greater than 2x+2y.

The B-B section in FIG. 20B includes the cross point XP at which the first and second element separation units 13 and 20 intersect each other. In the case of FIG. 20B, the semiconductor substrate 11 remains between the second element separation units 20 and the vertical light shielding portion 13V of the first element separation unit 13 at the cross point XP, and the second element separation units 20 are not in contact with the vertical light shielding portion 13V of the first element separation unit 13. On the other hand, the second element separation units 20 are in contact with the outer layer portion 13B of the horizontal light shielding portion 13H of the first element separation unit 13 inside the semiconductor substrate 11. This is because the second element separation units 20 function as the etching stoppers 17 for the first element separation unit 13 in the process for manufacturing the first and second element separation units 13 and 20.

Next, a method for manufacturing the first and second element separation units 13 and 20 will be described.

FIGS. 23A, 23B, 24A, 24B, 24C, 25A, 25B, 26A, and 26B are sectional views or plan views illustrating a method for forming the structure illustrated in FIG. 20A. Note that FIGS. 23A, 23B, 24A, 24B, 24C, 25A, 25B, 26A, and 26B illustrate a state in which working is performed form the rear surface 11B.

Figure 23A:
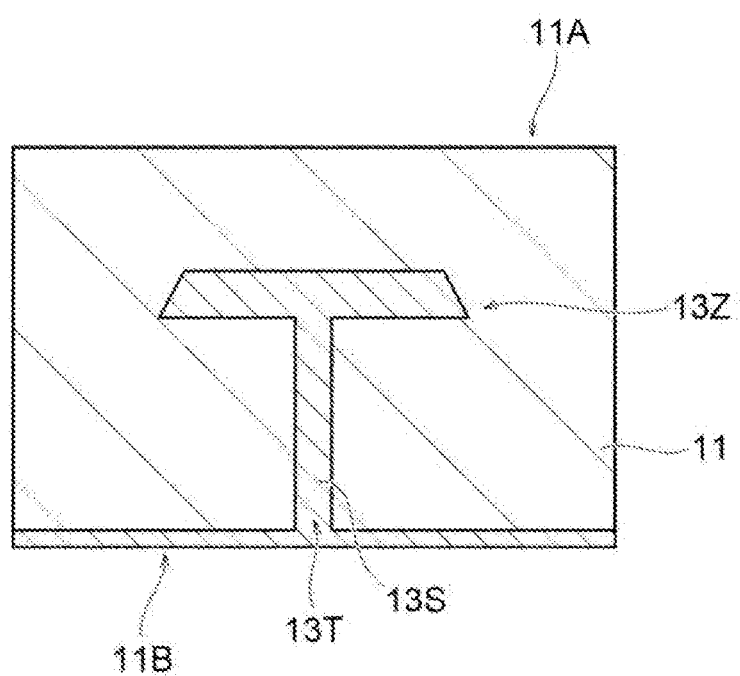
FIG. 23A is a sectional view of a process illustrating a method for forming the structure illustrated in FIG. 20A.
Figure 23A:
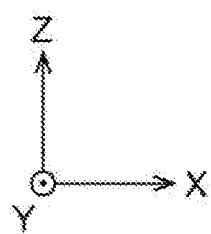
Figure 23B:
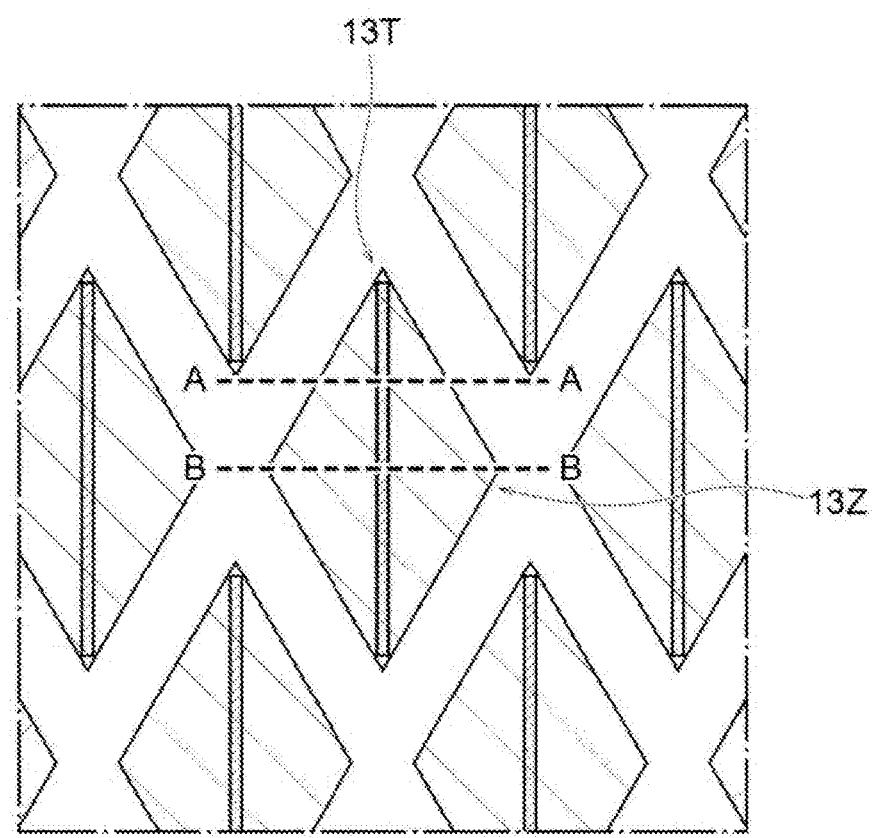
FIG. 23B is a plan view of the process illustrating the method for forming the structure illustrated in FIG. 20A.
Figure 23B:
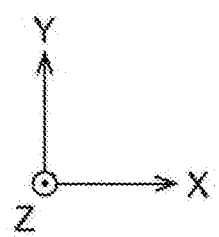

First, the method for forming the trench 13T and the space 13Z for the first element separation unit 13 is basically similar to the method for forming the trench 13T and the space 13Z described with reference to FIGS. 12P, 12Q, and 12R. In this manner, the structures illustrated in FIGS. 23A and 23B are obtained. The space 13Z is formed into substantially a diamond shape along the direction of the crystal plane as illustrated in FIG. 23B. However, a sacrificing film 13S is embedded in the trench 13T and the space 13Z as illustrated in FIG. 23A at this time. Both the section along the line A-A and the section along the line B-B in FIG. 23B are substantially the same as the section illustrated in FIG. 23A.

Figure 24A:
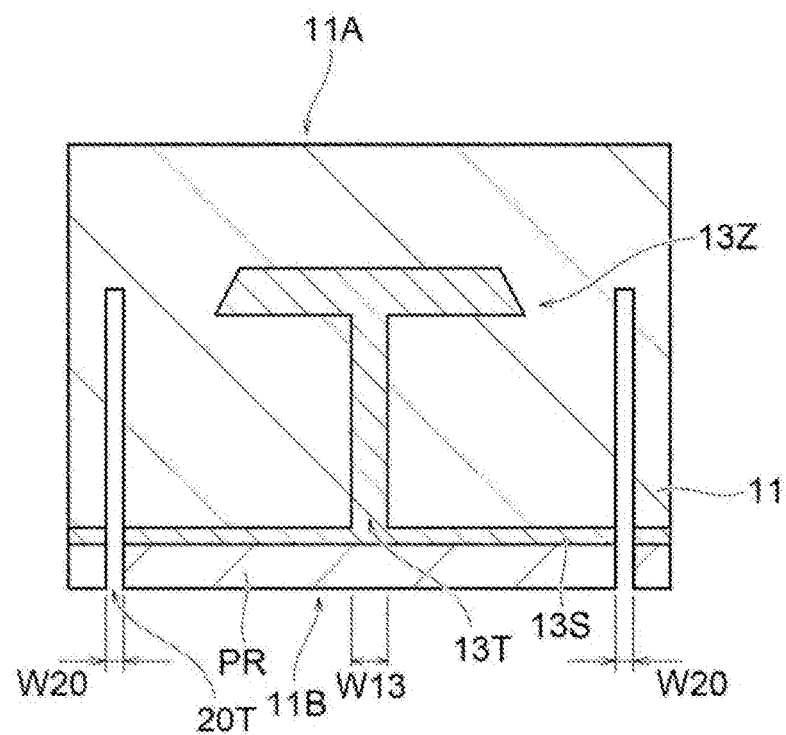
FIG. 24A is a sectional view along the line A-A in a process which is continuous with FIG. 23A.
Figure 24A:
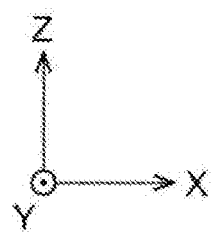
Figure 24B:
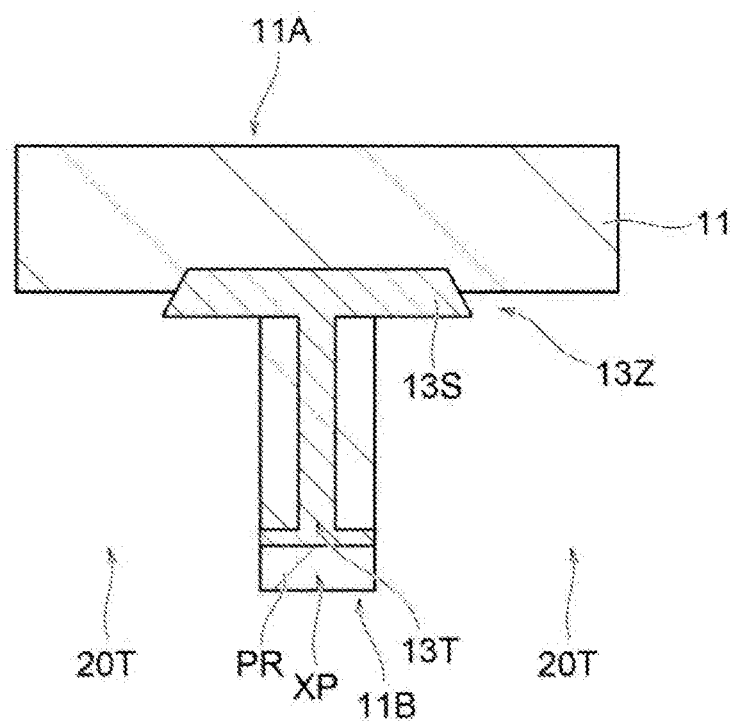
FIG. 24B is a sectional view along the line B-B in the process which is continuous with FIG. 23A.
Figure 24B:
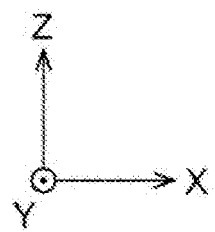
Figure 24C:
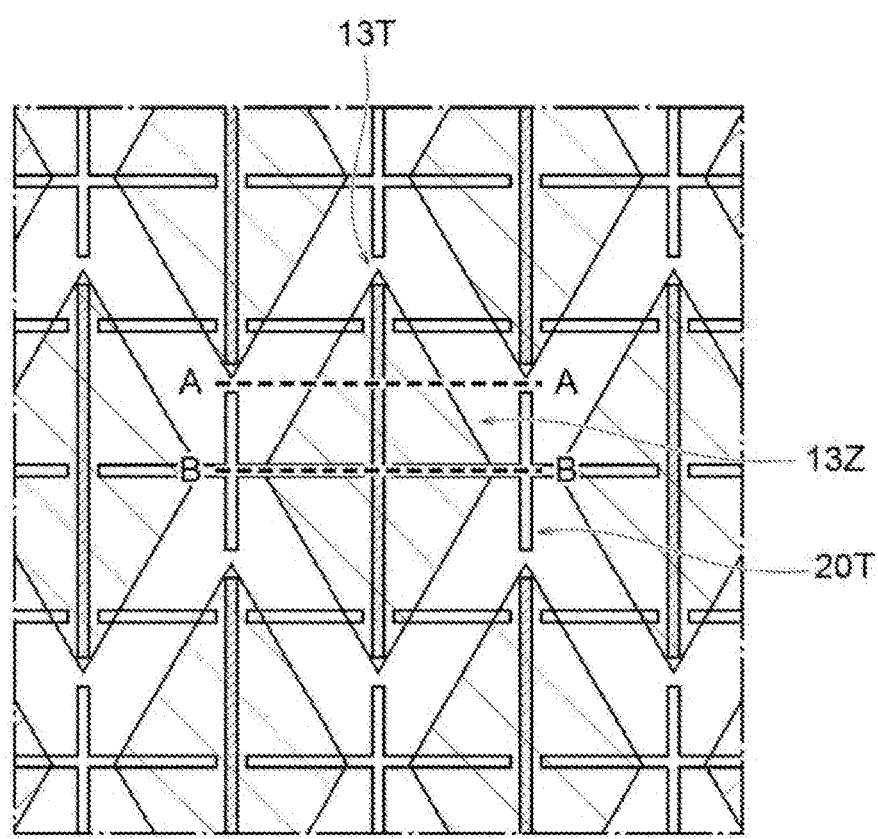
FIG. 24C is a plan view of a process which is continuous with FIG. 23B.
Figure 24C:
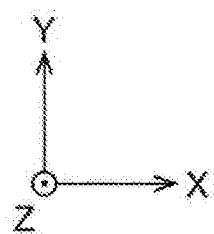

Next, the trench 20T is formed in the formation region of the second element separation units 20 using a lithography technology and an etching technology as illustrated in FIGS. 24A and 24B. FIG. 24A illustrates a section along the line A-A in FIG. 24C. FIG. 24B illustrates a section along the line B-B in FIG. 24C. At this time, the width W20 of the trench 20T for the second element separation units 20 is formed to be narrower than the width W13 of the trench 13T for the first element separation unit 13. Also, as illustrated in FIG. 24C, the trench 20T is formed between pixels other than the trench 13T.

Here, the cross point XP at which the first and second element separation units 13 and 20 intersect is covered with a resist PR, and the sacrificing film 13S of the trench 13T is left as illustrated in FIG. 24B. The other region in the trench 20T is etched. At this time, the sacrificing film 13S inside the space 13Z functions as the etching stopper 17. It becomes easy to control the depth of the trench 20T by stopping the etching at a timing at which the etching reaches the sacrificing film 13S inside the space 13Z.

Figure 25A:
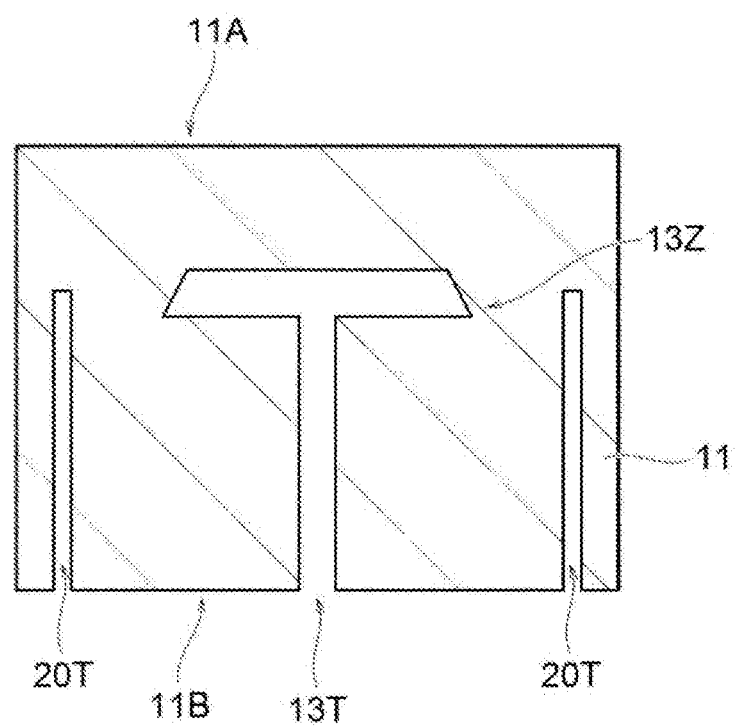
FIG. 25A is a sectional view along the line A-A in a process which is continuous with FIG. 24A.
Figure 25A:
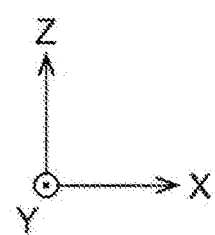
Figure 25B:
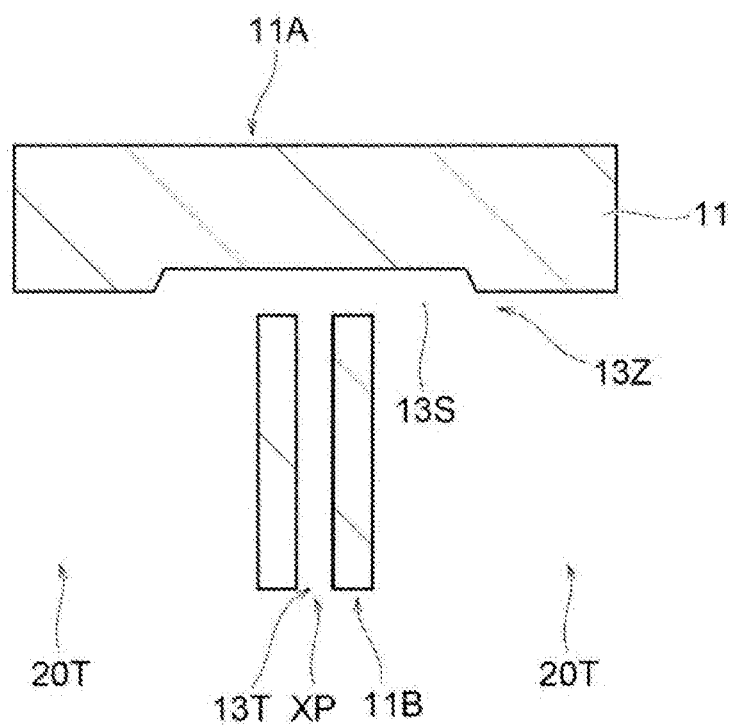
FIG. 25B is a sectional view along the line B-B in the process which is continuous with FIG. 24B.

As illustrated in FIGS. 25A and 25B, the sacrificing film 13S is removed after the resist PR is removed.

Figure 26A:
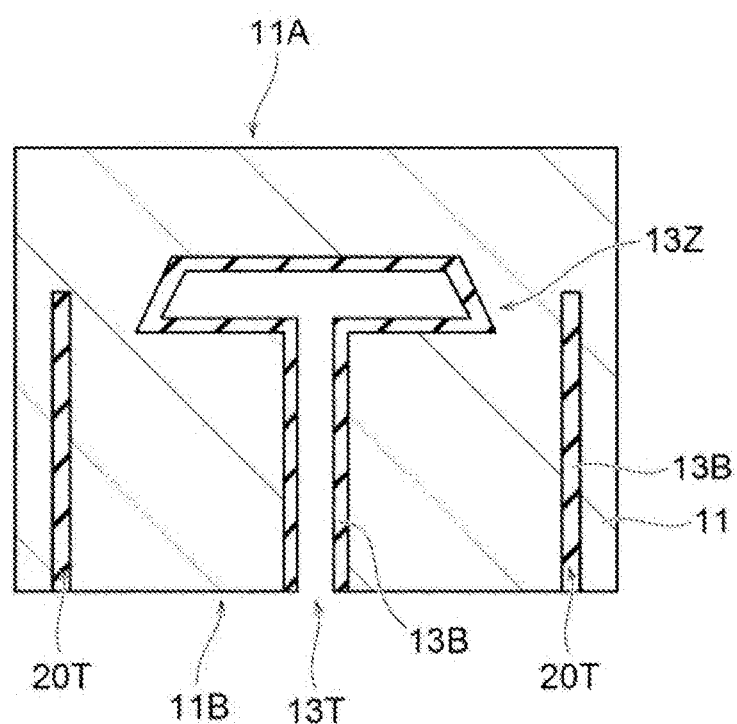
FIG. 26A is a sectional view along the line A-A in a process which is continuous with FIG. 25A.
Figure 26A:
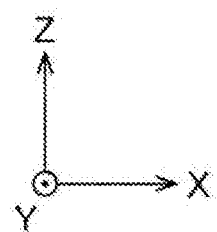
Figure 26B:
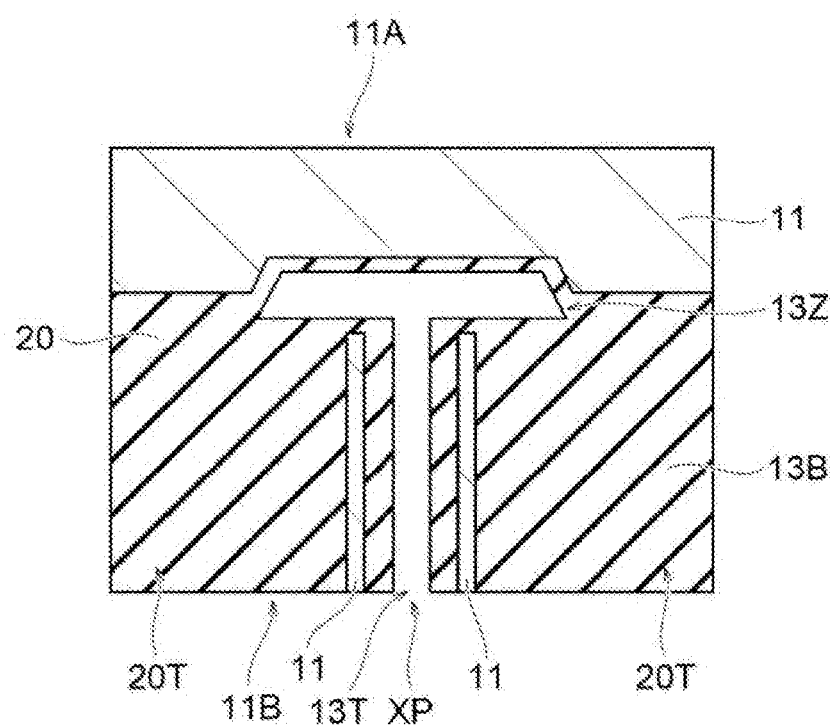
FIG. 26B is a sectional view along the line B-B in the process which is continuous with FIG. 25B.

Next, films of the material for the outer layer portion 13B are formed inside the trenches 13T and 20T and the space 13Z as illustrated in FIGS. 26A and 26B. At this time, the material for the outer layer portion 13B is accumulated such that the trench 20T is filled without filling the trench 13T and the space 13Z. In this manner, the outer layer portion 13B is formed inside the trench 13T and the space 13Z, and the trench 20T is filled with the material for the outer layer portion 13B, thereby forming the second element separation units 20. Note that the width W20 of the trench 20T for the second element separation units 20 is narrower than the width W13 of the trench 13T for the first element separation unit 13, the inside of the trench 20T is filled in a stage in which the trench 20T is filled with the material for the outer layer portion 13B, and the second element separation units 20 are completed.

On the other hand, since the inside of the trench 13T has not yet been filled, the trench 13T and the space 13Z are then filled with the material for the inner layer portion 13A. In this manner, the first element separation unit 13 is formed, and the structure illustrated in FIGS. 20A and 20B is obtained.

According to the fourth embodiment, since the refractive index of the outer layer portion 13B of the first element separation unit 13 is set to be lower than the refractive index of the semiconductor substrate 11, it is possible to reflect incident light by the interface between the outer layer portion 13B and the semiconductor substrate 11. In this manner, it is possible to cause the incident light to remain inside the pixels and to improve photoelectric conversion efficiency Qe. Also, since the inner layer portion 13A of the first element separation unit 13 has a relatively high light extinction coefficient K and a light shielding property, it is possible to absorb the incident light without allowing the incident light to penetrate therethrough. Therefore, even if the light reaches the inner layer portion 13A without being reflected by the outer layer portion 13B of the first element separation unit 13, the light is absorbed by the inner layer portion 13A, the light thus penetrates through the first element separation unit 13 and is not incident on the adjacent sensor pixels 121, and it is possible to prevent crosstalk between pixels.

Also. Since the first element separation unit 13 is constituted by a material that has a lower refractive index than that of the semiconductor substrate 11 and a lower light extinction coefficient K than that of the inner layer portion 13A, for example, a transparent insulating material, it is possible to reflect the incident light at the interface between the first element separation unit 13 and the semiconductor substrate 11 without extinguishing the incident light that much. In this manner, the first element separation unit 13 can prevent leakage of light to the adjacent sensor pixels 121 and further improve photoelectric conversion efficiency Qe.

Modification Examples: Cross Point

Figure 27A:
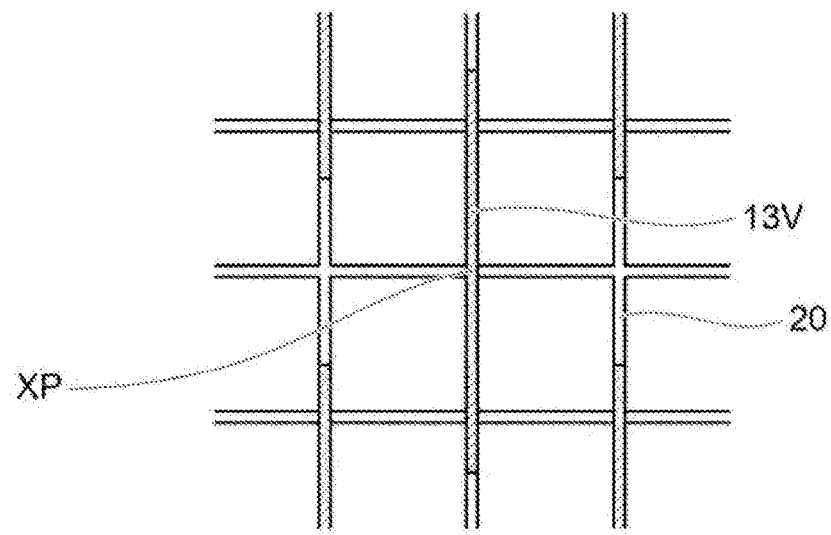
FIG. 27A is a plan view illustrating a modification example of the fourth embodiment.
Figure 27B:
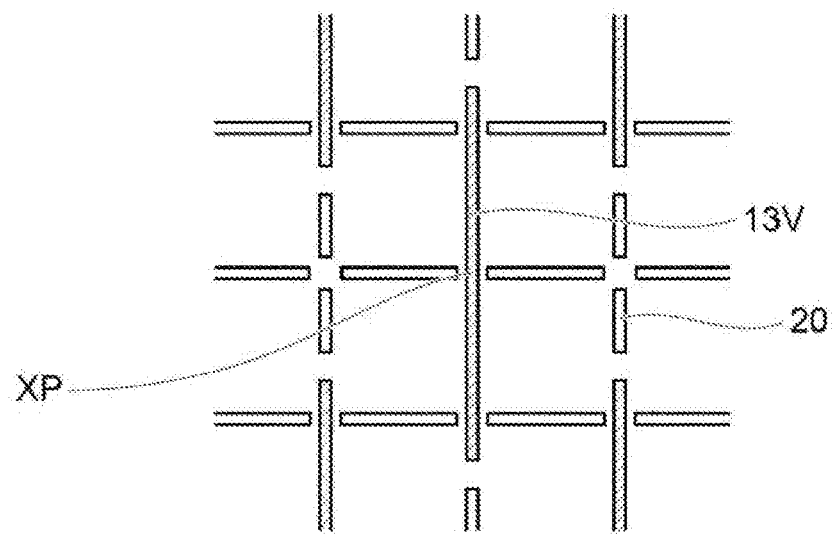
FIG. 27B is a plan view illustrating another modification example of the fourth embodiment.

FIGS. 27A and 27B are plan views illustrating modification examples of the fourth embodiment. The plan view in FIG. 19 illustrates an example in which the vertical light shielding portion 13V of the first element separation unit 13 and the vertical light shielding portion of the second element separation units 20 are not connected at the cross point XP.

In a case in which the depths of the first and second element separation units 13 and 20 at the cross point XP do not necessarily cause any problem, the vertical light shielding portion 13V and the second element separation units 20 may be connected at the cross point XP as illustrated in FIG. 27A. The vertical light shielding portion 13V and the second element separation units 20 may be connected in an arbitrary region other than the pixel boundary position. Also, the second element separation units 20 may be connected in a cross shape, for example.

Alternatively, separation not only between the vertical light shielding portion 13V and the second element separation units 20 but also between the second element separation units 20 may be achieved at the cross point XP as illustrated in FIG. 27B. In this manner, it is possible to further satisfactorily control the trench depths for the vertical light shielding portion 13V and the second element separation units 20.

Modification Examples: Inner Layer Portions and Voids

FIGS. 28A, 28B, 28C, and 28D are sectional views illustrating other modification examples of the fourth embodiment.

As illustrated in FIG. 28A, the inner layer portion 13A may be provided in the horizontal light shielding portion 13H and may not be provided in the vertical light shielding portion 13V. In this case, the vertical light shielding portion 13V is filled with the outer layer portion 13B, and the vertical light shielding portion 13V do not have a light shielding property. However, since the outer layer portion 13B is constituted by a material that has a lower refractive index than that of the semiconductor substrate 11, the vertical light shielding portion 13V can reflect incident light. It is thus possible to improve photoelectric conversion efficiency Qe. Also, since the light shielding property of the horizontal light shielding portion 13H is maintained, noise for the transfer transistor TRZ can be curbed.

Figure 28B:
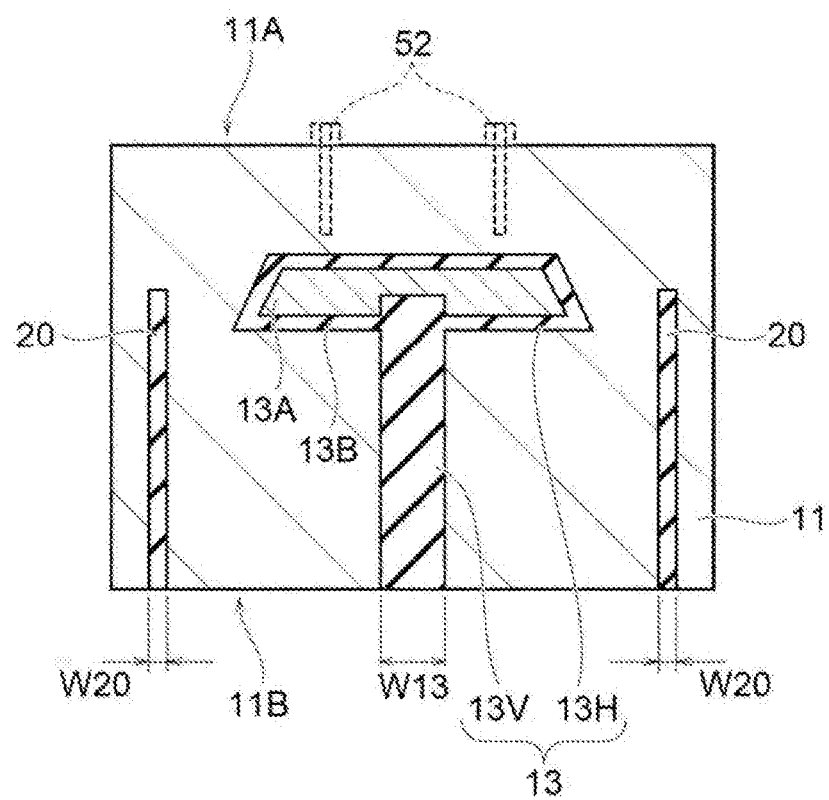
FIG. 28A is a sectional view illustrating another modification example of the fourth embodiment.

As illustrated in FIG. 28B, the vertical light shielding portion 13V may project and bite into the inner layer portion 13A of the horizontal light shielding portion 13H. It is possible to obtain effects that are similar to those of the modification example in FIG. 28A in this case as well.

Figure 28C:
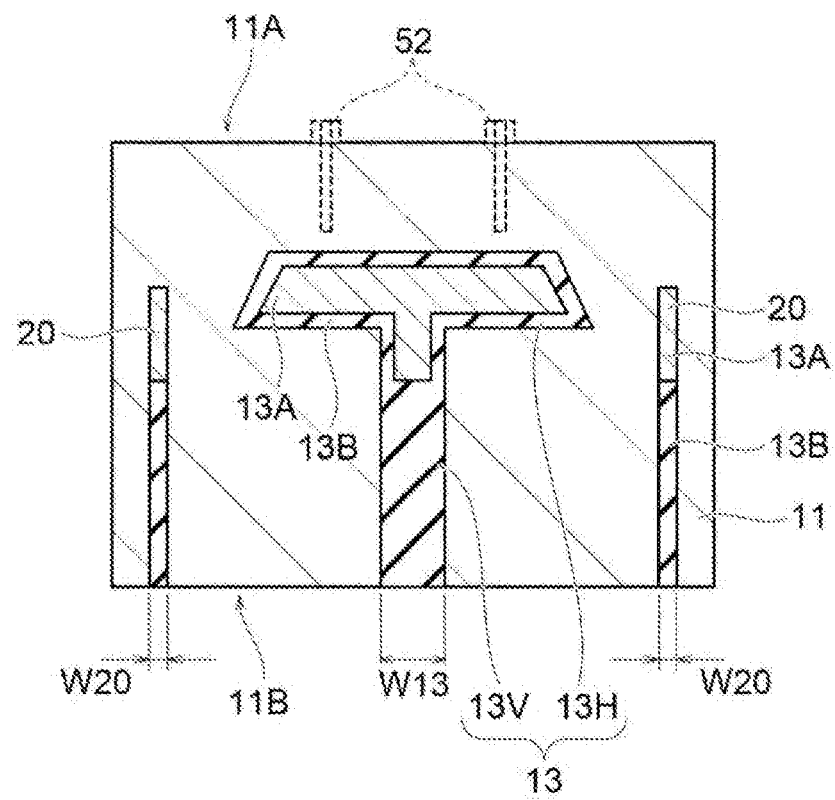
Figure 28C:
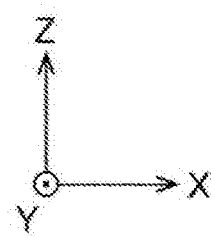

As illustrated in FIG. 28C, the inner layer portion 13A may be formed at the distal end portion of the first element separation unit 13. In this case, the light shielding property at the distal end portion of the first element separation unit 13 is improved, and it is possible to further curb noise at the transfer transistor TRZ.

Figure 28D:
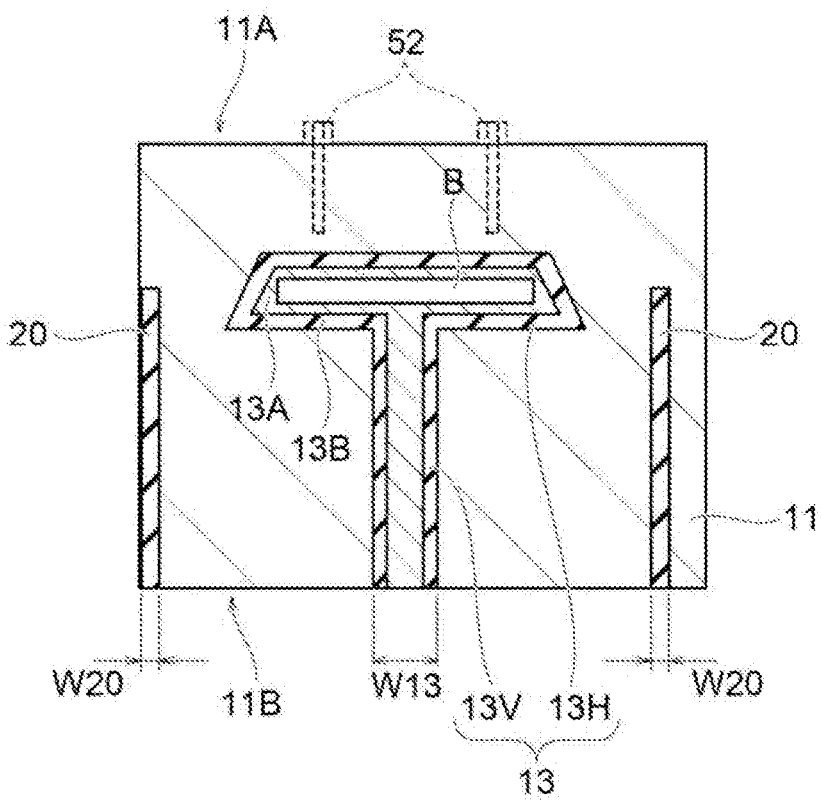
Figure 28D:
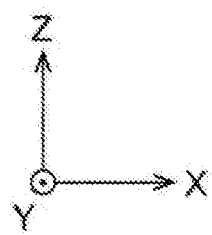

As illustrated in FIG. 28D, a void B may be included in the inner layer portion 13A of the horizontal light shielding portion 13H. If a void is left to some extent, there is no problem as long as light shielding performance of the horizontal light shielding portion 13H is obtained. In addition, there is a case in which a stress is applied to the semiconductor substrate 11 if the space 13Z is filled with a metal material. Therefore, it is possible to alleviate the stress applied to the semiconductor substrate 11 and to curb warpage of the semiconductor substrate 11 by forming the void B in the inner layer portion 13A. The void B may be provided in any of the horizontal light shielding portions 12H and 13H in the aforementioned embodiments and modification examples.

The fourth embodiment may be applied to the aforementioned first to third embodiments. At this time, the second light shielding unit 12 may have the same configuration as that of the first element separation unit 13.

In each of the aforementioned embodiment, the configuration in which the space 12Z as illustrated in FIG. 12G for forming the first light shielding unit 12 is formed through crystal anisotropic etching using a characteristic that etching rates differ in accordance with plane orientations of Si{111} has been described. Here, the Si{111} substrate in the present disclosure is a substrate or a wafer with a crystal plane made of a silicon monocrystal and represented as {111} in the description of a mirror index. The Si{111} substrate in the present disclosure includes a substrate or a wafer in which a crystal orientation deviates by several degrees, for example, a substrate or a wafer in which the crystal orientation deviates by several degrees in the closest [110] direction from the {111} plane. Moreover, the Si{111} substrate includes a substrate or a wafer on a part or entire surface of which a silicon monocrystal is caused to grow through epitaxial method or the like.

Also, {111} plane in the notion in the present disclosure is a collective term of a (111) plane, a (−111) plane, a (1−11) plane, a (11−1) plane, a (−1−11) plane, a (−11−1) plane, a (1−1−1) plane, and a (−1−1−1) plane that are crystal planes equivalent to each other in terms of symmetry. Therefore, the description of the Si{111} substrate in the specification or the like of the present disclosure may be read as an Si(1−11) substrate instead, for example. Here, a minus symbol is used instead as the bar symbol for the notion of the mirror index in the negative direction.

Also, the <110> direction in the description of the present disclosure is a collective term of a [110] direction, a [101] direction, a [011] direction, a [−110] direction, a [1−10] direction, a [−101] direction, a [10−1] direction, a [0−11] direction, a [01−1] direction, a [−1−10] direction, a [−10−1] direction, and a [0−1−1] direction that are crystal plane directions equivalent to each other in terms of symmetry and may be read as any of these instead. However, etching is performed in a direction that perpendicularly intersects the element formation plane and a direction that further perpendicularly intersects the direction that perpendicularly intersects the element formation plane (that is, a direction parallel to the element formation plane) according to the present disclosure.

FIG. 29 illustrates specific combinations of planes and orientations with which etching in the <110> direction is established in the {111} plane that is the crystal plane of the Si{111} substrate in the present disclosure.

As illustrated in FIG. 29, 96 (=8×12) combinations between the {111} plane and the <110> direction are present. However, the <110> direction in the present disclosure is limited to the direction that perpendicularly intersects the {111} plane that is the element formation plane and the direction that is parallel to the element formation plane. In other words, a combination between the element formation plane in the Si{111} substrate and the orientation in which etching is performed on the Si{111} substrate in the present disclosure is selected from any of the combinations indicated with circles in FIG. 29.

Also, the above first embodiment illustrates, as an example, the case in which the etching advances in the X-axis direction while the etching does not advance in the Y-axis direction and the Z-axis direction, using the Si{111} substrate. However, the present disclosure is not limited thereto, and it is only necessary for the etching advancing orientation to be present in both the X-axis direction and the Y axis direction or either the X-axis direction or the Y-axis direction.

It is known that if etching using an alkali solution, for example, is performed when crystal anisotropic etching using an etching solution is performed on an Si substrate, an Si etching reaction caused by the alkali solution advances due to a reaction between a combined hand of Si and an OH ion, the etching is thus more likely to advance as the number of uncombined hands exposed to the front surface side increases, and the etching is less likely to advance as the number of back bonds extending on the bulk side increases.

In other words, one or two or at least less than three Si back bonds are included in the horizontal light shielding portions in substantially the horizontal direction with respect to the substrate surface while three Si back bonds are included in substantially the vertical direction with respect to the substrate surface. If the back bonds are described by exemplifying FIG. 24, for example, the back bonds represent combined hands extending in a negative direction on the side opposite to the Si uncombined hand with respect to a normal line of the Si{111} plane on the assumption that the side of the Si uncombined hand is a positive side.

Figure 30:
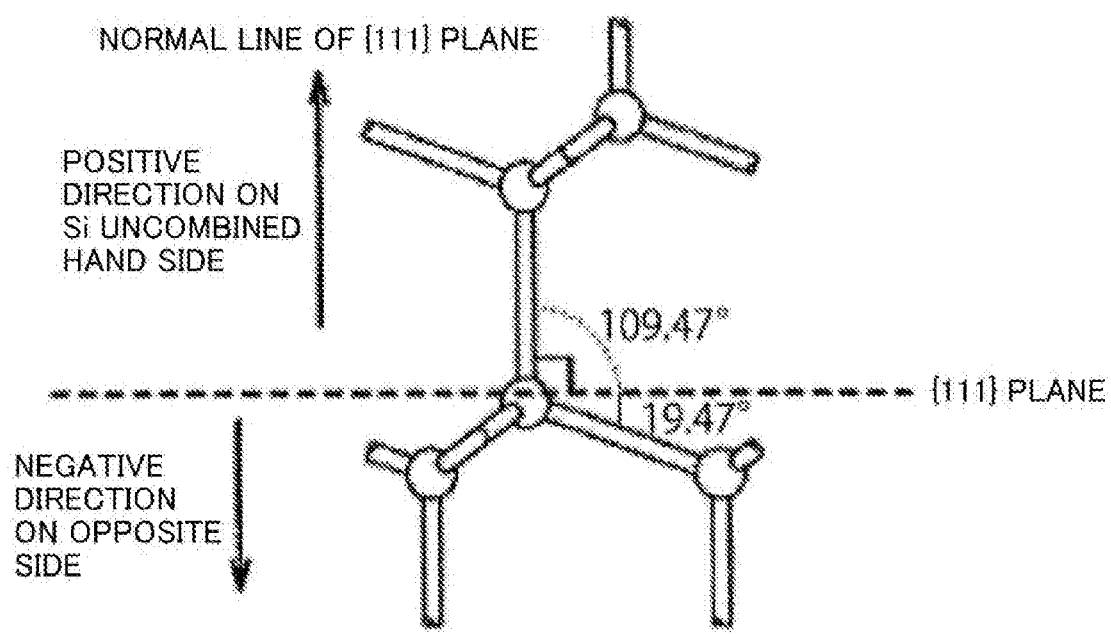

FIG. 30 illustrates an example of three back bonds at −19.47° to +19.47° with respect to the {111} plane. Specifically, in a case in which the photoelectric conversion unit, the horizontal light shielding portion, and the electric charge holding unit are provided in the Si{111} substrate, the horizontal light shielding portion includes a first surface along the first crystal plane of the Si{111} substrate that perpendicularly intersects the first direction and is represented by a plane index {111} and a second surface along the second crystal plane of the Si{111} substrate that is inclined with respect to the first direction and is represented by the plane index {111}. Also, electronic equipment according to an embodiment of the present disclosure includes the aforementioned imaging apparatus.

Figure 31:
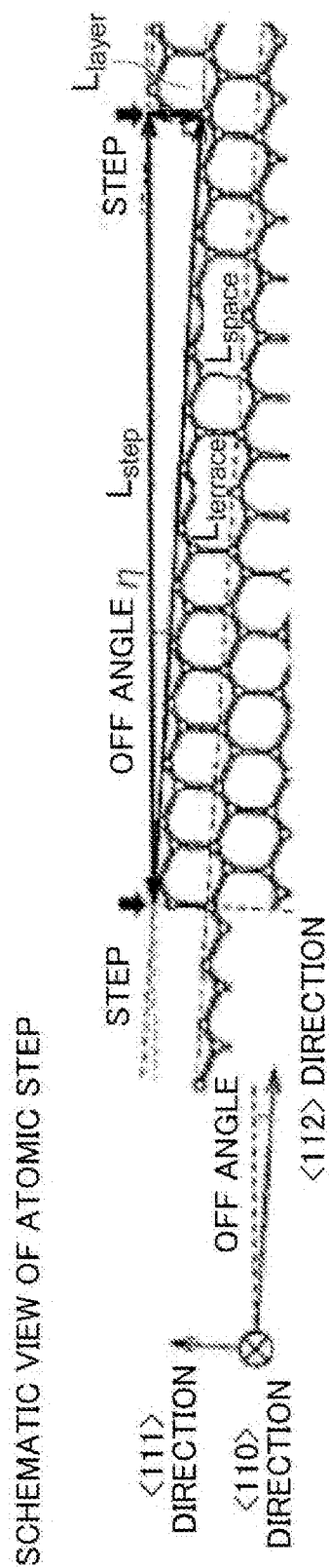

The Si{111} substrate according to each of the aforementioned embodiments includes a substrate worked such that the substrate surface has an off angle with respect to the <112> direction as illustrated in FIG. 31, for example. The relationship that the etching rate in the <110> direction, that is, the direction in which one Si back bond is included is sufficiently high relative to the etching rate in the <111> direction, that is, the direction in which three Si back bonds are included is maintained even in a case of the substrate with the off angle in a case in which the off angle is equal to or less than 19.47°. Since the number of steps increases and density of micro step differences increases as the off angle increases, the off angle is preferably equal to or less than 5°. Note that although the case in which the substrate surface has an off angle in the <112> direction has been exemplified in the example in FIG. 31, the substrate surface may have an off angle in the <110> direction, and the direction of the off angle does not matter. Additionally, the Si plane orientation can be analyzed using an X-ray diffraction method, an electron beam diffraction method, an electron beam backscatter diffraction method, or the like. Since the number of Si back bonds is determined by the crystal structure of Si, it is also possible to analyze the number of back bonds through the analysis of the Si plane orientation.

Example of Application to Electronic Equipment

Figure 32:
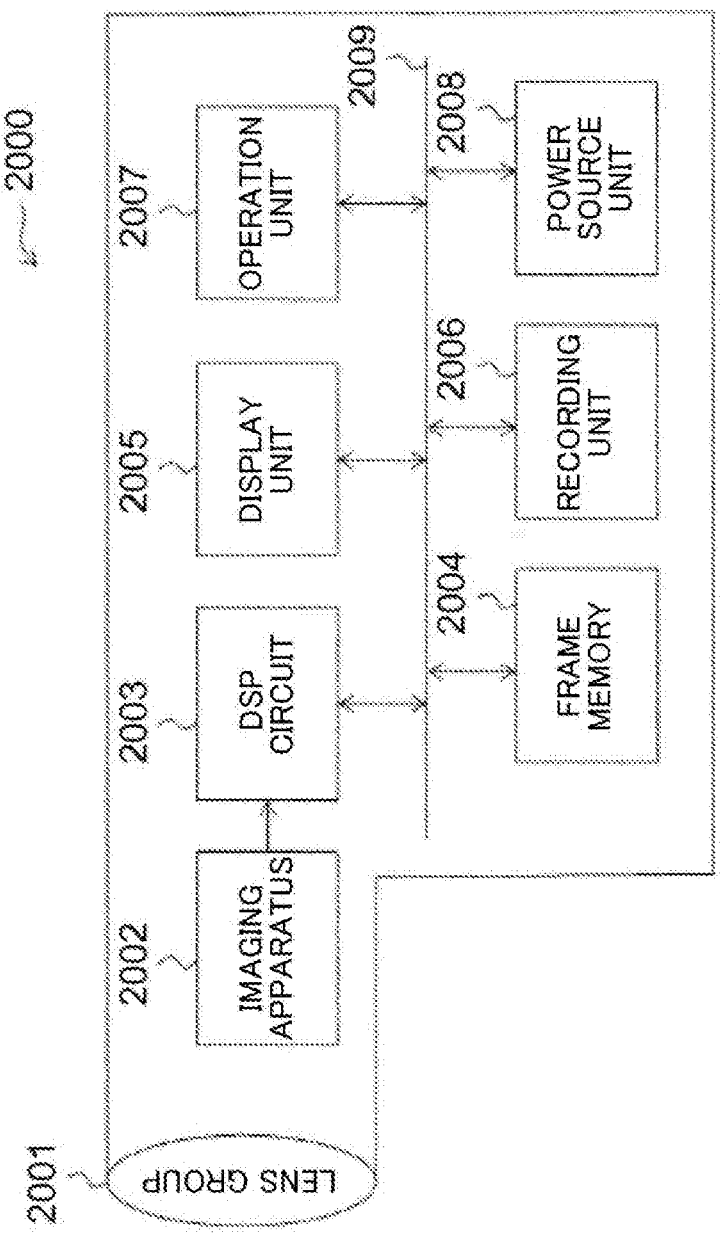

FIG. 32 is a block diagram illustrating a configuration example of a camera 2000 as electronic equipment to which the present technology is applied.

The camera 2000 includes an optical unit 2001 including a lens group and the like, an imaging apparatus (imaging device) 2002 to which the aforementioned imaging apparatus 101 or the like (hereinafter, referred to as an imaging apparatus 101 or the like) is applied, and a digital signal processor (DSP) circuit 2003 that is a camera signal processing circuit. Additionally, the camera 2000 also includes a frame memory 2004, a display unit 2005, a recording unit 2006, an operation unit 2007, and a power source unit 2008. The DSP circuit 2003, the frame memory 2004, the display unit 2005, the recording unit 2006, the operation unit 2007, and the power source unit 2008 are connected to each other via a bus line 2009.

The optical unit 2001 captures incident light (image light) from an object and forms an image on an imaging surface of the imaging apparatus 2002. The imaging apparatus 2002 converts the amount of incident light formed on the imaging surface by the optical unit 2001 into an electric signal in units of pixels and outputs the electric signal as a pixel signal.

The display unit 2005 is constituted by a panel-type display device such as a liquid crystal panel or an organic EL panel, for example, and displays a video or a stationary image captured by the imaging apparatus 2002. The recording unit 2006 records the video or the stationary image captured by the imaging apparatus 2002 in a recording medium such as a hard disk or a semiconductor memory.

The operation unit 2007 issues operation commands for various functions that the camera 2000 has in response to user operations. The power source unit 2008 appropriately supplies various power supplies serving as operation power supplies for the DSP circuit 2003, the frame memory 2004, the display unit 2005, the recording unit 2006, and the operation unit 2007 to these supply targets.

As described above, acquisition of a satisfactory image can be expected by using the aforementioned imaging apparatus 101 or the like as the imaging apparatus 2002.

Example of Application to Moving Body

The technique (the present technique) according to the present disclosure can be applied to various products. For example, the technique according to the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 33:
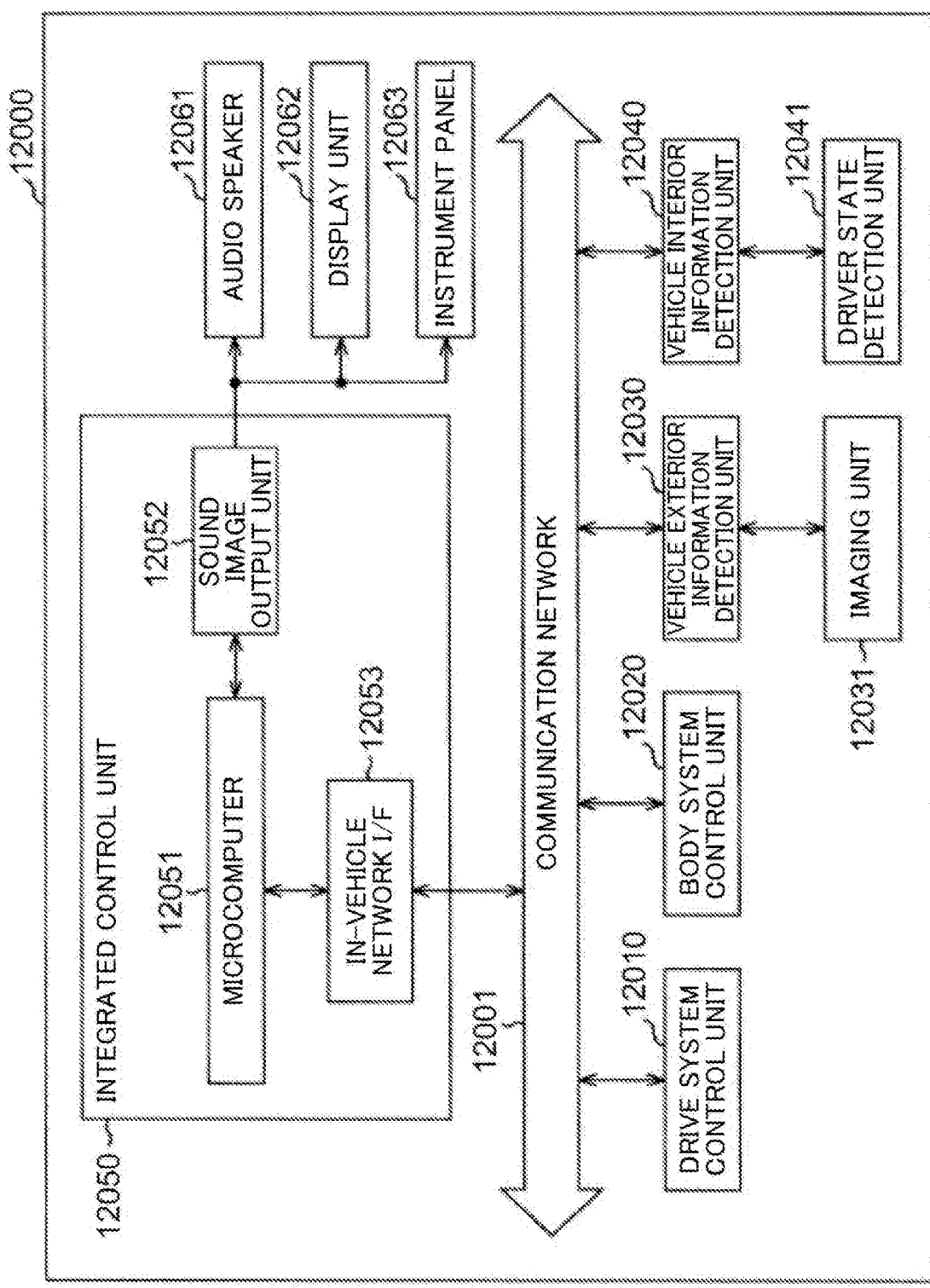

FIG. 33 is a block diagram illustrating a schematic configuration example of a vehicle control system that is an example of a moving body control system to which the technology according to the present disclosure can be applied.

A vehicle control system 12000 includes a plurality of electronic control units connected via a communication network 12001. In the example illustrated in FIG. 33, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a sound image output unit 12052, and an in-vehicle network interface (I/F) 12053 are illustrated.

The drive system control unit 12010 controls operations of devices related to a drive system of a vehicle according to various programs. For example, the drive system control unit 12010 functions as a driving force generation device for generating a driving force of a vehicle such as an internal combustion engine or a driving motor, a driving force transmission mechanism for transmitting a driving force to wheels, a steering mechanism for adjusting a turning angle of a vehicle, and a control device such as a braking device that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a head lamp, a back lamp, a brake lamp, a turn signal, or a fog lamp. In this case, radio waves transmitted from a portable device that substitutes for a key or signals of various switches can be input to the body system control unit 12020. The body system control unit 12020 receives inputs of these radio waves or signals and controls a door lock device, a power window device, a lamp, and the like of the vehicle.

The vehicle exterior information detection unit 12030 detects information on the exterior of the vehicle in which the vehicle control system 12000 is mounted. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform object detection processing or distance detection processing for persons, vehicles, obstacles, signs, or text on a road surface on the basis of the received image.

The imaging unit 12031 is an optical sensor that receives light and outputs an electrical signal corresponding to the amount of the received light. The imaging unit 12031 can also output the electrical signal as an image and ranging information. In addition, light received by the imaging unit 12031 may be visible light, or may be invisible light such as infrared light.

The vehicle interior information detection unit 12040 detects information on the interior of the vehicle. For example, a driver state detection unit 12041 that detects a driver's state is connected to the vehicle interior information detection unit 12040. The driver state detection unit 12041 includes, for example, a camera that captures an image of the driver, and the vehicle interior information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040, and output a control command to the drive system control unit 12010. For example, the microcomputer 12051 can perform coordinated control for the purpose of realizing a function of an advanced driver assistance system (ADAS) including vehicle collision avoidance, shock alleviation, following travel based on an inter-vehicle distance, cruise control, vehicle collision warning, vehicle lane departure warning, or the like.

Further, the microcomputer 12051 can perform coordinated control for the purpose of automated driving or the like in which autonomous travel is performed without depending on an operation of a driver by controlling the driving force generation device, the steering mechanism, the braking device, and the like on the basis of information regarding the vicinity of the vehicle acquired by the vehicle exterior information detection unit 12030 or the vehicle interior information detection unit 12040.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The sound image output unit 12052 transmits an output signal of at least one of audio and an image to an output device capable of visually or audibly notifying an occupant of a vehicle or the outside of the vehicle of information. In the example illustrated in FIG. 33, an audio speaker 12061, a display unit 12062, and an instrument panel 12063 are illustrated as output devices. The display unit 12062 may include, for example, at least one of an on-board display and a heads-up display.

Figure 34:
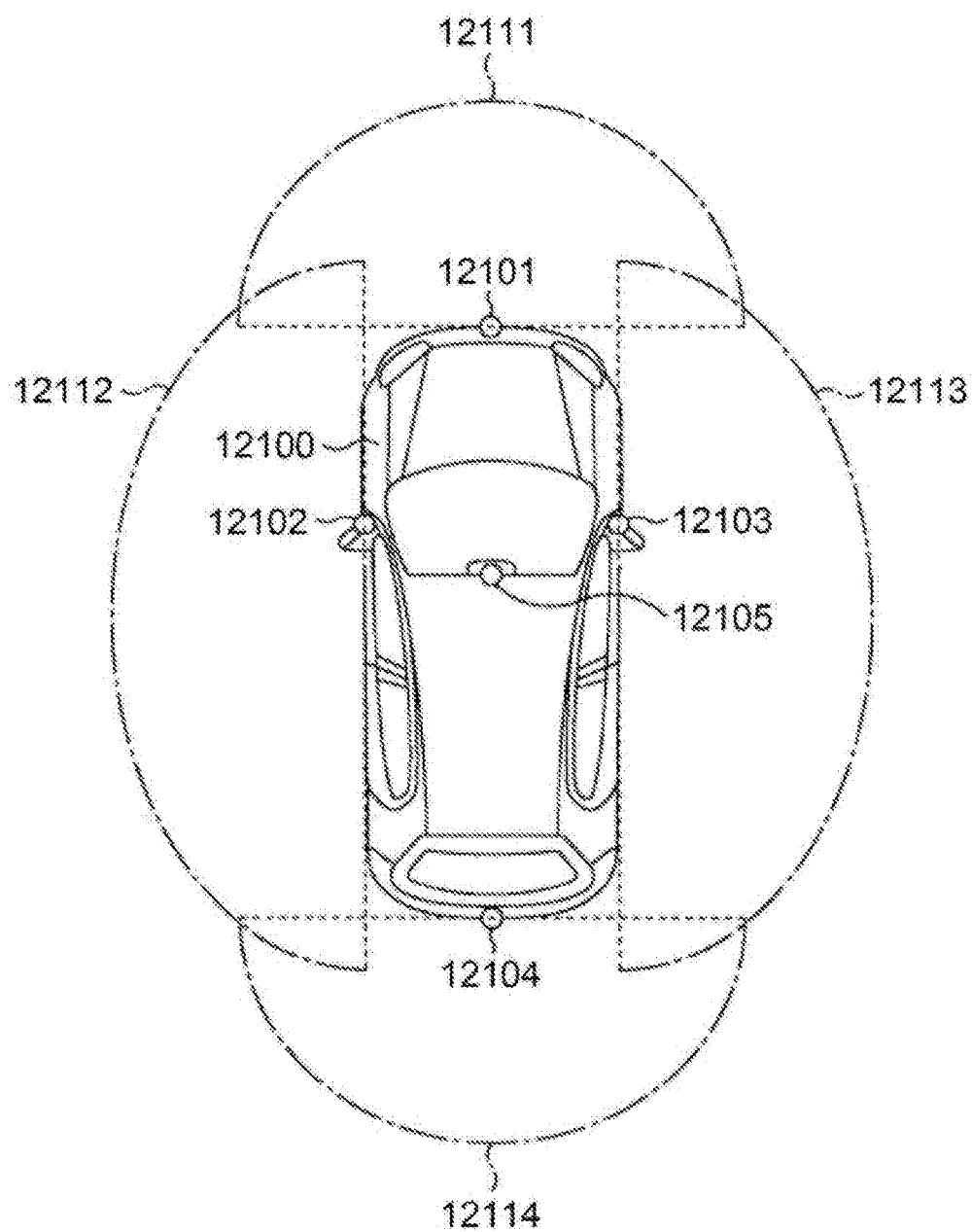

FIG. 34 is a diagram illustrating an example of positions at which the imaging unit 12031 is installed.

In FIG. 34, imaging units 12101, 12102, 12103, 12104, and 12105 are included as the imaging unit 12031.

The imaging units 12101, 12102, 12103, 12104, and 12105 are provided, for example, at positions such as a front nose, side mirrors, a rear bumper, a backdoor, and an upper portion of a front windshield of the vehicle interior of the vehicle 12100. The imaging unit 12101 provided in the front nose and the imaging unit 12105 provided in the upper portion of the front windshield inside the vehicle mainly acquire images on the front side of the vehicle 12100. The imaging units 12102 and 12103 provided in the side mirrors mainly acquire images on the lateral sides of the vehicle 12100. The imaging unit 12104 provided in the rear bumper or the backdoor mainly acquires images on the rear side of the vehicle 12100. The imaging unit 12105 included in the upper portion of the front windshield inside the vehicle is mainly used to detect preceding vehicles or pedestrians, obstacles, traffic signals, traffic signs, lanes, and the like.

FIG. 34 illustrates an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function for obtaining distance information. For example, at least one of the imaging units 12101 to 12104 may be a stereo camera constituted by a plurality of image elements or may be an imaging element having pixels for phase difference detection.

For example, the microcomputer 12051 can extract a three-dimensional object traveling at a predetermined speed (for example, 0 km/h or more) in substantially the same direction as that of the vehicle 12100 which is particularly a closest three-dimensional object on a travel road of the vehicle 12100 as a preceding vehicle by obtaining a distance from each three-dimensional object within the imaging ranges 12111 to 12114 and a temporal change of the distance (a relative speed to the vehicle 12100) based on the distance information obtained from the imaging units 12101 to 12104. Further, the microcomputer 12051 can set an inter-vehicle distance which is to be guaranteed in advance from a preceding vehicle and perform automated brake control (also including following stop control) or automated acceleration control (also including following start control). In this way, it is possible to perform the coordinated control for automated driving or the like in which autonomous travel is performed without an operation of a driver.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of distance information obtained from the imaging units 12101 to 12104 and use the three-dimensional object data for automatic avoidance of obstacles. For example, the microcomputer 12051 classifies obstacles in the vicinity of the vehicle 12100 into obstacles that can be visually recognized by the driver of the vehicle 12100 and obstacles that are difficult to visually recognize. Then, the microcomputer 12051 can determine a risk of collision indicating the degree of risk of collision with each obstacle, and can perform driving assistance for collision avoidance by outputting a warning to a driver through the audio speaker 12061 or the display unit 12062 and performing forced deceleration or avoidance steering through the drive system control unit 12010 when the risk of collision has a value equal to or greater than a set value and there is a possibility of collision.

At least one of the imaging units 12101 to 12104 may be an infrared camera that detects infrared light. For example, the microcomputer 12051 can recognize a pedestrian by determining whether or not a pedestrian is present in images captured by the imaging units 12101 to 12104. Such recognition of a pedestrian is performed by, for example, a procedure of extracting a feature point in captured images of the imaging units 12101 to 12104 serving as infrared cameras, and a procedure of performing pattern matching processing on a series of feature points indicating the contour of an object to determine whether or not the object is a pedestrian. When the microcomputer 12051 determines that a pedestrian is present in the captured images of the imaging units 12101 to 12104 and recognizes the pedestrian, the sound image output unit 12052 controls the display unit 12062 such that a square contour line for emphasis is superimposed on the recognized pedestrian and is displayed. In addition, the sound image output unit 12052 may control the display unit 12062 so that an icon or the like indicating a pedestrian is displayed at a desired position.

The example of the vehicle control system to which the technology according to the present disclosure is applied has been described above. The technology of the present disclosure can be applied to the imaging unit 12031 and the like in the above-described configuration. Specifically, the imaging apparatus 101 and the like illustrated in FIG. 1 and the like can be applied to the imaging unit 12031. It is possible to expect excellent operations of the vehicle control system by applying the technology according to the present disclosure to the imaging unit 12031.

Other Modified Examples

Although the present disclosure has been described by exemplifying some embodiments and modification examples hitherto, the present disclosure is not limited to the above embodiments and the like, and various modifications can be made. Although the imaging apparatus 101 including the columnar-shaped etching stoppers 17 has been described in the above first embodiment, for example, the shape of the etching stoppers is not limited thereto. For example, wall-shaped etching stoppers extending along the Y axis may be provided. In this case, the opening portions 12H1 have substantially a hexagonal shape. In a case in which it is desired to sufficiently secure an area of a region for forming the vertical gate electrode 52V, it is only necessary to provide etching stoppers extending in the Y-axis direction in parallel with the vertical light shielding portions 12V of the light shielding unit 12 as in the imaging apparatus 106. On the other hand, in order to further reduce the area of the region of the opening portions 12H1, it is only necessary to provide etching stoppers 17 with shapes with a small occupying area in the XY plane as in the imaging apparatus 101 according to the above first embodiment.

Moreover, a solid phase diffusion layer 19 including pn junction may be formed in the surroundings of the first light shielding unit 13 and the second element separation units 20 in the imaging apparatus 101 according to the aforementioned first to fourth embodiments. This leads to an increase in PN junction surface, and it is possible to increase the amount Qs of saturation signals.

Additionally, although FIG. 16 illustrates, as an example, the imaging apparatus 101 having a three-dimensional structure in which three substrates are laminated, the type and the number of laminated substrates are not limited thereto.

Note that the present technique can also take the following configurations.

(1) An imaging apparatus including: a silicon {111} substrate; a photoelectric conversion unit that is provided on the semiconductor substrate and generates electrical charge in accordance with an amount of received light through photoelectric conversion; a charge holing unit that is disposed on a side closer to a first surface of the semiconductor substrate than the photoelectric conversion unit and holds the electrical charge transferred from the photoelectric conversion unit; an electrical charge transfer unit that transfers the electrical charge from the photoelectric conversion unit to the electrical charge holding unit; a vertical electrode that transmits the electrical charge generated by the photoelectric conversion unit to the electrical charge transfer unit and is disposed in a depth direction of the semiconductor substrate; and a first light control member that is disposed on a side closer to a second surface that is a side opposite to the first surface of the semiconductor substrate than the vertical electrode, in which the first light control member includes a first light control portion and a second light control portion extending in mutually intersecting directions in an integrated structure, the first light control portion is disposed at a position overlapping the vertical electrode in an plan view of the semiconductor substrate from a normal line direction of the first surface, and the second light control portion includes one end portion connected to the first light control portion and the other end portion disposed in the depth direction of the semiconductor substrate from the one end portion.

(2) The imaging apparatus according to (1), in which the first light control portion is disposed along a direction of the first surface, and the other end portion of the second light control portion is disposed along the second surface.

(3) The imaging apparatus according to (1) or (2), wherein the semiconductor substrate includes a silicon crystal plane represented by a plane index {111}, and the first light control portion includes a first light control surface that is disposed in a first direction that is different from the depth direction of the semiconductor substrate and is disposed along a first crystal plane represented by a plane index {111} and a second light control surface that is disposed in a second direction that is different from the depth direction of the semiconductor substrate and is disposed along a second crystal plane represented by a plane index {111}.

(4) An imaging apparatus according to any one of (1) to (3), in which the photoelectric conversion unit, the electrical charge holding unit, the electrical charge transfer unit, and the vertical electrode are provided for each pixel, and the first light control portion is disposed across a plurality of pixels to overlap the plurality of vertical electrodes corresponding to the plurality of pixels in a plan view of the semiconductor substrate from a normal line direction of the first surface or the second surface.

(5) The imaging apparatus according to any one of (1) to (4), in which at least a part of the first light control member has a property of absorbing or reflecting incident light.

(6) The imaging apparatus according to (5), in which the first light control member contains at least one of an insulating material, a metal, polysilicon, a metal oxide, a carbon-containing material, and an electrochromic material.

(7) The imaging apparatus according to any one of (1) to (6), further including: a second light control member that is disposed on a side closer to the first surface of the semiconductor substrate than the first light control member and is disposed to surround the electrical charge holding unit.

(8) The imaging apparatus according to (7), in which the second light control member includes a third light control portion disposed along a direction of the first surface and a fourth light control portion connected to the third light control portion and disposed in a direction that intersects the third light control portion.

(9) The imaging apparatus according to (8), in which one end portion of the fourth light control portion is connected to the third light control portion, and the other end portion of the fourth light control portion is disposed along the first surface.

(10) The imaging apparatus according to (8), in which the fourth light control portion penetrates through the third light control portion and extends in the depth direction of the semiconductor substrate.

(11) The imaging apparatus according to any one of (1) to (10), further including: an element separation unit that extends in the depth direction of the semiconductor substrate along a pixel boundary of the semiconductor substrate.

(12) The imaging apparatus according to claim 11), in which the element separation unit includes a fifth light control portion that is disposed in the depth direction of the semiconductor substrate along a pixel boundary of the semiconductor substrate.

(13) The imaging apparatus according to claim 12), in which the element separation unit includes a sixth light control portion that is connected to the fifth light control portion and is disposed in a direction that intersects the fifth light control portion.

(14) The imaging apparatus according to (13), in which one end portion of the sixth light control portion is connected to the fifth light control portion, and the other end portion of the sixth light control portion is disposed along the second surface.

(15) The imaging apparatus according to (13), in which the sixth light control portion penetrates through the fifth light control portion and extends in the depth direction of the semiconductor substrate.

(16) The imaging apparatus according to any one of (1) to (15), in which the photoelectric conversion unit has a concentration gradient where a concentration of impurities changes depending on locations in a first region on a side of the second surface from the first light control portion.

(17) The imaging apparatus according to (16), in which the photoelectric conversion unit has a concentration gradient where a concentration of impurities changes depending on locations in a second region on a side of the first surface from the first light control portion.

(18) The imaging apparatus according to (17), in which at least one of the first region and the second region has a concentration gradient in a horizontal direction of the semiconductor substrate.

(19) The imaging apparatus according to (17) or (18), in which at least one of the first region and the second region has a concentration gradient in the depth direction of the semiconductor substrate.

(20) A method for manufacturing an imaging apparatus including: forming, on a semiconductor substrate, a photoelectric conversion unit that generates electrical charge in accordance with an amount of received light through photoelectric conversion; forming an electrical charge holding unit that is disposed on a side closer to a first surface of the semiconductor substrate than the photoelectric conversion unit and holds the electrical charge transferred from the photoelectric conversion unit; forming an electrical charge transfer unit that transfers the electrical charge from the photoelectric conversion unit to the electrical charge holding unit; forming a vertical electrode that transmits the electrical charge generated by the photoelectric conversion unit to the electrical charge transfer unit in a depth direction of the semiconductor substrate; and forming a first light control member that is disposed on a side closer to a second surface that is a side opposite to the first surface of the semiconductor substrate than the vertical electrode and includes a first light control portion and a second light control portion extending in mutually intersecting directions in an integrated structure; in which the first light control portion is disposed at a position overlapping the vertical electrode in a plan view of the semiconductor substrate from normal line direction of the first surface, one end portion of the second light control portion is connected to the first light control portion, and the other end portion of the second light control portion is disposed in the depth direction of the semiconductor substrate from the one end portion.

(21) A method for manufacturing an imaging apparatus including: forming, on a semiconductor substrate, a photoelectric conversion unit that generates electrical charge in accordance with an amount of received light through photoelectric conversion; forming a hollow portion or a filled portion obtained by filling the hollow portion with a predetermined material in a part of the photoelectric conversion unit; forming an electrical charge holding unit that is disposed on a side closer to a first surface of the semiconductor substrate than the hollow portion or the filled portion and holds the electrical charge transferred from the photoelectric conversion unit; forming an electrical charge transfer unit that transfers the electrical charge from the photoelectric conversion unit to the electrical charge holding unit; forming a trench that reaches the hollow portion or the filled portion from a side of a second surface that is a side opposite to the first surface of the semiconductor substrate; and forming a first light control portion at a location where the hollow portion or the filled portion is formed and forming a second light control portion at a location where the trench is formed using the hollow portion or the filled portion and the trench.

(22) Electronic equipment including: an imaging apparatus, in which the imaging apparatus includes a semiconductor substrate, a photoelectric conversion unit that is provided on the semiconductor substrate and generates electrical charge in accordance with an amount of received light through photoelectric conversion; an electrical charge holding unit that is disposed on a side closer to a first surface of the semiconductor substrate than the photoelectric conversion unit and holds the electrical charge transferred from the photoelectric conversion unit; an electrical charge transfer unit that transfers the electrical charge from the photoelectric conversion unit to the electrical charge holding unit, a vertical electrode that transits the electrical charge generated by the photoelectric conversion unit to the electrical charge transfer unit and is disposed in a depth direction of the semiconductor substrate, and a first light control member that is disposed on a side closer to a second surface that is a side opposite to the first surface of the semiconductor substrate than the vertical electrode, the first light control member includes a first light control portion and a second light control portion extending in mutually intersecting directions in an integrated structure, the first light control portion is disposed at a position overlapping the vertical electrode in a plan view of the semiconductor substrate from a normal line direction of the first surface, and the second light control portion includes one end portion connected to the first light control portion and the other end portion disposed in the depth direction of the semiconductor substrate from the one end portion.

Aspects of the present disclosure are not limited to the aforementioned individual embodiments and also include various modifications that those skilled in the art can achieve, and advantages of the present disclosure are also not limited to the aforementioned content. In other words, various additions, modifications, and partial deletion can be made without departing from the conceptual ideas and gist of the present disclosure derived from the content defined in the claims and equivalents thereof.

REFERENCE SIGNS LIST

11 Semiconductor substrate
12 Second light shielding unit
12A Inner layer portion
12B Outer layer portion
12H Horizontal light shielding portion
12V Vertical light shielding portion
13 First light shielding unit (first element separation unit)
13A Inner layer portion
13B Outer layer portion
13H Horizontal light shielding portion
13V Vertical light shielding portion
14 P-type semiconductor region
15 Fixed electrical charge film
16 P-type semiconductor region
17 Etching stopper
18 Insulating layer
20 Second element separation unit
22, 23 Remaining region
51 Photoelectric conversion unit
TRX, TRY, TRZ, TRG Transfer transistor
52H Horizontal terminal unit
52V Vertical gate electrode
54 Electrical charge holding unit (MEM)
FD Charge voltage conversion unit (FD)
ORG Discharge transistor
58 RST Reset transistor
AMP Amplification transistor
SEL Selection transistor
101 Imaging apparatus
111 Pixel array unit
112 Vertical drive unit
113 Ramp wave module
114 Column signal processing unit
115 Clock module
116 Data storage unit
117 Horizontal drive unit
118 System control unit
119 Signal processing unit
121 Sensor pixel
122 Pixel drive line
123 Vertical signal line

The invention claimed is:

1. An imaging apparatus comprising:
a semiconductor substrate;
a photoelectric conversion unit that is provided on the semiconductor substrate and generates electrical charge in accordance with an amount of received light through photoelectric conversion;
an electrical charge holding unit that is disposed on a side closer to a first surface of the semiconductor substrate than the photoelectric conversion unit and holds the electrical charge transferred from the photoelectric conversion unit;
an electrical charge transfer unit that transfers the electrical charge from the photoelectric conversion unit to the electrical charge holding unit;
a vertical electrode that transmits the electrical charge generated by the photoelectric conversion unit to the electrical charge transfer unit and is disposed in a depth direction of the semiconductor substrate; and
a first light control member that is disposed on a side closer to a second surface that is a side opposite to the first surface of the semiconductor substrate than the vertical electrode, wherein
the first light control member includes a first light control portion and a second light control portion extending in mutually intersecting directions in an integrated structure,
the first light control portion is disposed at a position overlapping the vertical electrode in a plan view of the semiconductor substrate from a normal line direction of the first surface, and
the second light control portion includes a first end portion connected to the first light control portion and the other a second end portion disposed in the depth direction of the semiconductor substrate from the first end portion.

2. The imaging apparatus according to claim 1, wherein the first light control portion is disposed along a direction of the first surface, and the second end portion of the second light control portion is disposed along the second surface.

3. The imaging apparatus according to claim 1, wherein the semiconductor substrate includes a silicon crystal plane represented by a plane index {111}, and the first light control portion includes
a first light control surface that is disposed in a first direction that is different from the depth direction of the semiconductor substrate and is disposed along a first crystal plane represented by a plane index {111} and a second light control surface that is disposed in a second direction that is different from the depth direction of the semiconductor substrate and is disposed along a second crystal plane represented by a plane index {111}.

4. The imaging apparatus according to claim 1, wherein the photoelectric conversion unit, the electrical charge holding unit, the electrical charge transfer unit, and the vertical electrode are provided for each pixel, and the first light control portion is disposed across a plurality of pixel regions to overlap a plurality of vertical electrodes corresponding to a plurality of pixels in a plan view of the semiconductor substrate from the normal line direction of the first surface or a normal line direction of the second surface.

5. The imaging apparatus according to claim 1, wherein at least a part of the first light control member has a property of absorbing or reflecting incident light.

6. The imaging apparatus according to claim 5, wherein the first light control member contains at least one of an insulating material, a metal, polysilicon, a metal oxide, a carbon-containing material, and an electrochromic material.

7. The imaging apparatus according to claim 1, further comprising a second light control member that is disposed on the side closer to the first surface of the semiconductor substrate than the first light control member and is disposed to surround the electrical charge holding unit.

8. The imaging apparatus according to claim 7, wherein the second light control member includes a third light control portion that is disposed along a first direction of the first surface and a fourth light control portion that is connected to the third light control portion and is disposed in a second direction that intersects the third light control portion.

9. The imaging apparatus according to claim 8, wherein a first end portion of the fourth light control portion is connected to the third light control portion, and a second end portion of the fourth light control portion is disposed along the first surface.

10. The imaging apparatus according to claim 8, wherein the fourth light control portion penetrates through the third light control portion and extends in the depth direction of the semiconductor substrate.

11. The imaging apparatus according to claim 1, further comprising an element separation unit that extends in the depth direction of the semiconductor substrate along a pixel boundary of the semiconductor substrate.

12. The imaging apparatus according to claim 11, wherein the element separation unit includes a fifth light control portion that is disposed in the depth direction of the semiconductor substrate along the pixel boundary of the semiconductor substrate.

13. The imaging apparatus according to claim 12, wherein the element separation unit includes a sixth light control portion that is connected to the fifth light control portion and is disposed in a direction that intersects the fifth light control portion.

14. The imaging apparatus according to claim 13, wherein a first end portion of the sixth light control portion is connected to the fifth light control portion, and a second end portion of the sixth light control portion is disposed along the second surface.

15. The imaging apparatus according to claim 13, wherein the sixth light control portion penetrates through the fifth light control portion and extends in the depth direction of the semiconductor substrate.

16. The imaging apparatus according to claim 1, wherein the photoelectric conversion unit has a first concentration gradient where a concentration of impurities changes depending on locations in a first region on a side of the second surface from the first light control portion.

17. The imaging apparatus according to claim 16, wherein the photoelectric conversion unit has a second concentration gradient where a concentration of impurities changes depending on locations in a second region on a side of the first surface from the first light control portion.

18. The imaging apparatus according to claim 17, wherein at least one of the first region and the second region has a respective concentration gradient of the first concentration gradient and the second concentration gradient in a horizontal direction of the semiconductor substrate.

19. The imaging apparatus according to claim 17, wherein at least one of the first region and the second region has a respective concentration gradient of the first concentration gradient and the second concentration gradient in the depth direction of the semiconductor substrate.

20. A method for manufacturing an imaging apparatus comprising:
forming, on a semiconductor substrate, a photoelectric conversion unit that generates electrical charge in accordance with an amount of received light through photoelectric conversion;
forming an electrical charge holding unit that is disposed on a side closer to a first surface of the semiconductor substrate than the photoelectric conversion unit and holds the electrical charge transferred from the photoelectric conversion unit;
forming an electrical charge transfer unit that transfers the electrical charge from the photoelectric conversion unit to the electrical charge holding unit;
forming a vertical electrode that transmits the electrical charge generated by the photoelectric conversion unit to the electrical charge transfer unit in a depth direction of the semiconductor substrate; and
forming a first light control member that is disposed on a side closer to a second surface that is a side opposite to the first surface of the semiconductor substrate than the vertical electrode and includes a first light control portion and a second light control portion extending in mutually intersecting directions in an integrated structure, wherein
the first light control portion is disposed at a position overlapping the vertical electrode in a plan view of the semiconductor substrate from a normal line direction of the first surface, a first end portion of the second light control portion is connected to the first light control portion, and the other a second end portion of the second light control portion is disposed in the depth direction of the semiconductor substrate from the first end portion.

21. A method for manufacturing an imaging apparatus, the method comprising:
forming, on a semiconductor substrate, a photoelectric conversion unit that generates electrical charge in accordance with an amount of received light through photoelectric conversion;
forming, in a part of the photoelectric conversion unit, a hollow part or a filling part obtained by filling the hollow part with a predetermined material;
forming an electrical charge holding unit that is disposed on a side closer to a first surface of the semiconductor substrate than the hollow part or the filling part and holds the electrical charge transferred from the photoelectric conversion unit;
forming an electrical charge transfer unit that transfers the electrical charge from the photoelectric conversion unit to the electrical charge holding unit;
forming a trench that reaches the hollow part or the filling part from a side of a second surface that is a side opposite to the first surface of the semiconductor substrate; and
forming a first light control portion at a location where the hollow part or the filling part is formed and forming a second light control portion at a location where the trench is formed using the hollow part or the filling part and the trench.

22. Electronic equipment, comprising:
an imaging apparatus, wherein the imaging apparatus includes:
- a semiconductor substrate;
- a photoelectric conversion unit that is provided on the semiconductor substrate and generates electrical charge in accordance with an amount of received light through photoelectric conversion;
- an electrical charge holding unit that is disposed on a side closer to a first surface of the semiconductor substrate than the photoelectric conversion unit and holds the electrical charge transferred from the photoelectric conversion unit;
- an electrical charge transfer unit that transfers the electrical charge from the photoelectric conversion unit to the electrical charge holding unit;
- a vertical electrode that transmits the electrical charge generated by the photoelectric conversion unit to the electrical charge transfer unit and is disposed in a depth direction of the semiconductor substrate; and
- a first light control member that is disposed on a side closer to a second surface that is a side opposite to the first surface of the semiconductor substrate than the vertical electrode, wherein
  - the first light control member includes a first light control portion and a second light control portion extending in mutually intersecting directions in an integrated structure,
  - the first light control portion is disposed at a position overlapping the vertical electrode in a plan view of the semiconductor substrate from a normal line direction of the first surface, and
  - the second light control portion includes a first end portion connected to the first light control portion and the other a second end portion disposed in the depth direction of the semiconductor substrate from the first end portion.

* * * * *